United States Patent [19]
Watanabe

[11] Patent Number: 5,920,588
[45] Date of Patent: Jul. 6, 1999

[54] METHOD AND DEVICE FOR GENERATION OF PHASE CONJUGATE LIGHT AND WAVELENGTH CONVERSION, AND SYSTEM HAVING THE DEVICE

[75] Inventor: Shigeki Watanabe, Kawasaki, Japan

[73] Assignee: Fujitsu Limited, Kawasaki, Japan

[21] Appl. No.: 08/832,969

[22] Filed: Apr. 4, 1997

[30] Foreign Application Priority Data

| Apr. 11, 1996 | [JP] | Japan | 8-089737 |
| Aug. 27, 1996 | [JP] | Japan | 8-224285 |
| Dec. 16, 1996 | [JP] | Japan | 8-336134 |

[51] Int. Cl.$^6$ .................. H01S 3/08; H04J 14/02
[52] U.S. Cl. ............... 372/96; 372/43; 372/50; 372/21; 372/22; 372/23; 372/106; 372/108; 359/124; 359/125; 359/130; 359/134
[58] Field of Search .................. 372/21, 22, 23, 372/43, 50, 92, 96, 108, 106; 359/115, 118, 134, 124, 125, 109, 130

[56] References Cited

U.S. PATENT DOCUMENTS

| 4,720,836 | 1/1988 | Fukuzawa et al. | 372/96 |
| 5,007,066 | 4/1991 | Eda | 372/108 |
| 5,033,054 | 7/1991 | Scifres et al. | 372/50 |
| 5,062,155 | 10/1991 | Eda | 359/189 |
| 5,751,758 | 5/1998 | Kuwatsuka | 372/96 |

OTHER PUBLICATIONS

Journal of Lightwave Technology, vol. 14, No. 3, Mar. 1996, Exact Compensation for both Chromatic Dispersion and Kerr Effect in a Transmission Fiber Using Optical Phase Conjugation.

'20 Gb/s Fiber Transmission Experiment over 3000 km by Waveform Pre–Compensation using Fiber Compensator and Optical Phase Conjugator', Watanabe et al., pp. 31–32.

'Optical Fiber Transmission using Phase Conjugation', Shigeki Watanabe, pp. 94–95.

Fujitsu Scientific Journal, vol. 30, No. 2, 'Compensation for chromatic Dispersion and Self–Phase Modulation in a Transmission Fiber by Optical Phase Conjugation' (Dec. 1994).

Journal of Lightwave Technology, vol. 12, No. 12, Dec. 1994, Generation of Optical Phase–Conjugate Waves and Compensation for Pulse Shape Distortion in a Single–Mode Fiber, Watanabe, et al.

'Cancellation of four–wave mixing in a single–mode fiber by midway optical phase conjugation', Optics Letters, vol. 19, No. 17, Sep., 1994.

'Cancellation of four–wave mixing in multichannel fibre transmission by midway optical phase conjugation', Electronics Letters, vol. 30, No. 14, Jul. 1994.

(List continued on next page.)

*Primary Examiner*—Brian Healy

[57] ABSTRACT

Methods and devices for generation of phase conjugate light and wavelength conversion, and systems each having the device. In a basic structure of the present invention, a signal light beam is first separated into first and second polarization components by a polarization beam splitter. The first and second polarization components are next converted into first and second phase conjugate light beams by a single DFB (distributed feed-back) laser diode or two DFB laser diodes. In the case that a single DFB laser diode is used, the first and second phase conjugate light beams are combined by the above-mentioned polarization beam splitter. In the case that two DFB laser diodes are used, the first and second phase conjugate light beams are combined by an another polarization beam splitter. Through the structure, it can be possible to provide a phase conjugate light generator having no polarization dependence of conversion efficiency.

66 Claims, 42 Drawing Sheets

OTHER PUBLICATIONS

Compensation of Pulse Shape Distortion Due to Chromatic Dispersion and Kerr Effect by Optical Phase Conjugation, Watanabe et al., IEEE Photonics Technology Letters, vol. 5, No. 10, Oct. 1993.

'Compensation of Chromatic Dispersion in a Single–Mode Fiber by Optical Phase Conjugation', Watanabe et al., IEEE Photonics Technology Letters, vol. 5, No. 1, Jan. 1993.

'Compensation of the phase fluctuation in a transmission line by optical phase conjugation', Shigeki Watanabe, Optics Letters, vol. 17, No. 19, Oct. 1992.

'Compensation for channel dispersion by nonlinear optical phase conjugation', Yariv et al., Optics Letters, vol. 4, No. 2, Feb. 1979.

'Phase Conjugate Optics and Real–Time Holography', Yariv, IEEE Journal of Quantum Electronics, vol. QE–14, No. 9, Sep. 1978.

'Polarisation–insensitive wavelength conversion and phase conjugation using bi–directional forward four–wave mixing in a lasing DFB–LD', Watanabe, et al., Electronics Letters, vol. 33, No. 4, Feb. 1997.

F I G. 7A
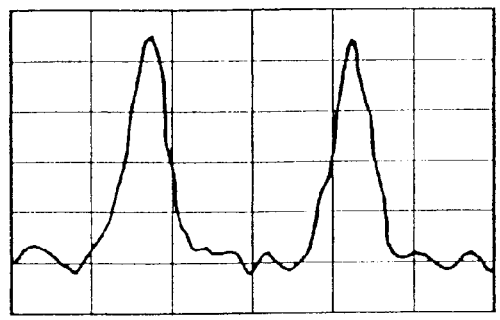
F I G. 7B
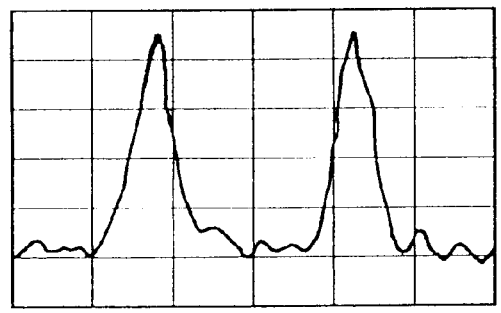
F I G. 7C
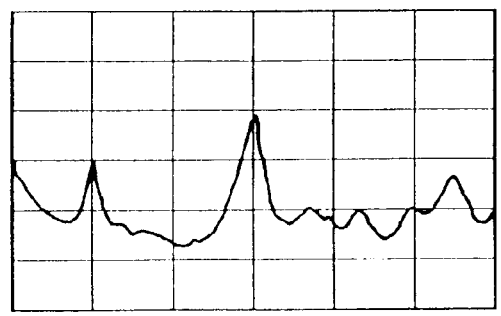

METHOD AND DEVICE FOR GENERATION OF PHASE CONJUGATE LIGHT AND WAVELENGTH CONVERSION, AND SYSTEM HAVING THE DEVICE

BACKGROUND OF THE INVENTION

1. Field of the Invention

The present invention relates to a method and device for generation of phase conjugate light and wavelength conversion, and a system having the device.

2. Description of the Related Art

Owing to the development of a low-loss silica optical fiber, a number of optical fiber communication systems each using the optical fiber as a transmission line have been put to practical use. The optical fiber itself has a very wide band. However, a transmission capacity by the optical fiber is actually limited by a system design. The most important limitation is due to waveform distortion by chromatic dispersion occurring in the optical fiber. Further, the optical fiber attenuates an optical signal in a proportion of about 0.2 dB/km, for example; however, loss by the attenuation has been compensated by adopting an optical amplifier such as typically, an erbium-doped fiber amplifier (EDFA).

The chromatic dispersion frequently simply called dispersion is a phenomenon that the group velocity of an optical signal in an optical fiber changes as a function of wavelength (frequency) of the optical signal. In a standard single-mode fiber, for example, an optical signal having a longer wavelength propagates faster than an optical signal having a shorter wavelength, for wavelengths shorter than 1.3 $\mu$m, and the resultant dispersion is usually called normal dispersion. For wavelengths longer than 1.3 $\mu$m, an optical signal having a shorter wavelength propagates faster than an optical signal having a longer wavelength, and the resultant dispersion is called anomalous dispersion.

In recent years, attention has been paid to nonlinearities due to an increase in optical signal power by the use of an EDFA. The most important nonlinearity limiting a transmission capacity is an optical Kerr effect. The optical Kerr effect is a phenomenon that the refractive index of an optical fiber changes with the intensity of an optical signal. A change in refractive index modulates the phase of an optical signal propagating in the optical fiber, and as a result there occurs frequency chirping that changes a signal spectrum. This phenomenon is known as self-phase modulation (SPM). The spectrum is broadened by SPM, causing a further increase in waveform distortion by chromatic dispersion.

Thus, the chromatic dispersion and the Kerr effect cause waveform distortion to an optical signal with an increase in transmission distance. Accordingly, to allow a long-haul transmission by using an optical fiber, the chromatic dispersion and the nonlinearity must be controlled, compensated, or suppressed.

As a technique for controlling the chromatic dispersion and the nonlinearity, the use of a regenerative repeater including an electronic circuit for a main signal is known. For example, a plurality of regenerative repeaters are provided on a transmission line, and each regenerative repeater performs photo-electric conversion, regeneration, and electro-photo conversion in this order before the waveform distortion of an optical signal becomes excessive. However, this method has problems that an expensive complicated regenerative repeater is required, and that the electronic circuit included in the regenerative repeater limits a bit rate of the main signal.

As a technique for compensating the chromatic dispersion and the nonlinearity, an optical soliton is known. An optical signal pulse having an amplitude, pulse width, and peak power exactly specified to a given anomalous dispersion is generated to thereby balance pulse compression by both SPM due to optical Kerr effect and anomalous dispersion and pulse expansion by dispersion. As a result, the optical soliton propagates without waveform changes.

As another technique for compensating the chromatic dispersion and the nonlinearity, application of optical phase conjugation is known. For example, a method for compensating chromatic dispersion of a transmission line has been proposed by Yariv et al. (A. Yariv, D. Fekete, and D. M. Pepper, "Compensation for channel dispersion by nonlinear optical phase conjugation" Opt. Lett., vol. 4, pp. 52–54, 1979). An optical signal is converted into phase conjugate light at a middle point in a transmission line, and waveform distortion by chromatic dispersion occurred in a front half of the transmission line is compensated by distortion by chromatic dispersion in a rear half of the transmission line.

Particularly in the case that phase changes of electric fields at two points are caused by the same factor and that an environmental change inviting this factor is gentle in a light propagation time between the two points, the phase changes can be compensated by locating a phase conjugator (phase conjugate light generator) at the middle of the two points. (S. Watanabe, "Compensation of phase fluctuation in a transmission line by optical conjugation" Opt. Lett., vol. 17, pp. 1355–1357, 1992). Accordingly, waveform distortion due to SPM can also be compensated by adopting a phase conjugator. However, in the case that the distribution of optical power is asymmetrical with respect to the position of the phase conjugator, compensation for the nonlinearity becomes incomplete.

The present inventor has proposed a technique for overcoming the incompleteness of compensation due to the asymmetry of optical power distribution in the case of using a phase conjugator. (S. Watanabe and M. Shirasaki, "Exact compensation for both chromatic dispersion and Kerr effect in a transmission fiber using optical phase conjugation" J. Lightwave Technol., vol. 14, pp. 243–248, 1996). The phase conjugator is located in the vicinity of a point in a transmission line where the total dispersions or the total nonlinear effects in front and rear parts of the transmission line with respect to this point are equal to each other, and various parameters are set in each small section of the front and rear parts.

Regarding a phase conjugator and its application to optical fiber communication, the present inventor has already filed applications (Japanese Patent Application Nos. 6-509844, 7-44574, and 7-304229, and Japanese Patent Laid-open Nos. 7-98464 and 7-301830).

A method of generating a phase conjugate wave by using a traveling wave type semiconductor laser amplifier is described in [1] A. MECOZZI ET AL., IEEE JOURNAL OF QUANTUM ELECTRONICS, VOL. 31, NO. 4, APRIL 1995, PP. 689–699. As shown in FIG. 6 of this literature, pump (excitation) light and probe light (also called signal light) are coupled by a directional coupler. The coupled pump light and probe light are input through a lens and an optical isolator into a traveling wave type semiconductor laser amplifier, thereby generating a phase conjugate wave from the traveling wave type semiconductor laser amplifier. The pump light is given by inputting light output from a color center laser (CCL) through an optical isolator (OI), a Babinet-Soleil compensator, and a lens into the directional coupler. The probe light is given by inputting light output from an external-cavity laser diode (ECLD) through an optical isolator, a λ/2 plate, and a λ/4 plate into the directional coupler.

A method of generating a phase conjugate wave by using a semiconductor laser instead of the semiconductor laser amplifier is described in [2] PATRICK P. IANNONE ET AL., IEEE JOURNAL OF QUANTUM ELECTRONICS, VOL. 31, NO. 7, JULY 1995, PP. 1285–1291. This method employs a device having substantially the same mechanism as that in the above-mentioned literature [1] except the use of the semiconductor laser. The semiconductor laser oscillates light having the same wavelength as the wavelength of pump light to be injected from the outside.

The above two methods are common in the point that the pump light and the probe light are input to one end of the semiconductor laser amplifier or the semiconductor laser, and the pump light, the probe light, and the phase conjugate wave are output from the other end.

In contrast, a method of inputting probe light into a semiconductor laser oscillating pump light from its first end face, and outputting a phase conjugate wave from the same first end face is described in [3] S. MURATA ET AL., APPL. PHYS. LETT. 58(14), Apr. 8, 1991, PP. 1458–1460.

In the methods described in the above-mentioned literatures [1] and [2], it is necessary to use three optical devices, i.e., the light source for generating the probe light, the light source for generating the pump light, and the semiconductor laser amplifier or the semiconductor laser for generating the phase conjugate wave. Accordingly, an optical system for coupling these three optical devices is complicated. In particular, an optical coupler for efficiently coupling the probe light and the pump light is required.

Further, in the method described in the above-mentioned literature [3], it is necessary to form a reflecting film having high reflectivity on an nonoutput end face of the semiconductor laser for outputting the phase conjugate wave. Therefore, a Fabry-Perot mode exists in the semiconductor laser. Accordingly, as described also in the literature [3], the wavelength of the phase conjugate wave is limited to a wavelength resonant with the Fabry-Perot mode.

A method for generating phase conjugate light by nondegenerate four-wave mixing (FWM) in a lasing DFB-LD has been recently reported in the following paper.

H. Kuwatsuka, H. Shoji, M. Matsuda, and H. Ishikawa, "THz frequency conversion using nondegenerate four-wave mixing process in a lasing long-cavity λ/4-shifted laser", ELECTRONICS LETTERS, Vol. 31, No. 24, pp. 2108–2110, 1995.

This method will now be described in brief. A semiconductor high-gain medium with a highly injected carrier has a large third-order nonlinear sensitivity, so that this medium is one of the optimum materials for four-wave mixing. In a lasing state of a semiconductor laser, high-intensity oscillation light exists in the laser. Therefore, inputting external light into the laser causes four-wave mixing in the laser, thereby generating phase conjugate light. This process is theoretically known; however, when external light is input into the laser in the lasing state, there actually occurs a problem that the oscillation light is pulled to the wavelength of the external light, or the oscillation light becomes unstable. Further, although the phase conjugate light is generated, the generation of the phase conjugate light is allowed only by the light having a wavelength resonant with the cavity constituting the semiconductor laser. Thus, the wavelength cannot be freely converted.

As described in the above paper, the quarter-wave phase-shifted DFB semiconductor laser includes two diffraction gratings for reflecting only light having a wavelength intended to be oscillated. The two diffraction gratings are formed so as to be shifted in phase from each other by a quarter wave. By the two diffraction gratings, the oscillation light is strongly confined in the semiconductor laser. By forming antireflection coatings on the opposite end faces of the semiconductor laser, light having wavelengths different from the wavelength of the oscillation light is passed without internal reflection in the laser. Accordingly, it is possible to generate phase conjugate light corresponding to the external light input into the semiconductor laser by using the oscillation light as pump light. Thus, high-efficient, high-speed, and wide-band conversion is allowed without the use of external pump light.

Although a conversion efficiency in the phase conjugate light generator depends on the conformity of the polarization planes of probe light and pump light, a general optical fiber transmission line has no polarization maintaining ability. Accordingly, to configure an optical system using optical phase conjugation, it is necessary to realize a phase conjugate light generator which can exhibit high-efficient, high-speed, and wide-band conversion, and further has no polarization dependence.

SUMMARY OF THE INVENTION

It is therefore an object of the present invention to provide a phase conjugate light generation method and device having a high conversion efficiency.

It is another object of the present invention to provide a phase conjugate light generation method and device having a conversion efficiency not dependent on a polarization state.

It is still another object of the present invention to provide an optical communication system having a phase conjugate light generation device which has a high conversion efficiency or a conversion efficiency not dependent on a polarization state.

It is a further object of the present invention to provide an optical network system having a novel configuration.

In accordance with an aspect of the present invention, there are provided a method, device, and system having the features of (1) to (35) described below.

(1) A method for generation of phase conjugate light, comprising the steps of (a) separating a signal light beam into a first polarization component having a first polarization plane and a second polarization component having a second polarization plane perpendicular to said first polarization plane; (b) supplying said first and second polarization components to a distributed feedback (DFB) laser diode to generate first and second phase conjugate light beams respectively corresponding to said first and second polarization components; and (c) combining said first and second phase conjugate light beams.

(2) A method according to the feature (1), wherein said step (b) includes a step of injecting a current into said DFB laser diode so that said DFB laser diode generates pump light having a wavelength different from a wavelength of said signal light beam, whereby said first and second phase conjugate light beams are generated by four-wave mixing based on said pump light in said DFB laser diode.

(3) A method according to the feature (1), wherein said DFB laser diode comprises first and second DFB laser diodes for receiving said first and second polarization components, respectively; and said steps (a) and (c) are performed by first and second polarization beam splitters, respectively.

(4) A method according to the feature (1), wherein said DFB laser diode has first and second ends for receiving said first and second polarization components, respectively; said first and second phase conjugate light beams are output from said second and first ends, respectively; and said steps (a) and (c) are performed by a common polarization beam splitter.

(5) A device for generation of phase conjugate light, comprising means for separating a signal light beam into a first polarization component having a first polarization plane and a second polarization component having a second polarization plane perpendicular to said first polarization plane; and a distributed feedback (DFB) laser diode supplied with said first and second polarization components to generate first and second phase conjugate light beams respectively corresponding to said first and second polarization components.

(6) A device according to the feature (5), wherein said separating means comprises a first polarization beam splitter having a first port for receiving said signal light beam and second and third ports for outputting said first and second polarization components, respectively; said DFB laser diode comprises first and second DFB laser diodes operatively connected to said second and third ports, respectively; said first and second phase conjugate light beams are output from said first and second DFB laser diodes, respectively; and said device further comprises a second polarization beam splitter for combining said first and second phase conjugate light beams.

(7) A device according to the feature (6), wherein said first DFB laser diode generates pump light having a third polarization plane; said first phase conjugate light beam is generated by four-wave mixing based on said first polarization component and said pump light in said first DFB laser diode; said second DFB laser diode generates second pump light having a fourth polarization plane; said second phase conjugate light beam is generated by four-wave mixing based on said second polarization component and said second pump light in said DFB laser diode; and said device further comprises means for rotating a polarization plane by 90° so that said first polarization plane coincides with said third polarization plane, and said second polarization plane coincides with said fourth polarization plane.

(8) A device according to the feature (7), wherein said rotating means comprises a first half-wave plate operatively connected between said first polarization beam splitter and said second DFB laser diode, and a second half-wave plate operatively connected between said first DFB laser diode and said second polarization beam splitter.

(9) A device according to the feature (7), wherein said rotating means comprises a polarization maintaining fiber.

(10) A device according to the feature (6), wherein said first and second polarization beam splitters are formed on a common waveguide substrate.

(11) A device according to the feature (5), wherein said separating means comprises a polarization beam splitter having first to fourth ports, said first port being supplied with said signal light beam, said first and third ports being coupled by said first polarization plane, said second and fourth ports being coupled by said first polarization plane, said first and second ports being coupled by second polarization plane, and said third and fourth ports being coupled by said second polarization plane; said first and second polarization components are output from said third and second ports, respectively; said DFB laser diode has first and second ends for receiving said first and second polarization components, respectively, and generates pump light having a third polarization plane; said first and second phase conjugate light beams are output from said second and first ends, respectively, and supplied to said second and third ports, respectively; and said device further comprises means for rotating one of said first and second polarization planes by 90° so that said first and second polarization planes coincide with said third polarization plane.

(12) A device according to the feature (11), wherein said rotating means comprises a half-wave plate.

(13) A device according to the feature (11), wherein said rotating means comprises a polarization maintaining fiber.

(14) A device according to the feature (11), further comprising an optical circulator having fifth to seventh ports; one of said fifth to seventh ports being connected to said first port of said polarization beam splitter; and said fourth port of said polarization beam splitter being antireflection-terminated.

(15) A device according to the feature (11), further comprising a first optical circulator having fifth to seventh ports; and a second optical circulator having eighth to tenth ports; one of said fifth to seventh ports being connected to said first port of said polarization beam splitter; and one of said eighth to tenth ports being connected to said fourth port of said polarization beam splitter.

(16) A device according to the feature (5), further comprising means for injecting a current into said DFB laser diode so that said DFB laser diode generates pump light; said first and second phase conjugate light beams being generated by four-wave mixing based on said pump light in said DFB laser diode.

(17) A device according to the feature (16), wherein said DFB laser diode has a diffraction grating having a quarter-wave phase shift structure at its substantially central portion, and an electrode for injecting said current; said electrode comprising a plurality of parts divided in a direction of said diffraction grating.

(18) A device for generation of phase conjugate light, comprising a distributed feedback (DFB) laser diode supplied with a signal light beam; means for injecting a current into said DFB laser diode so that said DFB laser diode generates pump light; and a nonlinear optical medium optically connected to said DFB laser diode; wherein a phase conjugate light beam is generated by four-wave mixing based on said signal light beam and said pump light in said DFB laser diode, and a power of said phase conjugate light beam is enhanced by four-wave mixing in said nonlinear optical medium.

(19) A device according to the feature (18), wherein said nonlinear optical medium comprises a semiconductor optical amplifier.

(20) A device according to the feature (18), wherein said nonlinear optical medium comprises an optical fiber.

(21) A device according to the feature (20), wherein said optical fiber has a zero-dispersion wavelength substantially equal to a wavelength of said pump light.

(22) A device according to the feature (20), further comprising means for frequency-modulating or phase-modulating said pump light, whereby stimulated Brillouin scattering in said optical fiber is suppressed.

(23) An optical communication system comprising a first optical fiber having a first end and a second end respectively corresponding to an input end and an output end of a signal light beam; a phase conjugate light generator operatively connected to said second end, for converting said signal light beam into a phase conjugate light beam; and a second optical fiber having a third end and a fourth end respectively corresponding to an input end and an output end of said phase conjugate light beam; wherein when said first and second optical fibers are virtually divided into equal numbers of sections, the products of average chromatic dispersions and section lengths in two corresponding ones of said sections of said first and second optical fibers as counted from said phase conjugate light generator are substantially equal to each other, and the products of average optical powers, average nonlinear coefficients, and section lengths in said two corresponding sections are substantially equal to each other; and said phase conjugate light generator comprises a device according to any one of the features (5) to (22).

(24) An optical communication system comprising a first optical fiber having a first end and a second end respectively corresponding to an input end and an output end of a signal light beam; a phase conjugate light generator operatively connected to said second end, for converting said signal light beam into a phase conjugate light beam; and a second optical fiber having a third end and a fourth end respectively corresponding to an input end and an output end of said phase conjugate light beam; wherein the ratios of chromatic dispersions and the products of optical powers and nonlinear coefficients at two points in said first and second optical fibers are substantially equal to each other, said two points giving equal cumulative values of chromatic dispersions from said phase conjugate light generator; and said phase conjugate light generator comprises a device according to any one of the features (5) to (22).

(25) An optical communication system comprising a first optical fiber having a first end and a second end respectively corresponding to an input end and an output end of a signal light beam; a phase conjugate light generator operatively connected to said second end, for converting said signal light beam into a phase conjugate light beam; and a second optical fiber having a third end and a fourth end respectively corresponding to an input end and an output end of said phase conjugate light beam; wherein the ratios of chromatic dispersions and the products of optical powers and nonlinear coefficients at two points in said first and second optical fibers are substantially equal to each other, said two points giving equal cumulative values of optical powers and nonlinear coefficients from said phase conjugate light generator; and said phase conjugate light generator comprises a device according to any one of the features (5) to (22).

(26) An optical communication system comprising a first optical fiber having a first end and a second end respectively corresponding to an input end and an output end of a signal light beam; a phase conjugate light generator operatively connected to said second end, for converting said signal light beam into a phase conjugate light beam; and a second optical fiber having a third end and a fourth end respectively corresponding to an input end and an output end of said phase conjugate light beam; wherein the product of an average chromatic dispersion and a length of said first optical fiber is substantially equal to the product of an average chromatic dispersion and a length of said second optical fiber; and said phase conjugate light generator comprises a device according to any one of the features (5) to (22).

(27) An optical communication system according to the feature (26), wherein the product of an average optical power and an average nonlinear coefficient in said first optical fiber and a length of said first optical fiber is substantially equal to the product of an average optical power and an average nonlinear coefficient in said second optical fiber and a length of said second optical fiber.

(28) A system comprising a plurality of units optically connected together; each of said plurality of units comprising an optical communication system according to any one of the features (23) to (27).

(29) A method for generation of phase conjugate light, comprising the steps of (a) injecting a current into a distributed feedback (DFB) laser diode so that said DFB laser diode generates pump light; (b) supplying a signal light beam to said DFB laser diode to generate a phase conjugate light beam by four-wave mixing based on said signal light beam and said pump light in said DFB laser diode; and (c) supplying said signal light beam, said pump light, and said phase conjugate light beam to a nonlinear optical medium to enhance a power of said phase conjugate light beam by four-wave mixing in said nonlinear optical medium.

(30) A system comprising a plurality of units optically connected together, and at least one optical signal adding/dropping device provided at a connection point between said plurality of units; each of said plurality of units comprising a first optical fiber for transmitting signal light; means for converting said signal light into phase conjugate light; and a second optical fiber for transmitting said phase conjugate light; wherein chromatic dispersion and optical Kerr effect in said first optical fiber are compensated by chromatic dispersion and optical Kerr effect in said second optical fiber.

(31) A system comprising a first optical fiber for transmitting a signal light beam; a phase conjugate light generator according to any one of the features (5) to (22), for converting said signal light beam into a phase conjugate light beam; and a second optical fiber for transmitting said phase conjugate light beam.

(32) A device according to the feature (15), further comprising a second DFB laser diode cascaded to said DFB laser diode, said second DFB laser diode generating second pump light having a polarization plane perpendicular to said third polarization plane.

(33) A device according to the feature (20), wherein said optical fiber has a nonlinear coefficient large enough to shorten a length of said optical fiber to such a degree that said optical fiber has a polarization maintaining ability.

(34) A device for generation of phase conjugate light, comprising a first DFB laser diode for generating first pump light having a first polarization plane; and a second DFB laser diode cascaded to said first DFB laser diode, for generating second pump light having a second polarization plane perpendicular to said first polarization plane; wherein when a signal light beam composed of first and second polarization components having polarization planes respectively corresponding to said first and second polarization planes is supplied to said first DFB laser diode, a first phase conjugate light beam having a polarization plane corresponding to said first polarization plane is generated in said first DFB laser diode by four-wave mixing based on said first polarization component and said first pump light, and said second polarization component is passed through said first DFB laser diode, whereas a second phase conjugate light beam having a polarization plane corresponding to said second polarization plane is generated in said second DFB laser diode by four-wave mixing based on said second polarization component and said second pump light, and said first phase conjugate light beam is passed through said second DFB laser diode.

(35) A method for generation of phase conjugate light, comprising the steps of (a) supplying a signal light beam composed of a first polarization component having a first polarization plane and a second polarization component having a second polarization plane perpendicular to said first polarization plane to a first DFB laser diode for generating pump light having a polarization plane corresponding to said first polarization plane to generate a first phase conjugate light beam having a polarization plane corresponding to said first polarization plane by four-wave mixing based on said first polarization component and said first pump light in said first DFB laser diode; and (b) supplying said first phase conjugate light beam output from said first DFB laser diode and said second polarization component passed through said first DFB laser diode to a second DFB laser diode for generating second pump light having a polarization plane corresponding to said second polarization plane to generate a second phase conjugate light beam having a polarization plane corresponding to said second polarization plane by four-wave mixing based on said second polarization component and said second pump light in said second DFB laser diode.

In accordance with another aspect of the present invention, there are provided a device and system having the features (1') to (24') described below.

(1') An optical phase conjugator for separating signal light into first and second polarization components orthogonal to each other, next converting the first polarization component into first phase conjugate light by four-wave mixing in a first third-order nonlinear medium using first pump light, and next rotating a polarization direction of the first phase conjugate light by 90°, whereas rotating a polarization plane of the second polarization component by 90°, next converting the second polarization component into second phase conjugate light with substantially the same conversion efficiency as that of the first phase conjugate light by four-wave mixing in a second third-order nonlinear medium using second pump light having a wavelength substantially equal to the wavelength of the first pump light, and finally combining the first phase conjugate light and the second phase conjugate light in a substantially same timing.

(2') In the feature (1'), a DFB-LD or a quarter-wave ($\lambda/4$) phase-shifted DFB-LD is used as each third-order nonlinear medium, and oscillation light in the DFB-LD or the quarter-wave ($\lambda/4$) phase-shifted DFB-LD is used as each pump light for occurrence of the four-wave mixing.

(3') In the feature (2'), the signal light is first passed through an optical circulator, and next separated into the first and second polarization components orthogonal to each other by a polarization beam splitter. The first polarization component parallel to the plane of an active layer of the DFB-LD is input to a first end face of the DFB-LD, and converted into the first phase conjugate light by four-wave mixing using oscillation light emitting from a second end face of the DFB-LD as the pump light. On the other hand, the second polarization component perpendicular to the plane of the active layer of the DFB-LD is rotated in polarization direction by 90°, next input to the second end face of the DFB-LD, and next converted into the second phase conjugate light by four-wave mixing using oscillation light emitting from the first end face as the pump light. The first phase conjugate light is rotated in polarization direction by 90°, and next input to a port of the polarization beam splitter from which the second polarization component is output. The second phase conjugate light is input to a port of the polarization beam splitter from which the first polarization component is output. The first phase conjugate light and the second phase conjugate light are combined and next input to a port of the optical circulator from which the signal light is output.

(4') In the features (1') to (3'), all the optical devices are coupled by using a polarization maintaining fiber, and the 90° rotation of the polarization plane is realized by orthogonally coupling two principal polarization axes of the polarization maintaining fiber.

(5') In the feature (2'), the polarization separation and the polarization combination are carried out by using a $LiNbO_3$ waveguide.

(6') The signal light is input to the first end face of the DFB-LD to generate phase conjugate light by four-wave mixing using the oscillation light output from the second end face of the DFB-LD as the pump light. All the signal light, the oscillation light, and the phase conjugate light output from the second end face are input into a third-order nonlinear optical medium located outside of the DFB-LD. In the third-order nonlinear optical medium, there occurs four-wave mixing using the oscillation light as the pump light.

(7') In the feature (6'), a semiconductor optical amplifier is used as the third-order nonlinear optical medium.

(8') In the feature (6'), an optical fiber is used as the third-order nonlinear optical medium.

(9') In the feature (8'), the wavelength of the pump light is substantially equal to a zero-dispersion wavelength of the optical fiber.

(10') In the feature (8'), the pump light is frequency-modulated or phase-modulated to thereby suppress stimulated Brillouin scattering (SBS) in the optical fiber.

(11') In an optical fiber communication system including a first optical fiber for transmitting signal light, a phase conjugate light generator for receiving the signal light supplied from the first optical fiber to generate phase conjugate light corresponding to the signal light, and a second optical fiber for receiving the phase conjugate light supplied from the phase conjugate light generator to transmit the phase conjugate light, wherein when the first and second optical fibers are virtually divided into equal numbers of sections, average chromatic dispersions in two corresponding ones of the sections counted from the phase conjugate light generator are set to have the same sign and be substantially inversely proportional to the length of each section, and an average value of the products of optical frequencies, optical powers, and third-order nonlinear coefficients in each section is set substantially inversely proportional to the length of each section; the configuration of any one of the features (1') to (10') is used as the phase conjugate light generator.

(12') In an optical fiber communication system including a first optical fiber for transmitting signal light, a phase conjugate light generator for receiving the signal light supplied from the first optical fiber to generate phase conjugate light corresponding to the signal light, and a second optical fiber for receiving the phase conjugate light supplied from the phase conjugate light generator to transmit the phase conjugate light, wherein the total dispersion in the first optical fiber is set substantially equal to that in the second optical fiber; the configuration of any one of the features (1') to (10') is used as the phase conjugate light generator.

(13') In the feature (12'), the product of nonlinear coefficient, average optical power, and fiber length in the first optical fiber is set substantially equal to that in the second optical fiber.

(14') In the feature (11'), one or more dispersion compensators for giving dispersions having signs opposite to the signs of the dispersions of the first and second optical fibers are inserted in, before, or after any one or both of the first and second optical fibers.

(15') In the features (11') to (14'), the loss of the first or second optical fiber is compensated by an optical repeating amplifier.

(16') In the features (11') to (15'), first and second terminals are located upstream of the first optical fiber and downstream of the second optical fiber, respectively. The first terminal includes a first transmitter and a second receiver, and the second terminal includes a first receiver and a second transmitter. First signal light output from the first transmitter is transmitted by the first optical fiber and next converted into first phase conjugate light. The first phase conjugate light is transmitted by the second optical fiber and next received by the first receiver. On the other hand, second signal light output from the second transmitter is transmitted by the second optical fiber and next converted into second phase conjugate light. The second phase conjugate light is transmitted by the first optical fiber and next received by the second receiver.

(17') In the features (1') to (16'), the signal light comprises wavelength division multiplexed signals having optical carriers of different wavelengths.

(18') In the features (11') to (17'), the first optical fiber and the phase conjugate light generator are located in a transmitting terminal, and the second optical fiber is repeated by optical amplifiers spaced a distance shorter than a nonlinear length.

(19') In the features (1') to (18'), the second optical fiber and the phase conjugate light generator are located in a receiving terminal, and the first optical fiber is repeated by optical amplifiers spaced a distance shorter than a nonlinear length.

(20') In the feature (17'), a plurality of wavelength division multiplexed optical signals having different wavelengths are used as the signal light. The wavelength division multiplexed optical signals are transmitted by a plurality of first optical fibers having different dispersions in different channels according to the feature (11'). The transmitted wavelength division multiplexed optical signals are individually converted into phase conjugate light beams in the different channels, and the phase conjugate light beams are next combined. Alternatively, the transmitted wavelength division multiplexed optical signals may be combined to an optical signal, which is next converted into phase conjugate light. Then, the resultant phase conjugate light is transmitted by a second optical fiber. In such a system, a dispersion compensator is inserted in one or both of the plural first optical fibers and the second optical fiber.

(21') In the feature (20'), the wavelength division multiplexed optical signals are transmitted by the plural first optical fibers, next combined, and next divided. Then, the optical signals are converted into phase conjugate light beams by a plurality of phase conjugate light generators, and one or plural channels of the phase conjugate light beams is/are extracted by optical filters. Finally, the extracted signal is transmitted by the second optical fiber associated with each phase conjugate light generator and optical filter.

(22') In the feature (21'), the wavelength division multiplexed optical signals are transmitted by a first optical fiber common for plural channels, and next divided. Then, the optical signals are converted into phase conjugate light beams by a plurality of phase conjugate light generators, and one or plural channels of the phase conjugate light beams is/are extracted by optical filters. Finally, the extracted signal is transmitted by the second optical fiber associated with each phase conjugate light generator and optical filter.

(23') In the feature (22'), the wavelength division multiplexed optical signals are separately transmitted by different optical fibers corresponding to different channels prior to inputting into the common first optical fiber.

(24') In the features (11') to (23'), the power or wavelength of the optical signal to be input into the first or second optical fiber is adjusted so as to provide an optimum receiving condition.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIGS. 7A and 7B respectively show the shapes of a transmitted pulse and a pulse after transmission by a 101-km SMF (single-mode optical fiber) in the case of using a phase conjugate light generator (PC);

FIG. 7C is a pulse waveform after transmission by the 101-km SMF in the case of using no PC;

DETAILED DESCRIPTION OF THE PREFERRED EMBODIMENTS

Figure 1:
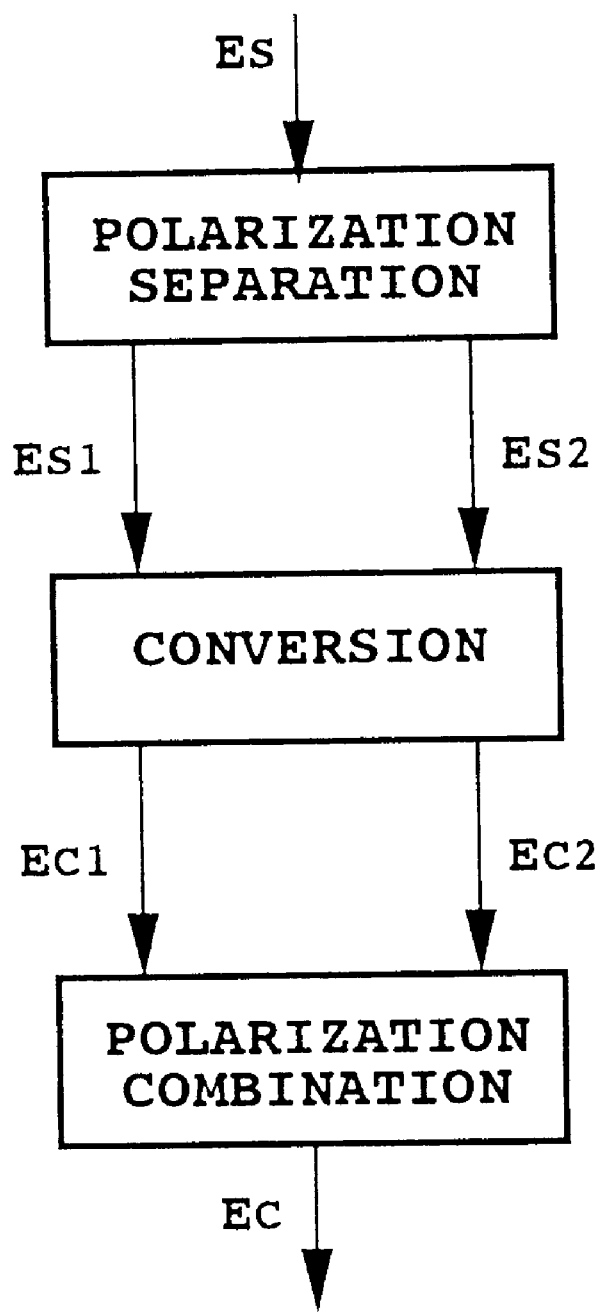
FIG. 1 is a diagram showing a first method according to the present invention.

Some preferred embodiments of the present invention will now be described in detail with reference to the attached drawings.

Now consider the case that an optical pulse propagating in a dispersion medium. When an unchirped pulse passes through a normal dispersion medium ($\partial^2\beta/\partial\omega^2 > 0$), the frequency at a leading edge of the pulse is shifted to a lower-frequency side, and the frequency at a trailing edge of the pulse is shifted to a higher-frequency side. When the unchirped pulse passes through an anomalous dispersion medium ($\partial^2\beta/\partial\omega^2 < 0$), the frequency at the leading edge of the pulse is shifted to a higher-frequency side, and the frequency at the trailing edge of the pulse is shifted to a lower-frequency side. In the above description, $\beta$ is a propagation constant, and $\omega$ is an angular frequency of light. In the normal dispersion medium, the longer the wavelength, the higher the group velocity, whereas in the anomalous dispersion medium, the shorter the wavelength, the higher the group velocity. Therefore, in both cases, a pulse width is expanded.

In the case that a light intensity is large, a refractive index is changed by the optical Kerr effect by the following amount.

$$\Delta n(t) = n_2 |E(t)|^2$$

where $n_2$ is an amount called a nonlinear refractive index. In the case of a usual silica fiber, this amount is about $3.2 \times 10^{-20}$ m$^2$/W. When an optical pulse undergoes the optical Kerr effect in a nonlinear medium, the spectrum is expanded (chirped) by the following amount.

$$\Delta\omega(t) = -\partial \Delta\phi(t)/\partial t$$
$$= -(2\pi n_2/\lambda)(\partial |E(t)|^2/\partial t)\Delta z$$

where $\Delta z$ is the interaction length.

This phenomenon is generally called self-phase modulation (SPM). Due to the SPM, the frequency at the leading edge of an optical pulse is shifted to a lower-frequency side, and the frequency at the trailing edge of the optical pulse is shifted to a higher-frequency side. The effect of dispersion becomes more remarkable by chirping due to the SPM, and as a result, pulse distortion becomes more remarkable. Accordingly, when the optical pulse undergoes the optical Kerr effect in a dispersion medium, the pulse is more expanded than by dispersion in the case of a normal dispersion medium, and pulse compression occurs in the case of an anomalous dispersion medium. Accordingly, in considering the effect of chromatic dispersion in addition, large pulse expansion occurs in the case of a normal dispersion medium, and a larger effect of pulse expansion due to chromatic dispersion and pulse compression due to SPM is exhibited in the case of an anomalous dispersion medium. The balance of these two effects is utilized in an optical soliton system.

In general, it may be considered convenient that a higher signal-to-noise ratio (S/N) can be held by adding pulse compression due to SPM in an anomalous dispersion medium. However, it cannot be generally said that the addition of pulse compression is better, for the reasons that high-level optical power transmission using an optical amplifier has recently become possible and that a relatively small chromatic dispersion value has recently been realized by the development of a dispersion shifted fiber. That is, the pulse compression effect becomes excessive to cause large waveform distortion. Particularly in the case of an NRZ pulse, pulse compression occurs intensively at the leading edge and the trailing edge of the pulse, so that a rapid waveform change occurs. In the extreme, the trailing part may come ahead of the leading part to cause break of the pulse into three parts. Further, in the case of long-haul optical amplification multilink transmission, there occurs four-wave mixing between signal light as pump light and spontaneous emission from an optical amplifier, causing a remarkable reduction in S/N (modulation instability).

The distortion of an optical pulse due to chromatic dispersion and nonlinearity as mentioned above can be compensated for by application of phase conjugate optics. For example, a signal light beam transmitted by a first optical fiber transmission line is converted into a phase conjugate light beam by a phase conjugate light generator, and the phase conjugate light beam is transmitted by a second optical fiber transmission line. By properly setting parameters relating to chromatic dispersion and nonlinearity in the first and second optical fibers, an optical pulse with substantially no distortion can be obtained at an output end of the second optical fiber. However, it is general that the efficiency of conversion from the signal light into the phase conjugate light beam in the phase conjugate light generator depends on a polarization state of the signal light beam. Accordingly, it is desired to obtain a phase conjugate light generator whose conversion efficiency has no polarization dependence.

In configuring such a phase conjugate light generator whose conversion efficiency has no polarization dependence, a polarization diversity method or a polarization active control method may be applied. Also by using an optical fiber transmission line composed of a polarization maintaining fiber (PMF), the polarization dependence of the conversion efficiency in the phase conjugate light generator can be eliminated. In the present invention, the polarization diversity method is adopted to eliminate the polarization dependence of the conversion efficiency.

FIG. 1 is a view showing a first method according to the present invention. In a polarization separation process, a signal light beam $E_s$ is separated into two polarization components $E_{s1}$ and $E_{s2}$. The polarization components $E_{s1}$ and $E_{s2}$ have polarization planes orthogonal to each other. In a conversion process as the next process, the polarization components $E_{s1}$ and $E_{s2}$ are converted into phase conjugate light beams $E_{c1}$ and $E_{c2}$, respectively. The phase conjugate light beams $E_{c1}$ and $E_{c2}$ have polarization planes respectively coinciding with the polarization planes of the polarization components $E_{s1}$ and $E_{s2}$. In a polarization combination process as the next process, the phase conjugate light beams $E_{c1}$ and $E_{c2}$ are combined to obtain a phase conjugate light beam Ec.

According to the present invention, one or two distributed feedback (DFB) laser diodes are used in the conversion process.

In the case that one DFB laser diode is used in the conversion process, the polarization components $E_{s1}$ and $E_{s2}$ are supplied to a first end and a second end of the DFB laser diode, respectively, and the phase conjugate light beams $E_{c1}$ and $E_{c2}$ are output from the second end and the first end, respectively. In this case, the polarization separation process and the polarization combination process may be carried out by using a common polarization beam splitter. The term of "end" used herein means an end face of an active layer of the DFB laser diode.

In the case that two DFB laser diodes are used in the conversion process, one of the two DFB laser diodes is used for the conversion from the polarization component $E_{s1}$ to the phase conjugate light beam $E_{c1}$, and the other is used for the conversion from the polarization component $E_{s2}$ to the phase conjugate light beam $E_{c2}$. In this case, the polarization separation process and the polarization combination process may be carried out by using different polarization beam splitters.

Preferably, a current is injected into the DFB laser diode so that the DFB laser diode generates pump light having a wavelength different from the wavelength of the signal light beam $E_s$, thereby generating the phase conjugate light beams $E_{c1}$ and $E_{c2}$ by four-wave mixing in the DFB laser diode.

Figure 2:
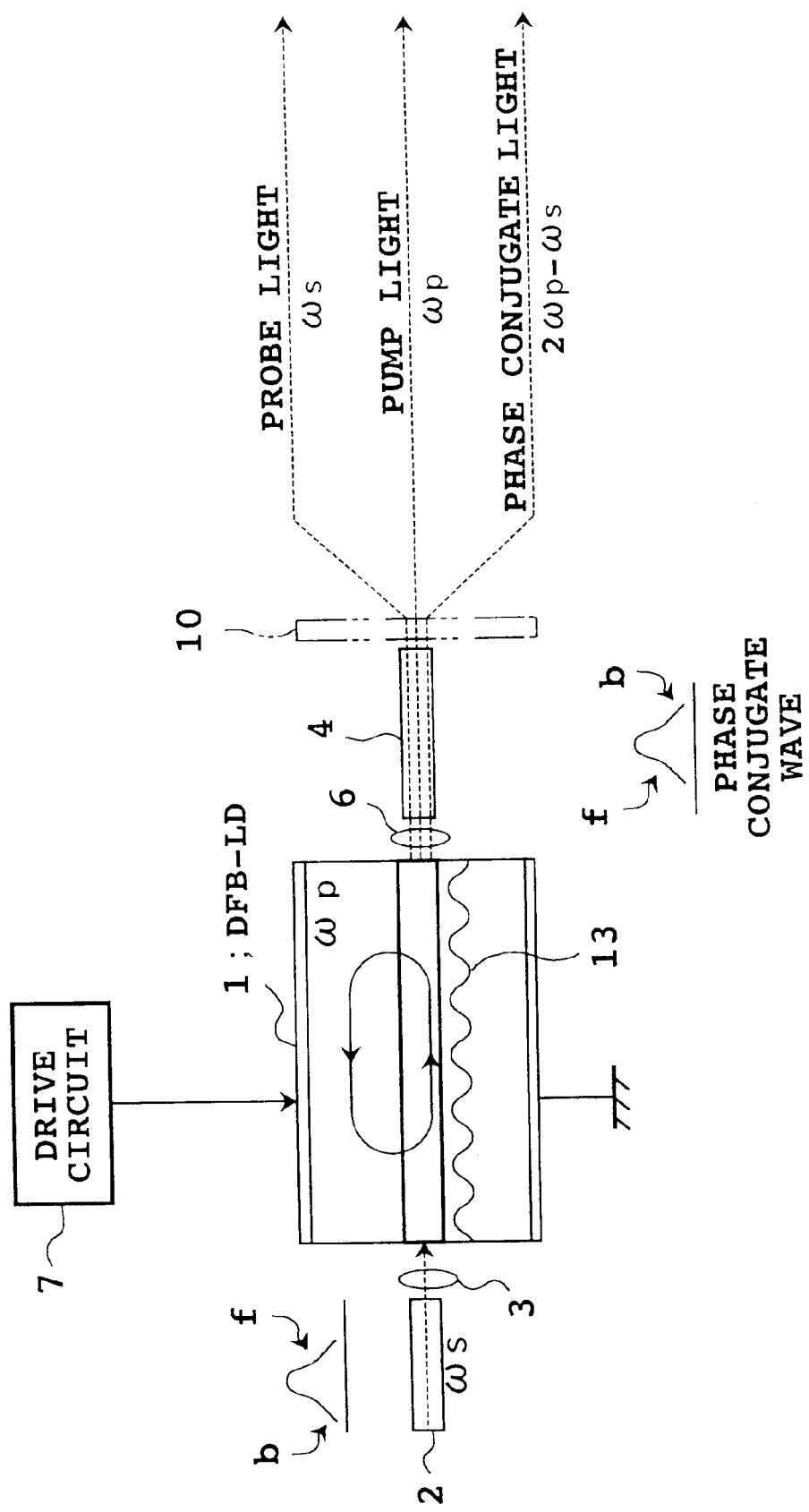
FIG. 2 is a view showing a phase conjugate light generator applicable to the present invention.

FIG. 2 is a view showing a phase conjugate light generator by nondegenerate four-wave mixing applicable to the present invention. An optical fiber 2 is optically connected through a lens 3 to a first end of a DFB laser diode 1, and an optical filter 10 is optically connected through a lens 6 and an optical fiber 4 to a second end of the DFB laser diode 1. A drive current is supplied from a drive circuit 7 to the DFB laser diode 1.

Figure 3:
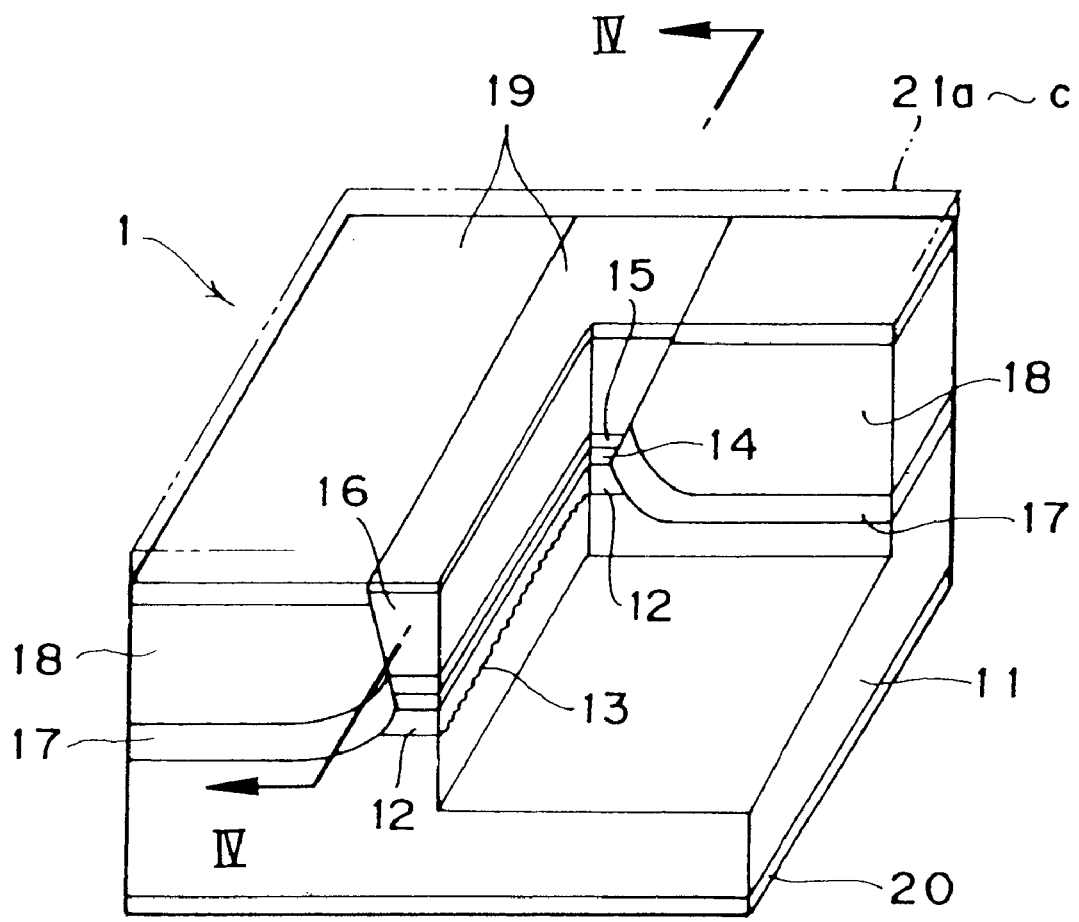
FIG. 3 is a partially broken away, perspective view of a DFB laser diode shown in FIG. 2.
Figure 4:
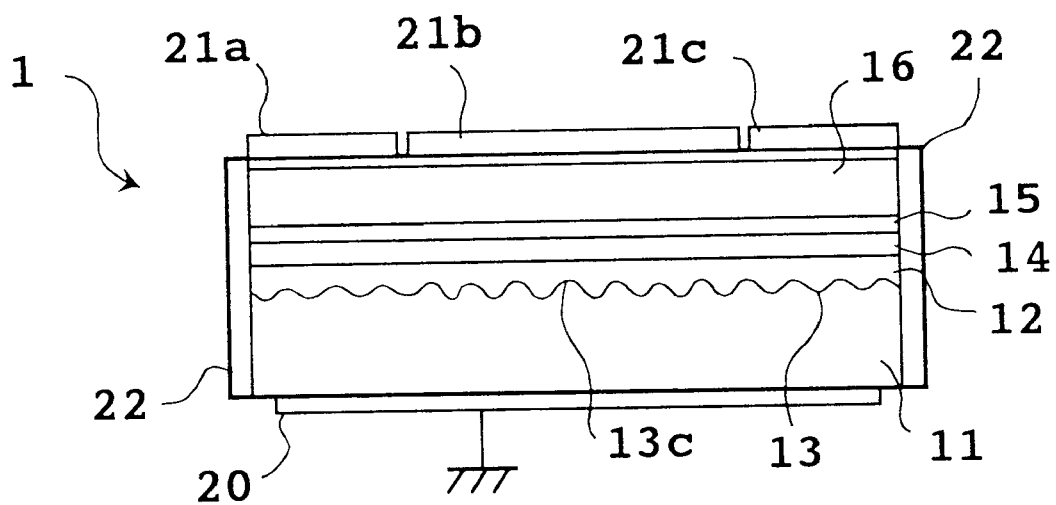
FIG. 4 is a cross section taken along the line IV—IV in FIG. 3.

The DFB laser diode 1 has a structure as shown in FIGS. 3 and 4, for example. Referring to FIG. 3, an n-InGaAsP guide layer 12 is formed on the upper surface of an n-InP substrate 11, and a diffraction grating 13 having a thickness whose waveform periodically changes in a light traveling direction is formed between the joint surfaces of the guide layer 12 and the substrate 11. As well shown in FIG. 4, the diffraction grating 13 has a phase-shifted structure such that the period is shifted by $\lambda/4$ ($\lambda$: wavelength of light in a waveguide structure) at its substantially central portion 13c. An undoped multiple quantum well (MQW) active layer 14 is formed on the guide layer 12, and p-InGaAsP buffer layer 15 and a p-InP layer 16 are sequentially formed on the active layer 14. The MQW active layer 14 is configured by alternately laminating five $In_{x'}Ga_{1-x'}As$ (x'=0.532) well layers each having a thickness of 7 nm and five $Ga_xIn_{1-x}As_yP_{1-y}$ (x=0.283, y=0.611) barrier layers each having a thickness of 10 nm. A portion from the p-InP layer 16 to the upper portion of the n-InP substrate 11 is projectively patterned to be formed in a stripe shape extending in a light traveling direction as viewed in plan. Further, a p-InP layer 17 and an n-InP layer 18 are sequentially formed on the n-InP substrate 11 at a portion on the opposite sides of the stripe projection. Further, a p-InGaAsP layer 19 is formed on the p-InP layer 16 and the n-InP layer 18. An n-sided electrode 20 is formed on the lower surface of the n-InP substrate 11, and three divided p-sided electrodes 21a, 21b, and 21c are formed on the p-InGaAsP layer 19. Antireflection films 22 for transmitting at least phase conjugate light are coated on the opposite end faces (first and second ends) of the DFB laser diode 1. The cavity length of the DFB laser diode 1 is set to 900 $\mu$m, for example; the length of the central p-sided electrode 21b is set to about 580 $\mu$m, for example; and the length of each of the opposite p-sided electrodes 21a and 21c is set to about 160 $\mu$m, for example.

The operation of this phase conjugate light generator will now be described. First, a drive current is supplied from the p-sided electrodes 21a, 21b, and 21c of the DFB laser diode 1 through the MQW active layer 14 to the n-sided electrode 20 to thereby continuously oscillate light having a wavelength of 1549 nm with a power of 40 mW in the MQW active layer 14. In this case, a current of 400 mA, for example, is supplied to the electrodes 21a, 21b, and 21c. The light oscillated in the DFB laser diode 1 has a narrow stable spectrum due to the fact that the laser mode is single and the gain band width is narrow. Then, the light oscillated in the DFB laser diode 1 is used as pump light for four-wave mixing.

Referring to FIG. 2, when probe light (signal light) is supplied through the optical fiber 2 and the lens 3 to the first end of the DFB laser diode 1, light having some spectral peaks is output from the second end through the lens 6 and the optical fiber 4. The output light was examined by an optical spectrum analyzer to obtain the result shown in FIG. 5.

Figure 5:
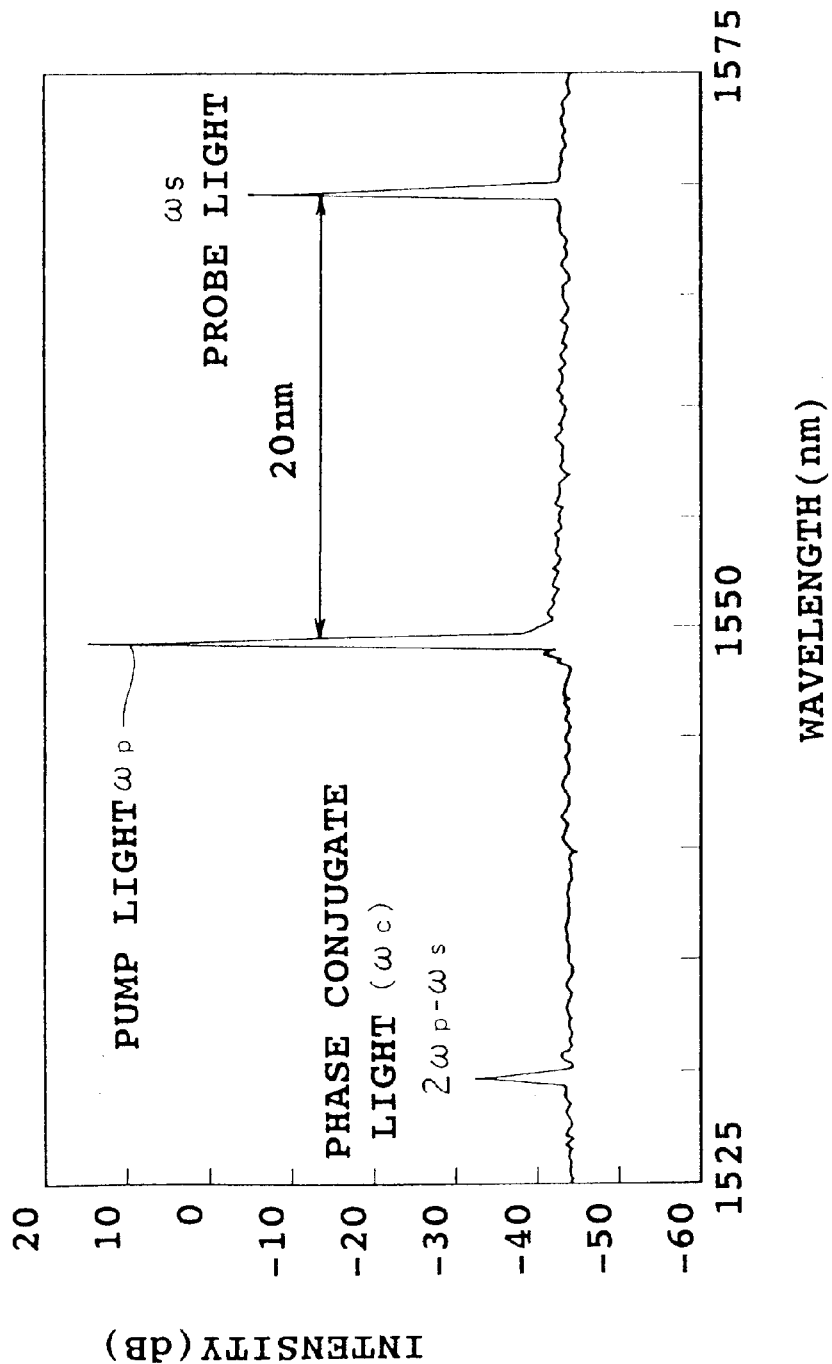
FIG. 5 is a graph showing a spectrum of light output from the DFB laser diode shown in FIG. 2.

As shown in FIG. 5, spectral peaks are present not only at a pump light wavelength of 1549 nm and at a probe light wavelength of 1569 nm, but also at a wavelength of 1529 nm. This spectral peak at 1529 nm corresponds to phase conjugate light. Letting $\omega_s$, $\omega_p$, and $\omega_c$ denote the angular frequencies of the probe light, the pump light, and the phase conjugate light, respectively, the following equation holds.

$$\omega_c = 2\omega_p - \omega_s$$

Thus, it is understood that the generation of phase conjugate light by four-wave mixing allows optical frequency conversion, i.e., wavelength conversion, from the probe light (signal light) into the phase conjugate light. In the case that the probe light has been modulated by a main signal, this modulation is maintained also in the phase conjugate light in the wavelength conversion process. Therefore, this kind of wavelength conversion function is greatly useful in constructing a network as described later.

As described above, the pump light is generated in the DFB laser diode 1, thereby eliminating the need for a mechanism for coupling the probe light and the pump light to thereby simplify the structure of the phase conjugate light generator. Accordingly, an optical communication device incorporating the phase conjugate light generator can be reduced in size.

Further, since the pump light is generated in the DFB laser diode 1, it is unnecessary to consider attenuation of the intensity of pump light due to passing of an optical fiber for inputting the pump light, and the conversion efficiency from the probe light to the phase conjugate light can be increased by strong pump light. The intensity of the phase conjugate light to be obtained is proportional to the square of the intensity of the pump light.

While the oscillation mode of the DFB laser diode 1 is single, the wavelength can be freely changed, for example, by a method of changing the distribution of a current to be supplied to the active layer 14. This method will be described more specifically.

It is known that by making different the magnitudes of currents to be supplied to the three p-sided electrodes 21a, 21b, and 21c, the single oscillation mode of the DFB laser diode 1 is shifted (Y. KOTAKI et al., OFC'90, THURSDAY MORNING, 159). For example, when the current to be injected into the opposite p-sided electrodes 21a and 21c of the DFB laser diode 1 is maintained constant and the current to be injected into the central p-sided electrode 21b is increased, the oscillation wavelength is shifted to a longer-wavelength side. The adjustment of the currents to be supplied to the p-sided electrodes 21a, 21b, and 21c is performed by the drive circuit 7. Accordingly, by using the DFB laser diode 1 having the plural p-sided electrodes 21a, 21b, and 21c and the antireflection films 22 formed on the opposite end faces as shown in FIG. 4, the wavelength of the pump light can be freely changed, and accordingly the wavelength of the phase conjugate light can also be freely changed. Accordingly, by using the phase conjugate light generator mentioned above, the wavelength conversion of an optical signal of each channel in wavelength-division multiplexing optical communication can be performed.

Although the DFB laser diode 1 is configured by the InP/InGaAsP layer structure in the above case, an InP/InAlGaAs layer structure or other structures may be adopted. Further, any materials matching a GaAs substrate may also be adopted.

The phase conjugate light generated in the DFB laser diode 1 is output with the probe light and the pump light. In the case of extracting the phase conjugate light only, the optical filter 10 is located outside of the output end of the DFB laser diode 1. In FIG. 2, the optical filter 10 may be located between the DFB laser diode 1 and the lens 6 or between the lens 6 and the optical fiber 4.

There will now be described an experiment of phase conjugate light generation by the use of the above-mentioned DFB laser diode. By using a λ/4 phase-shifted DFB laser diode with its opposite end faces AR-coated (antireflection-coated) (cavity length: 900 μm) and coupling single-mode fibers (SMF) to the opposite ends of the laser diode to prepare a module, a wavelength conversion experiment was carried out. This module was oscillated with an element output of 40 mW (pump light wavelength $\lambda_p$=1550 nm), and signal light having a wavelength $\lambda_s$ was input from the front end face. Then, a spectrum of light output from the rear end face was observed.

Figure 6:
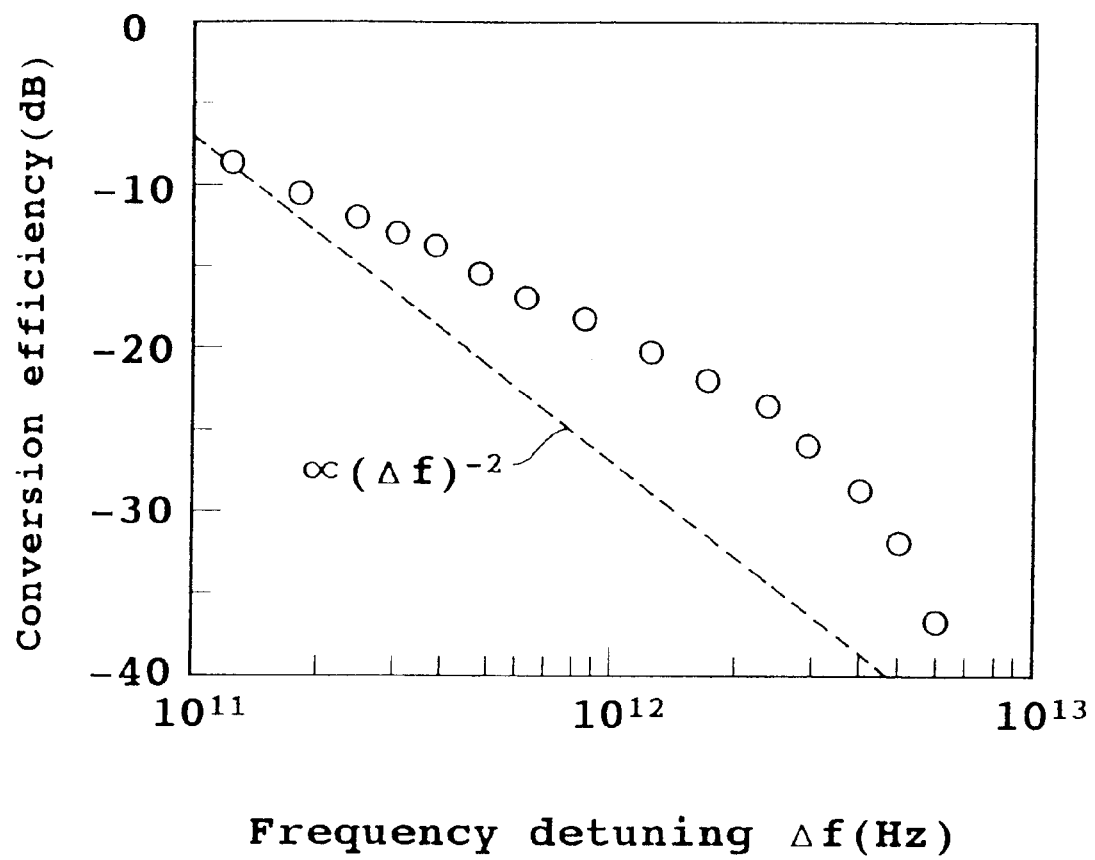
FIG. 6 shows a change in conversion efficiency with respect to a detuning frequency between pump light and signal light.

FIG. 6 shows a change in conversion efficiency with respect to a detuning frequency Δf between pump light and signal light. In the case of Δf=125 GHz (wavelength difference: 1.0 nm), a conversion efficiency of −8.7 dB was obtained, and even in the case of f=2.5 THz (wavelength difference: 20 nm), a conversion efficiency of −23 dB was obtained. Thus, a high conversion efficiency is allowed at frequencies up to a THz region, and application to wavelength conversion of wavelength-division multiplexed optical signals, for example, can be expected. Further, owing to the AR coating, almost no band limitation due to a Fabry-Perot mode was observed.

Next, an experiment of dispersion compensation in short-pulse transmission was tried to confirm that the converted light is phase conjugate light. An RZ signal pulse ($\lambda_s$=1552 nm) having a width of about 23 ps generated by using two stages of LiNbO$_3$ modulators was transmitted by a first single mode fiber (SMF) (dispersion: +18.1 ps/nm/km) having a length of 50 km. Thereafter, the optical pulse was converted in wavelength into light having a wavelength of 1548 nm by using a DFB laser diode, and the resultant converted light was transmitted by a second SMF (dispersion: +17.8 ps/nm/km) having a length of 51 km.

FIGS. 7A and 7B show the shapes of the transmitted pulse and the pulse after 101 km transmission, respectively. It is understood that the pulse shape of the converted light in contrast with the transmitted light is regenerated (FIG. 7B), that is, the phase conjugate relation of the converted light to the signal light is satisfied. For comparison, FIG. 7C shows a pulse shape in the case of 101 km transmission without the use of the phase conjugate light generator. It is understood that distortion of the pulse shape due to the chromatic dispersion and the optical Kerr effect is remarkable.

The result of the above experiment shows that the phase conjugate light generator using the DFB laser diode can compensate for waveform distortion of a high-speed optical signal (pulse) at 50 Gb/s or the equivalent.

Figure 8:
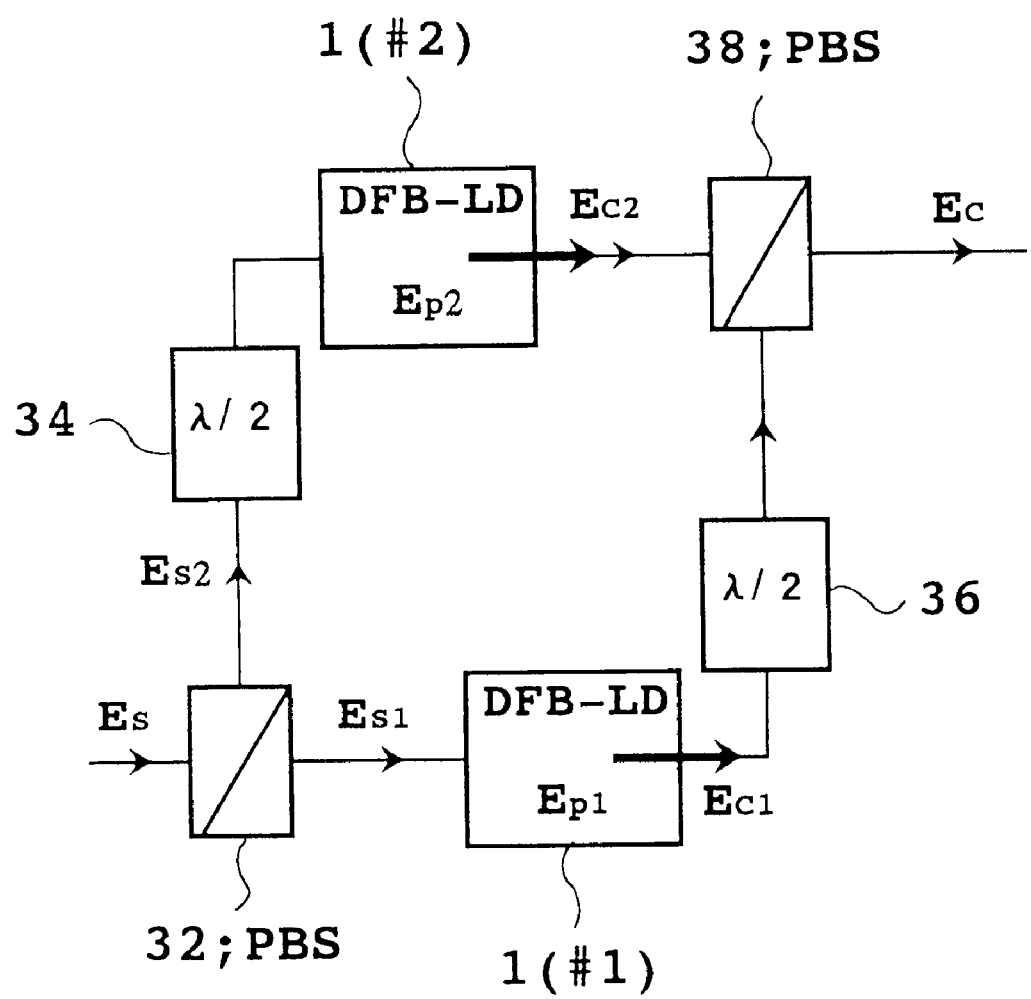
FIG. 8 is a diagram showing a first preferred embodiment of the phase conjugate light generator according to FIG. 1.

FIG. 8 is a view showing a first preferred embodiment of the phase conjugate light generator according to FIG. 1. A first polarization beam splitter (PBS) 32 is used to separate a signal light beam $E_s$ into a first polarization component $E_{s1}$ and a second polarization component $E_{s2}$. The first polarization component $E_{s1}$ is supplied to a first DFB laser diode 1 (#1) driven so as to generate pump light $E_{p1}$, and a first phase conjugate light beam $E_{c1}$ is output from the DFB laser diode 1 (#1). The polarization planes of the polarization component $E_{s1}$, the pump light $E_{p1}$, and the phase conjugate light beam $E_{c1}$ are coincident with each other. A second DFB laser diode 1 (#2) is used for the second polarization component $E_{s2}$. The DFB laser diode 1 (#2) is driven so as to generate second pump light $E_{p2}$. In FIG. 8, a drive circuit and others for each of the DFB laser diodes 1 (#1 and #2) are not shown (the same applies to the following), and the polarization planes of the pump lights $E_{p1}$ and $E_{p2}$ are parallel to each other.

The polarization planes of the polarization components $E_{s1}$ and $E_{s2}$ are orthogonal to each other. Therefore, a half-wave plate ($\lambda/2$) 34 is used to make the polarization plane of the second polarization component $E_{s2}$ coincide with the polarization plane of the second pump light $E_{p2}$ and to thereafter supply the polarization component $E_{s2}$ to the second DFB laser diode 1 (#2). The half-wave plate 34 is operatively connected between the polarization beam splitter 32 and the DFB laser diode 1 (#2). A second phase conjugate light beam $E_{c2}$ is output from the DFB laser diode 1 (#2). A second polarization beam splitter 38 is used to combine the first and second phase conjugate light beams $E_{c1}$ and $E_{c2}$ to obtain a phase conjugate light beam $E_c$. The polarization beam splitter 38 is provided so as to correspond to the polarization beam splitter 32. Therefore, the polarization plane of the first phase conjugate light beam $E_{c1}$ from the DFB laser diode 1 (#1) is rotated 90°, by a half-wave plate 36, and thereafter the beam $E_{c1}$ is supplied to the polarization beam splitter 38.

The polarization dependence of the conversion efficiency from the signal light beam $E_s$ to the phase conjugate light beam $E_c$ may be completely eliminated by making the characteristics of the DFB laser diodes 1 (#1 and #2) equal to each other and by making the lengths of optical paths extending from the polarization beam splitter 32 to the polarization beam splitter 38 and including respectively the DFB laser diodes 1 (#1 and #2) equal to each other. However, the present invention is not limited to this configuration.

The equality of the characteristics of the DFB laser diodes 1 (#1 and #2) is given by drive conditions such that the powers and wavelengths of the pump lights $E_{p1}$ and $E_{p2}$ become substantially equal, for example. To this end, the $\lambda/4$ phase shift position in the active layer 14 shown in FIG. 4 is properly set, or the distribution of the current to be supplied to the active layer 14 is adjusted.

In the case that the $\lambda/4$ phase shift position is set at a substantially middle point of the active layer 14, and that a symmetrical structure is given as mentioned above, the conversion efficiency in bidirectional phase conjugate light generation to be hereinafter described can be made uniform by setting a drive current $I_c$ (the current to be injected into the electrode 21b) equal to a drive current $I_s$ (the current to be injected into the electrodes 21a and 21c). The drive currents $I_c$ and $I_s$ may be adjusted in order to compensate unbalance of losses in optical paths.

The adjustment of the powers or wavelengths of the pump lights $E_{p1}$ and $E_{p2}$ may be performed by adjusting the temperatures of the DFB laser diodes 1 (#1 and #2).

While the polarization plane is rotated 90° by using the half-wave plates 34 and 36 in this preferred embodiment, the 90° rotation of the polarization plane may be performed by any other structures. For example, the half-wave plate 34 may be replaced by a polarization maintaining fiber (PMF), and the PMF may be twisted so that the principal axis at one end of the PMF is rotated 90° with respect to the principal axis at the other end. Alternatively, the half-wave plate 34 may be replaced by two PMFs connected in series in such a manner that the principal axes at a connection point of the PMFs are orthogonal to each other. The former method is more preferable for less polarization dispersion in the case of using a PMF. This polarization plane rotating method using a PMF is applicable to all the preferred embodiments of the present invention.

The first preferred embodiment shown in FIG. 8 has a symmetrical configuration of an input port for the signal light beam $E_s$ and an output port for the phase conjugate light beam $E_c$. Accordingly, in the case of applying this phase conjugate light generator to a bidirectional optical communication system as will be hereinafter described, phase conjugate light beams can be generated in both an up channel and a down channel, and the conversion efficiency does not depend on a polarization state.

Figure 9:
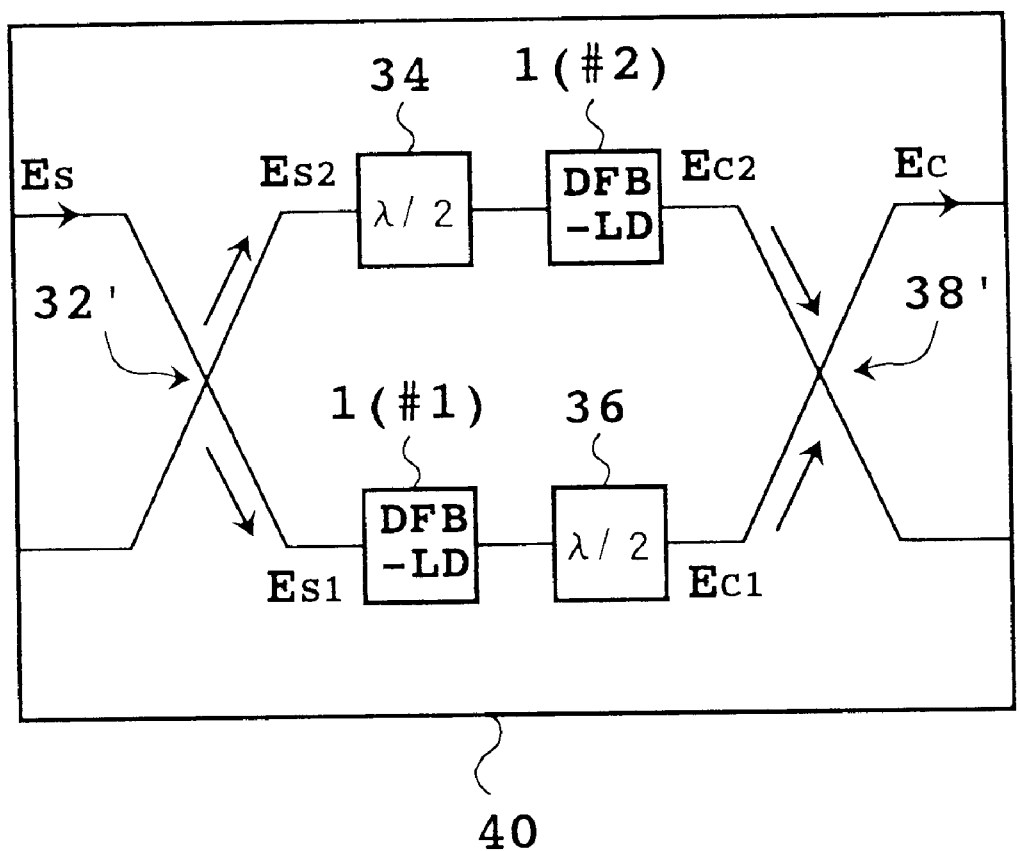
FIG. 9 is a diagram showing a second preferred embodiment of the phase conjugate light generator according to FIG. 1.

FIG. 9 is a view showing a second preferred embodiment of the phase conjugate light generator according to FIG. 1. This preferred embodiment is characterized in that polarization beam splitters 32' and 38' formed on a waveguide substrate 40 are used in place of the polarization beam splitters 32 and 38 shown in FIG. 8. The polarization beam splitters 32' and 38' are provided by waveguide structures formed on a $LiNbO_3$ substrate, for example. In this case, elements functioning as the half-wave plates 34 and 36 can be realized by combination of a $LiNbO_3$ optical waveguide and an $SiO_2$ film or the like. The DFB laser diodes 1 (#1 and #2) are accommodated in grooves formed on the waveguide structure 40, for example. In this case, the active layers of the DFB laser diodes 1 (#1 and #2) can be set parallel to each other by the use of the half-wave plates 34 and 36, thereby facilitating the manufacture.

Owing to the symmetry or the bidirectionality of the DFB laser diode as mentioned above, polarization diversity can be performed by using a single DFB laser diode. This will now be described more specifically.

Figure 10:
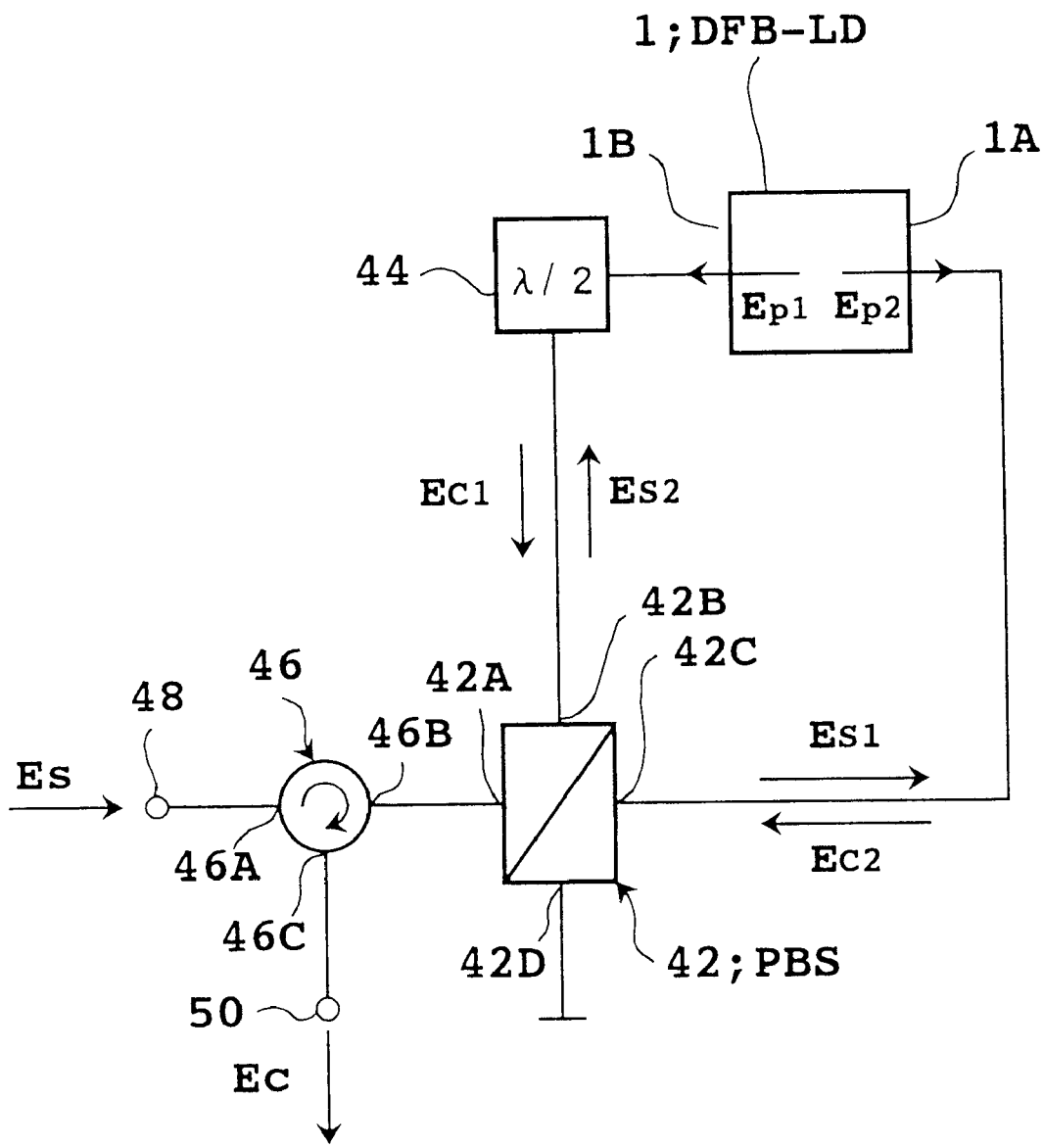
FIG. 10 is a diagram showing a third preferred embodiment of the phase conjugate light generator according to FIG. 1.

FIG. 10 is a view showing a third preferred embodiment of the phase conjugate light generator according to FIG. 1. This preferred embodiment is configured by an optical loop including a single DFB laser diode 1 having ends 1A and 1B and a single polarization beam splitter 42 for polarization separation and polarization combination. The polarization beam splitter 42 has four ports 42A, 42B, 42C, and 42D. The ports 42A and 42C and the ports 42B and 42D are coupled by a TE polarization plane, and the ports 42A and 42B and the ports 42C and 42D are coupled by a TM polarization plane. The port 42C is optically connected to the end 1A of the DFB laser diode 1, and the port 42B is optically connected through a half-wave plate 44 to the end 1B of the DFB laser diode 1. The port 42D is optically antireflection-terminated.

The expressions of "TE polarization plane" and "TM polarization plane" are herein used for convenience to express two polarization states orthogonal to each other. In FIG. 10, the TE polarization plane is parallel to the active layer of the DFB laser diode 1 and the sheet plane, and the TM polarization plane is perpendicular to the sheet plane.

An optical circulator 46 is used to separate the obtained phase conjugate light beam $E_c$ from the signal light beam $E_s$. The optical circulator 46 has three ports 46A, 46B, and 46C. The optical circulator 46 functions so as to output light input from the port 46A, from the port 46B and output light input from the port 46B, from the port 46C. The port 46A is connected to an input port 48 to which the signal light beam $E_s$ is supplied; the port 46B is connected to the port 42A of the polarization beam splitter 42; and the port 46C is connected to an output port 50 for the phase conjugate light beam $E_c$.

The signal light beam $E_s$ supplied through the ports 48, 46A, and 46B to the port 42A is separated by the polarization beam splitter 42 into a first polarization component $E_{s1}$ having a TE polarization plane and a second polarization component $E_{s2}$ having a TM polarization plane. The first polarization component $E_{s1}$ is supplied from the port 42C to the end 1A of the DFB laser diode 1, and the second polarization component $E_{s2}$ is supplied from the port 42B through the half-wave plate 44 to the end 1B of the DFB laser diode 1. When the second polarization component $E_{s2}$ passes through the half-wave plate 44, the polarization plane is converted from a TM polarization plane to a TE polarization plane. Accordingly, both the first and second polarization components $E_{s1}$ and $E_{s2}$ supplied to the DFB laser diode 1 have TE polarization planes.

The pump light generated in the DFB laser diode 1 mainly has a TE polarization plane. This pump light is composed of a first pump light component $E_{p1}$ directed from the end 1A to the end 1B and a second pump light component $E_{p2}$ directed from the end 1B to the end 1A.

By the four-wave mixing based on the first polarization component $E_{s1}$ supplied to the end 1A and the first pump light component $E_{p1}$, a first phase conjugate light beam $E_{c1}$ having a TE polarization plane is generated in the DFB laser diode 1. The phase conjugate light beam $E_{c1}$ is supplied from the end 1B through the half-wave plate 44 to the port 42B of the polarization beam splitter 42. Accordingly, the phase conjugate light beam $E_{c1}$ has a TM polarization plane at the port 42B. By the four-wave mixing based on the second polarization component $E_{s2}$ supplied to the end 1B and the second pump light component $E_{p2}$, a second phase conjugate light beam $E_{c2}$ is generated in the DFB laser diode 1. The phase conjugate light beam $E_{c2}$ is supplied from the end 1A to the port 42C of the polarization beam splitter 42 as maintaining a TE polarization plane. The phase conjugate light beams $E_{c1}$ and $E_{c2}$ supplied to the polarization beam splitter 42 are combined to become a phase conjugate light beam $E_c$, which is in turn passed through the ports 42A, 46B, and 46C in this order and then output from the port 50.

In this preferred embodiment, the single DFB laser diode 1 having the above-mentioned feature is used, so that the conversion efficiencies of the polarization components $E_{s1}$ and $E_{s2}$ can be easily made coincident. The coincidence of the conversion efficiencies can be easily made by setting the operating conditions of the DFB laser diode 1 as mentioned above, for example. Accordingly, it is possible to obtain the phase conjugate light beam $E_c$ having a constant intensity regardless of the polarization state of the signal light beam $E_s$.

Further, the clockwise optical path length and the counterclockwise optical path length in the optical loop are equal to each other in this preferred embodiment. Accordingly, the polarization combination of the phase conjugate light beams $E_{c1}$ and $E_{c2}$ can be performed in a substantially same timing, thereby ensuring an accurate operation of the phase conjugate light generator.

The polarization beam splitter 42 may be of various types including one using a polarization separating film such as a dielectric multilayer film, a bulk type using a crystal of calcite or the like, and a fiber type.

An optical filter may be connected to the output port 50, so as to extract the phase conjugate light beam $E_c$ only.

The optical loop in this preferred embodiment may be provided by spatial coupling using a lens system or by coupling using an optical fiber or an optical waveguide. Particularly in the case of using an optical fiber, the use of a polarization maintaining fiber (PMF) or additional use of a polarization controller is adopted to maintain a polarization state. In the case of using a PMF, the half-wave plate can be conveniently omitted as mentioned above.

Figure 11:
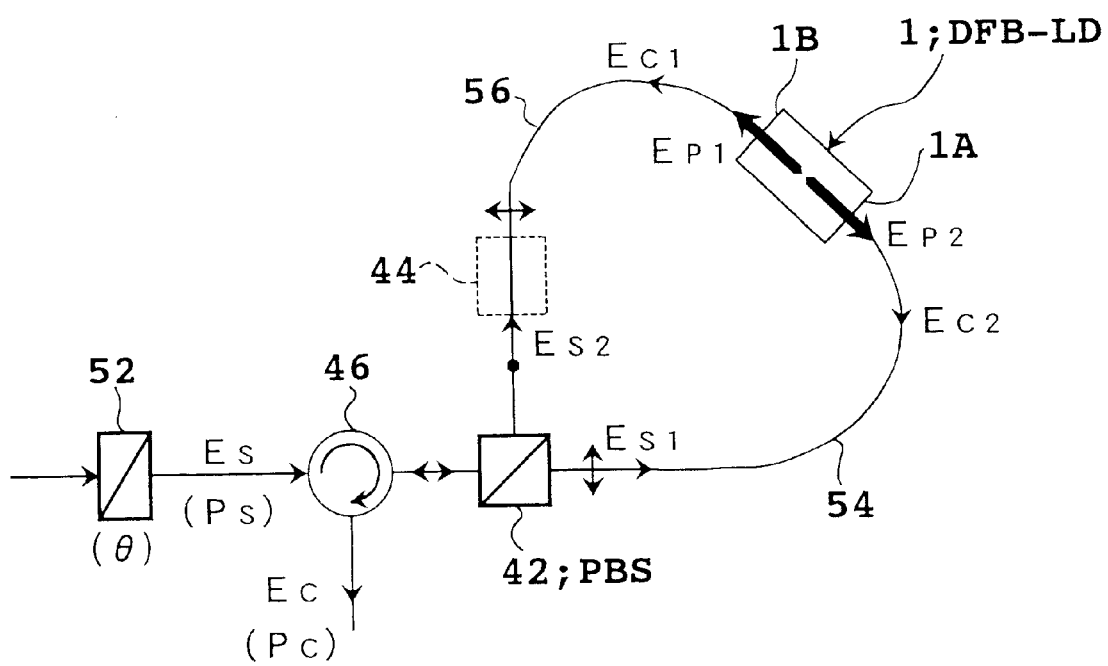
FIG. 11 is a diagram showing an arrangement for a verification experiment for the preferred embodiment shown in FIG. 10.

FIG. 11 is a view showing the arrangement for a verification experiment of the preferred embodiment shown in FIG. 10. A rotatable polarizer 52 was used to supply the signal light beam $E_s$ given as a linearly polarized wave to the optical circulator 46 and rotate the polarization plane of the beam $E_s$ in a range of 0° to 180°. The polarization beam splitter 42 and the end 1A of the DFB laser diode 1 were connected by a polarization maintaining fiber (PMF) 54, and the polarization beam splitter 42 and the end 1B of the DFB laser diode 1 were connected by a PMF 56.

The directions of the principal axes at the opposite ends of the PMF 54 are coincident so that the first polarization component $E_{s1}$ having a TE polarization plane is supplied to the end 1A of the DFB laser diode 1 as maintaining the polarization state. In contrast, the principal axes at the opposite ends of the PMF 56 are orthogonal to each other so that the function of the half-wave plate 44 is attained without the use of the plate 44. Accordingly, the second polarization component $E_{s2}$ having a TM polarization plane output from the polarization beam splitter 42 is input into the DFB laser diode 1 from the end 1B in the state that the component $E_{s2}$ has a TE polarization plane.

Figure 12:
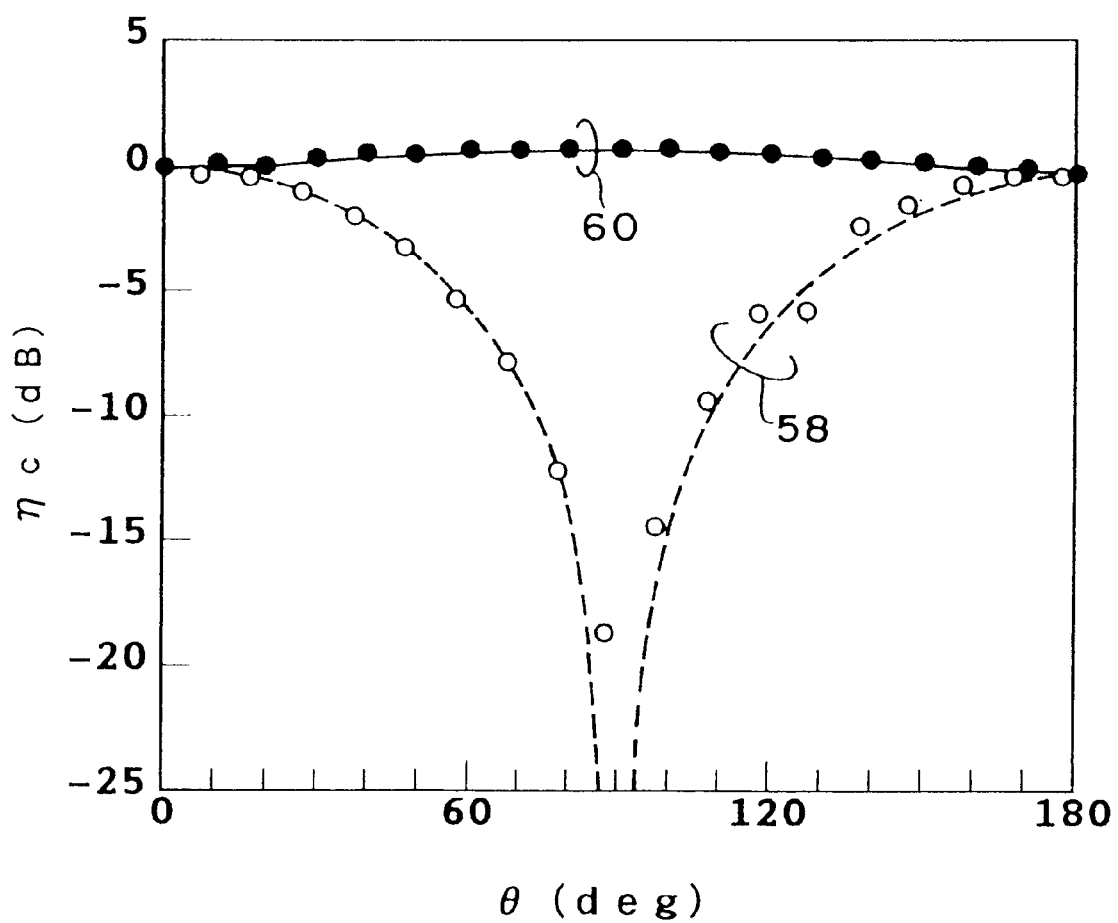
FIG. 12 is a graph showing data obtained in the experiment shown in FIG. 11.

Referring to FIG. 12, there is shown data obtained by the experiment shown in FIG. 11. In FIG. 12, the vertical axis represents conversion efficiency $\eta_c$ (dB), and the horizontal axis represents polarization angle θ (deg). The conversion efficiency $\eta_c$ is given as $\eta_c = P_c/P_s$ where $P_s$ is the power of the signal light beam $E_s$ input into the optical circulator 46, and $P_c$ is the power of the phase conjugate light beam $E_c$ output from the optical circulator 46. The polarization angle θ is defined by an angle formed between the polarization plane of the signal light beam $E_s$ input as a linearly polarized wave and the TE polarization plane. In the prior art wherein signal light is input to a single DFB laser diode in only one direction, the conversion efficiency $\eta_c$ largely varies with the polarization angle θ (in proportion to $\cos^2\theta$) as shown by reference numeral 58, and no conversion efficiency η was observed at θ=90°. In contrast, according to the third preferred embodiment shown in FIG. 10, variations in the conversion efficiency $\eta_c$ with a change in the polarization angle θ are suppressed to less than 0.4 dB. Thus, it was confirmed that sufficient characteristics in system design can be obtained.

Additional details of the experiment described in this specification and shown in FIGS. 11 and 12 can be found in Electronics Letters, Vol. 33, No. 4, pp 316–317, February 1997.

Figure 13:
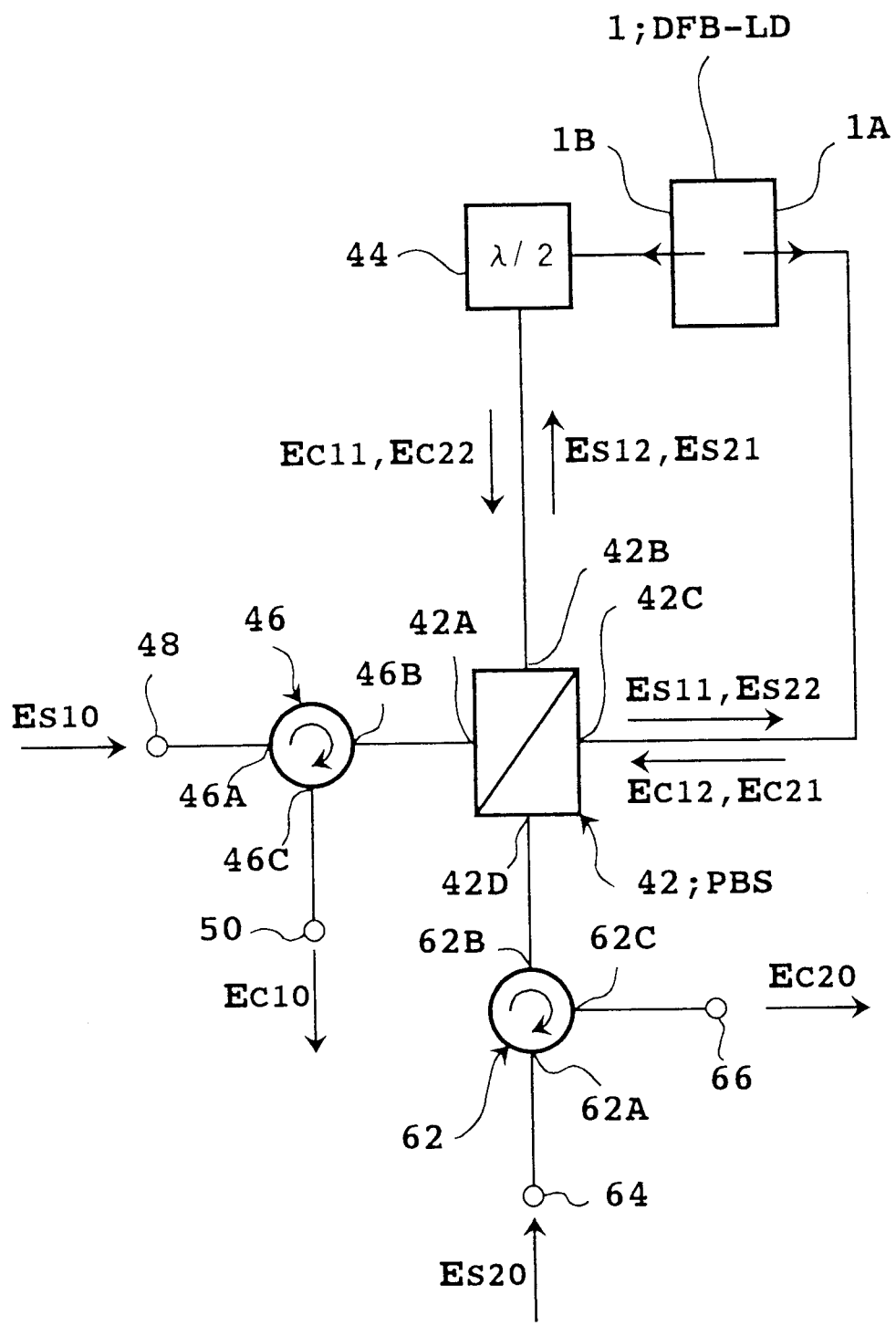
FIG. 13 is a diagram showing a fourth preferred embodiment of the phase conjugate light generator according to FIG. 1.

FIG. 13 is a view showing a fourth preferred embodiment of the phase conjugate light generator according to FIG. 1. In the third preferred embodiment shown in FIG. 10, the signal light beam $E_s$ of one channel is converted into the phase conjugate light beam $E_c$ of one channel, whereas in this preferred embodiment, signal light beams $E_{s10}$ and $E_{s20}$ of two channels are converted into phase conjugate light beams $E_{c10}$ and $E_{c20}$ of two channels. While the function of the third preferred embodiment shown in FIG. 10 is included in the fourth preferred embodiment, the symbols of the beams $E_s$, $E_{s1}$, $E_{s2}$, $E_{c1}$, $E_{c2}$, and $E_c$ in FIG. 10 are changed to $E_{s10}$, $E_{s11}$, $E_{s12}$, $E_{c11}$, $E_{c12}$, and $E_{c10}$, respectively, in FIG. 13.

The port 42D of the polarization beam splitter 42 is not antireflection-terminated, but is connected to an optical circulator 62. The optical circulator 62 has ports 62A, 62B, and 62C. The optical circulator 62 outputs light input from the port 62A, from the port 62B, and outputs light input from the port 62B, from the port 62C. The port 62A is connected to an input port 64 for a signal light beam $E_{s20}$ of the second channel; the port 62B is connected to the port 42D of the polarization beam splitter 42; and the port 62C is connected to an output port 66 for a phase conjugate light beam $E_{c20}$ of the second channel.

The conversion from the signal light beam $E_{s20}$ to the phase conjugate light beam $E_{c20}$ in the second channel can be easily understood in conformance with the conversion from the signal light beam $E_{s10}$ to the phase conjugate light beam $E_{c10}$ in the first channel, so the description thereof will be omitted herein. In this preferred embodiment, the DFB laser diode 1 also generates pump light having a TM polarization plane.

In a general DFB laser diode, there is a possibility that high efficiencies of generation of both pump light having a TE polarization plane and pump light having a TM polarization plane cannot always be obtained. In such a case, two DFB laser diodes cascaded together may be used. This will be described more specifically.

Figure 13A:
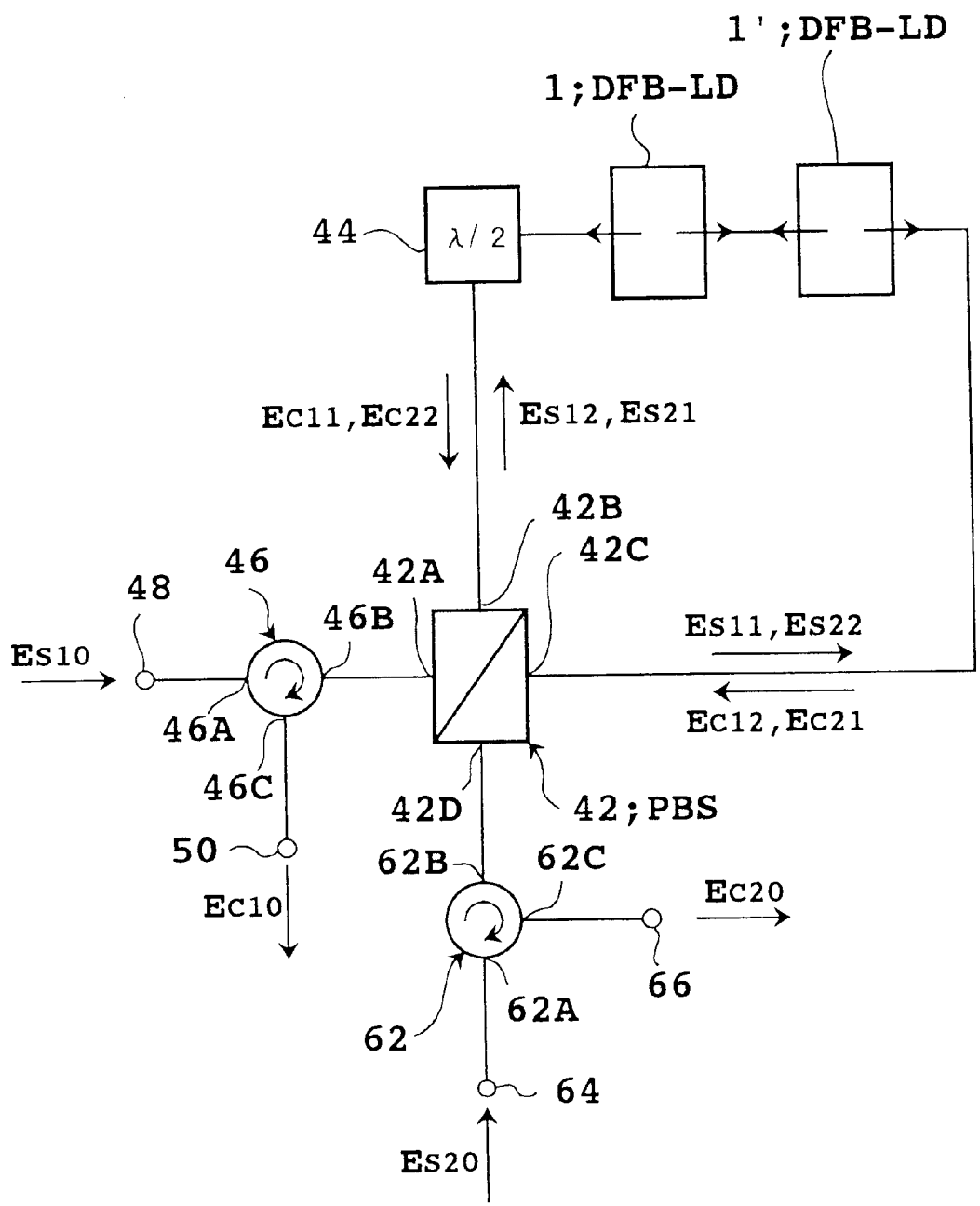
FIG. 13A is a diagram showing a modification of the phase conjugate light generator shown in FIG. 13.

Referring to FIG. 13A, there is shown a modification of the phase conjugate light generator shown in FIG. 13. An additional DFB laser diode 1' is provided between the DFB laser diode 1 and the polarization beam splitter 42, and the two DFB laser diodes 1 and 1' are cascaded. The DFB laser diode 1 generates pump light mainly having a TE polarization plane, and the DFB laser diode 1' generates pump light mainly having a TM polarization plane. According to this preferred embodiment, the DFB laser diode 1 contributes mainly to the conversion from the signal light beam $E_{s10}$ to the phase conjugate light beam $E_{c10}$, and the DFB laser diode 1' contributes mainly to the conversion from the signal light beam $E_{s20}$ to the phase conjugate light beam $E_{c20}$. The principles of generation of phase conjugate light and wavelength conversion in the DFB laser diodes 1 and 1' can be easily understood in conformance with the previous preferred embodiments, so the description thereof will be omitted herein.

In the configuration shown in FIG. 13A, the DFB laser diodes 1 and 1' are included in the optical loop including the polarization beam splitter 42 and the half-wave plate 44. However, only the DFB laser diodes 1 and 1' may be extracted from the optical loop to configure a phase conjugate light generator. That is, the DFB laser diode 1 generates pump light having a TE polarization plane, and the DFB laser diode 1' generates pump light having a TM polarization plane. Accordingly, by supplying a signal light beam to any one of the cascaded DFB laser diodes 1 and 1', a converted phase conjugate light beam is output from the other. In this case, the conversion efficiency does not depend on the polarization state of the input signal light beam. Further, the cascaded DFB laser diodes 1 and 1' have bidirectionality, so that in the case of applying the phase conjugate light generator to a bidirectional transmission system, the polarization dependence of conversion efficiency in each of the bidirectional channels can be eliminated.

Figure 14A:
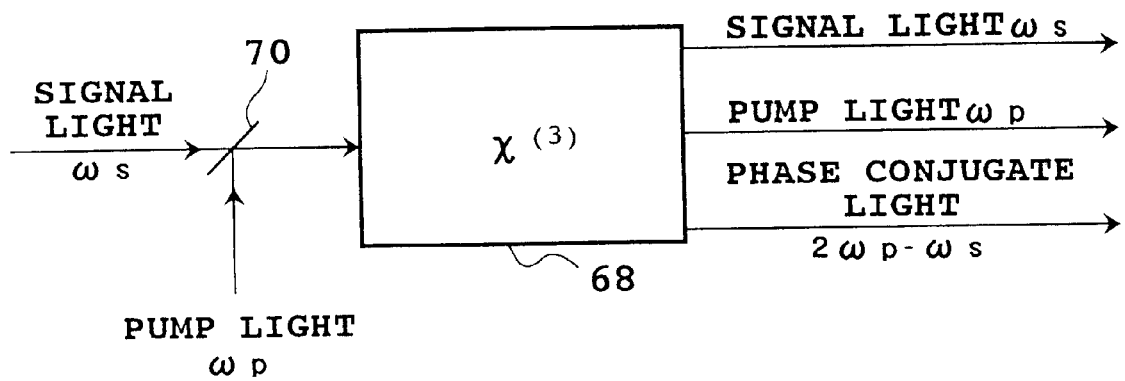
FIGS. 14A and 14B are illustrations of a second method according to the present invention.
Figure 14B:
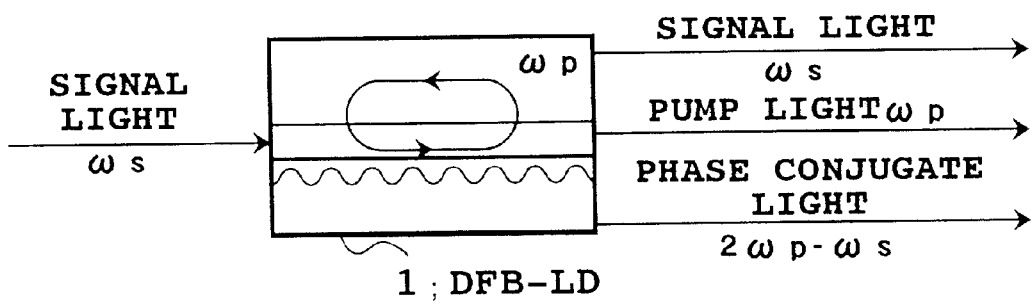

FIGS. 14A and 14B are views for illustrating a second method according to the present invention. In the case of generating phase conjugate light by nondegenerate four-wave mixing by using a third-order nonlinear optical medium ($\chi^{(3)}$) 68 such as an optical fiber or a semiconductor optical amplifier as shown in FIG. 14A, signal light having an angular frequency $\omega_s$ and pump light having an angular frequency $\omega_p$ ($\omega_p \neq \omega_s$) are input through an optical coupler 70 along the same optical path into the nonlinear optical medium 68. The reason for use of the optical coupler 70 is to supply the signal light and the pump light output from different light sources through the same optical path into the nonlinear optical medium 68 and allow the interaction of the signal light and the pump light. Based on the four-wave mixing of the signal light and the pump light in the nonlinear optical medium 68, phase conjugate light having an angular frequency $2\omega_p - \omega_s$ is generated and output from the nonlinear optical medium 68 together with the signal light and the pump light.

The term of "nondegenerate" used herein means that the wavelength (frequency) of the signal light and the wavelength (frequency) of the pump light are different from each other. Since the wavelength of the signal light, the wavelength of the pump light, and the wavelength of the phase conjugate light satisfy the above-mentioned relation, wavelength conversion is carried out simultaneously with generation of the phase conjugate light. Accordingly, the expression of "generation of phase conjugate light" in this specification except Title of the Invention and Field of the Invention should be understood as a concept including the phase conjugate conversion and wavelength conversion from probe light (signal light) to phase conjugate light.

In the case that the DFB laser diode 1 is used as a nonlinear optical medium as shown in FIG. 14B, pump light is generated in the DFB laser diode 1 by injecting a current into the DFB laser diode 1. Accordingly, phase conjugate light can be generated by supplying only external signal light into the DFB laser diode 1, and the signal light, the pump light, and the phase conjugate light are output from the DFB laser diode 1. An effect by such use of the DFB laser diode 1 as the nonlinear optical medium has been previously described.

It should be noted herein that the DFB laser diode 1 has no Fabry-Perot mode, and it is therefore possible to not only input the external signal light, but also extract the signal light, the pump light, and the phase conjugate light. That is, the power of the phase conjugate light can be increased by optically cascading the DFB laser diode 1 and the nonlinear optical medium 68.

In the second method according to the present invention, a current is first injected into the DFB laser diode 1 so that the DFB laser diode 1 generates the pump light. The signal light is next supplied to the DFB laser diode 1 to generate the phase conjugate light in the DFB laser diode 1 by the four-wave mixing based on the signal light and the pump light in the DFB laser diode 1. All the signal light, the pump light, and the phase conjugate light output from the DFB laser diode 1 are supplied to the nonlinear optical medium 68 to enhance the power of the phase conjugate light by the four-wave mixing in the nonlinear optical medium 68.

In embodying the second method according to the present invention, the signal light, the pump light, and the phase conjugate light are output along the same optical path from the DFB laser diode 1, so that the optical coupler 70 as shown in FIG. 14A is not necessary in supplying these beams of light to the nonlinear optical medium 68. As a result, the pump light having a high power can be easily maintained in the DFB laser diode 1 and the nonlinear optical medium 68, thereby improving the conversion efficiency from the signal light to the phase conjugate light.

The second method according to the present invention may be combined with the first method according to the present invention. For example, in the arrangement for the verification experiment shown in FIG. 11, the polarization maintaining fibers (PMFs) 54 and 56 are connected to the two ends 1A and 1B of the DFB laser diode 1, respectively. In general, an optical fiber has a property as a third-order nonlinear optical medium. Therefore, by generating a third-order nonlinear effect in the fibers 54 and 56 shown in FIG. 11, the phase conjugate light beams $E_{c2}$ and $E_{c1}$ can be amplified in the fibers 54 and 56, respectively. As a result, the power of the phase conjugate light beam $E_c$ obtained by the polarization combination can be enhanced. This will be described more specifically.

The enhancement of the third-order nonlinear effect (specifically, a value of $\gamma$) may be attained by increasing a nonlinear refractive index $n_2$ or by decreasing a mode field diameter (MFD). The increase of the nonlinear refractive index $n_2$ may be attained by a method of adding (doping) fluorine or the like in the clad and adding (doping) a high concentration of $GeO_2$ in the core. By such a method, a large value of $5\times10^{-20}$ $m^2/W$ or more is obtained as the value of the nonlinear refractive index $n_2$. On the other hand, the decrease of the MFD can be attained by designing of a specific index difference between the core and the clad or the shape of the core (as in DCF). For example, in the case that a single mode fiber is used, the single mode fiber may have a MFD smaller than the MFD of a single mode fiber as a transmission line. By these techniques, a large value exceeding 15 $W^{-1}km^{-1}$ is obtained as the $\gamma$ value (in a usual DSF, $\gamma \approx 2.6$ $W^{-1}km^{-1}$). Further, the fiber having such a large $\gamma$ value can be used as a zero-dispersion fiber.

In the specially designed fiber (special fiber) as mentioned above, it is sufficient that the length of this fiber is set to about 2.6/15 ($\approx$1/5.8), so as to generate a third-order nonlinear effect similar to that in a usual DSF, because the conversion efficiency is proportional to the square of $\gamma PL$. For example, if a length of about 20 km is required to generate the third-order nonlinear effect by the use of a usual DSF, a similar effect can be obtained by a length of about 3 to 4 km of the special fiber. In actual, the loss is reduced by an amount of decrease in the fiber length, so that the length of the special fiber can be further decreased. Further, in such a special fiber, the accuracy of control of a zero-dispersion wavelength is improved, so that realization of a greatly wide conversion band can be expected. Further, with a fiber length of several km (e.g., 6 km), a polarization maintaining ability is ensured. Accordingly, application of such a special fiber to the present invention is greatly useful in obtaining a high conversion efficiency and a polarization-independent conversion efficiency.

To make equal the conversion efficiencies in two directions in the DFB laser diode in the present invention, the conversion efficiencies in the DFB laser diode and each optical fiber as the third-order nonlinear optical medium associated with the DFB laser diode may be made equal, or the total amounts of conversion in the DFB laser diode and each fiber may be made equal.

As described above, by combining the first and second methods according to the present invention, generation of phase conjugate light is allowed with a polarization-independent conversion efficiency and a high conversion efficiency.

Figure 15:
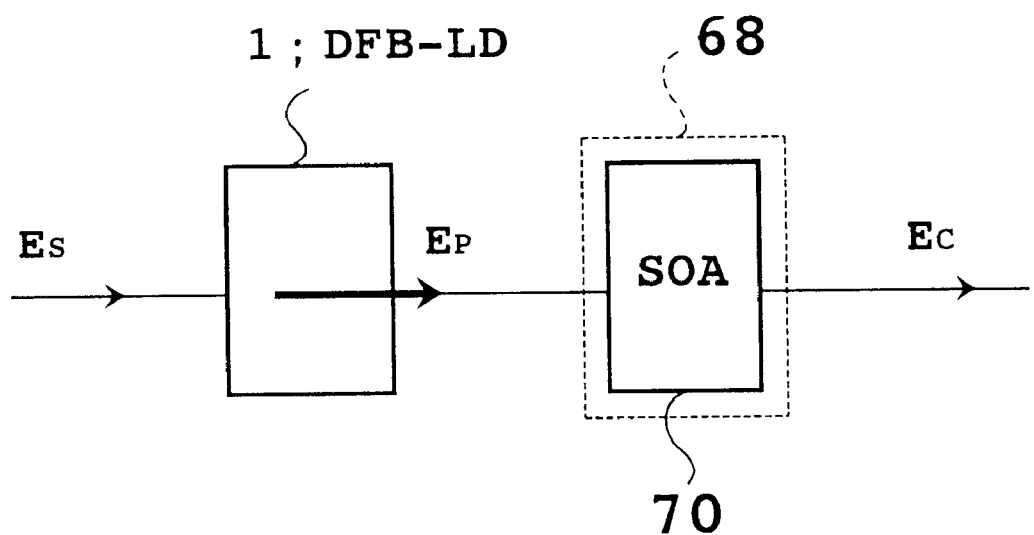
FIG. 15 is a diagram showing a first preferred embodiment of the phase conjugate light generator according to FIGS. 14A and 14B.

FIG. 15 is a view showing a first preferred embodiment of the phase conjugate light generator according to FIGS. 14A and 14B. In this preferred embodiment, a semiconductor optical amplifier (SOA) 70 is used as the nonlinear optical medium 68. The DFB laser diode 1 is being driven so as to generate pump light $E_p$, and signal light $E_s$ is supplied to the DFB laser diode 1. By the four-wave mixing based on the signal light $E_s$ and the pump light $E_p$ in the DFB laser diode 1, phase conjugate light $E_c$ is generated. The signal light $E_s$, the pump light $E_p$, and the phase conjugate light $E_c$ are output from the DFB laser diode 1, and then supplied to the SOA 70. In the SOA 70, the power of the phase conjugate light $E_c$ is enhanced by four-wave mixing, and the enhanced phase conjugate light $E_c$ is then output from the SOA 70.

Figure 16:
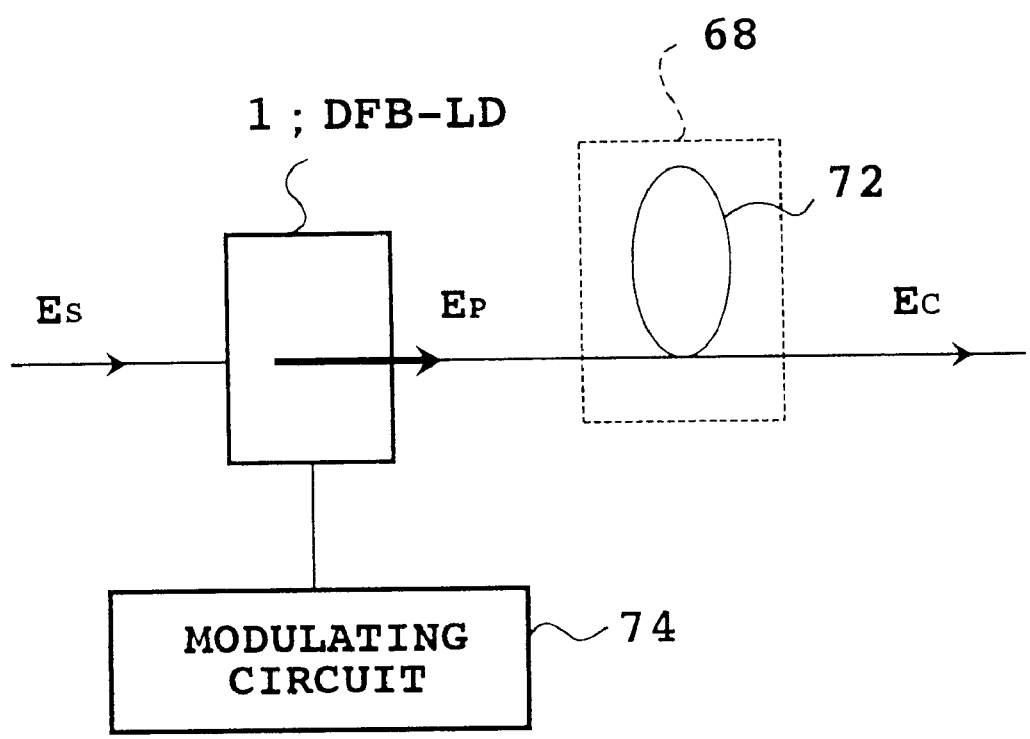
FIG. 16 is a diagram showing a second preferred embodiment of the phase conjugate light generator according to FIGS. 14A and 14B.

Referring to FIG. 16, there is shown a second preferred embodiment of the phase conjugate light generator according to FIGS. 14A and 14B. In this preferred embodiment, an optical fiber 72 is used as the nonlinear optical medium 68. A single-mode fiber is preferable as the optical fiber 72, and it is effective to make the zero-dispersion wavelength of the optical fiber 72 substantially coincide with the wavelength of pump light, so as to improve the conversion efficiency. For example, in the case that the wavelength of pump light falls in a band of 1.5 $\mu m$, the zero-dispersion wavelength of the optical fiber 72 can be made to coincide with the wavelength of pump light by using a dispersion-shifted fiber (DSF) as the optical fiber.

When the power of the signal light $E_s$, the pump light $E_p$, or the phase conjugate light $E_c$ to be supplied to the optical fiber 72 exceeds a threshold value of stimulated Brillouin scattering (SBS) in the optical fiber 72, the conversion efficiency is reduced to cause a decrease in power of the phase conjugate light to be obtained. The effect of the SBS may be suppressed by frequency modulation or phase modulation of the pump light $E_p$ or the signal light $E_s$. To this end, a modulating circuit 74 is connected to the DFB laser diode 1 in this preferred embodiment. A modulation rate of hundreds of KHz or less is sufficient, and in the case that a signal rate of signal light is on the order of Gb/s or more, there is no problem of degradation in transmission quality due to the modulation. The modulating circuit 74 superimposes a low-frequency signal corresponding to the modulation rate on a current to be supplied to any one of the electrodes 21a, 21b, and 21c shown in FIG. 4, for example. Since the DFB laser diode 1 shown in FIG. 4 has a high efficiency of frequency modulation, the effect of the SBS can be easily suppressed (S. Ogita, Y. Kotani, M. Matsuda, Y. Kuwahara, H. Onaka, H. Miyata, and H. Ishikawa, "FM response of narrow-linewidth, multielectrode $\lambda$/4 shift DFB laser", IEEE Photon. Technol. Lett., Vol. 2, pp. 165–166, 1990).

Various applications of the present invention to an optical communication system will now be described.

Figure 17:
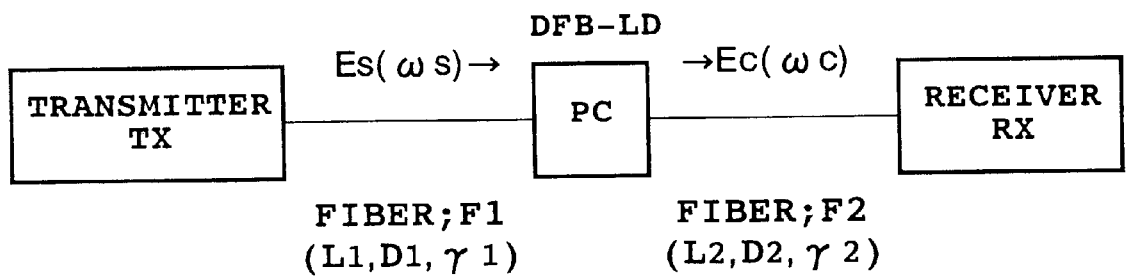
FIG. 17 is a block diagram of an optical communication system showing an application of the present invention.

FIG. 17 shows an applied system capable of compensating for waveform distortion due to chromatic dispersion and nonlinear optical Kerr effect in a transmission optical fiber. While this applied system is disclosed in the above-mentioned applications by the present inventor (Japanese Patent Application Nos. 6-509844, 7-44574, and 7-304229, and Japanese Patent Laid-open Nos. 7-98464 and 7-301830), this system will be described below.

Signal light $E_s$ output from a transmitter (TX) is transmitted by a first optical fiber F1 (length $L_1$, dispersion $D_1$, and nonlinear coefficient $\gamma_1$), and thereafter input into a phase conjugate light generator (PC). The signal light $E_s$ is converted into phase conjugate light $E_c$ in the PC, and the converted phase conjugate light $E_c$ is next transmitted by a second optical fiber F2 (length $L_2$, dispersion $D_2$, and nonlinear coefficient $\gamma_2$) to a receiver (RX). In the receiver, the phase conjugate light $E_c$ is received by a photodetector to detect a signal. As a modulation method for a transmission signal, various methods including optical amplitude (intensity) modulation, frequency modulation, and phase modulation may be applied. As a method for signal detection, optical direct detection or optical heterodyne detection after extraction of the phase conjugate light by a band-pass filter may be considered. The optical fiber used herein is a single-mode silica fiber (SMF) in many cases, and typical examples of the silica fiber are a 1.3-μm zero-dispersion optical fiber and a 1.55-μm dispersion-shifted fiber (DSF) which are generally used in optical communication. Further, the signal light may be a plurality of wavelength-division multiplexed optical signals having different wavelengths.

To compensate waveform distortion due to chromatic dispersion and self-phase modulation in the optical fiber in the system shown in FIG. 17, the magnitudes of dispersion and nonlinear effect at corresponding portions on the opposite sides of the PC may be made equal. The corresponding portions herein mean two portions where cumulative values of dispersion or optical Kerr effect measured from the PC become equal to each other. That is, if the transmission line is divided into sections, it is necessary to make equal the magnitudes of dispersion and nonlinear effect at two sections symmetrical with respect to the PC. This also shows that dispersion values in the sections are to be made equal and that the following equation is to hold in the sections.

$$D_1/\gamma_1\, P_1 = D_2/\gamma_2\, P_2 \tag{1a}$$

where $P_1$ and $P_2$ are the optical powers in the sections, and $\gamma_j$ represents the nonlinear coefficient of optical Kerr effect in the optical fiber.

$$\gamma_j = \omega n_{2j}/c A_{\mathit{effj}} \tag{2a}$$

where ω represents the optical angular frequency, c represents the velocity of light in the vacuum, and $n_{2j}$ and $A_{\mathit{effj}}$ represent the nonlinear refractive index and the effective core sectional area of an optical fiber Fj (j=1, 2), respectively.

To compensate for a decrease in nonlinear effect due to loss along the transmission line, either the dispersion may be decreased or the optical Kerr effect may be increased. Changing a dispersion value is allowed by designing of an optical fiber, which is a promising method. For example, this method is widely conducted at present by changing the zero-dispersion wavelength of a dispersion-shifted fiber or by changing the specific difference in refractive index between the core and the clad of an optical fiber or the core diameter in an optical fiber. On the other hand, changing the optical Kerr effect is allowed by changing a nonlinear refractive index or an optical intensity. By configuring a system from a dispersion decreasing DCF (DD-DCF) having a structure such that a dispersion value in a dispersion compensation fiber is decreased in the longitudinal direction in proportion to a change in optical Kerr effect and a transmission line by a normal-dispersion DSF, it is possible to attain high-speed long-haul transmission.

In long-haul transmission using an optical amplifier, it is known that the use of a normal-dispersion fiber is effective to suppression of nonlinear distortion (modulation instability) due to noise light from the optical amplifier. Therefore, the above configuration is promising.

As another compensation method unlike the above-mentioned exact compensation method, the approximation using average powers as expressed below holds in the case that the change in optical Kerr effect is not so large (e.g., the case where the repeater spacing of optical amplifiers is sufficiently shorter than a nonlinear length).

$$D_1'L_1 = D_2'L_2 \tag{3a}$$

$$\gamma_1 P_1'L_1 = \gamma_2 P_2'L_2 \tag{4a}$$

where $P_1'$ and $P_2'$ represent the average powers in optical fibers Fj (j=1, 2), respectively, and $D_1'$ and $D_2'$ represent the average dispersions in the optical fibers Fj, respectively.

Further, although the ideal condition equation (1a) for waveform compensation is not satisfied, a dispersion compensation by location of dispersion of opposite sign may be suitably provided in the transmission line. This method is effective especially in long-haul transmission such as submarine transmission. The reason will be described below. In compensation using a PC, it is necessary to make equal the waveform distortions in optical fibers on the opposite sides of the PC. The waveform is most distorted just before and just after the PC. Accordingly, at the position of the PC, the spectrum of an optical pulse is most expanded. Meanwhile, noises are added from the PC and the optical amplifiers in the transmission line. The wider the spectrum, the larger the S/N degradation due to the noises. Accordingly, it is effective to design the system so that the spectrum broadening on the opposite sides of the PC is reduced, in order to extend a transmission distance. In this respect, it is effective to reduce a total dispersion value in the transmission line by dispersion compensation in the transmission line.

Figure 18:
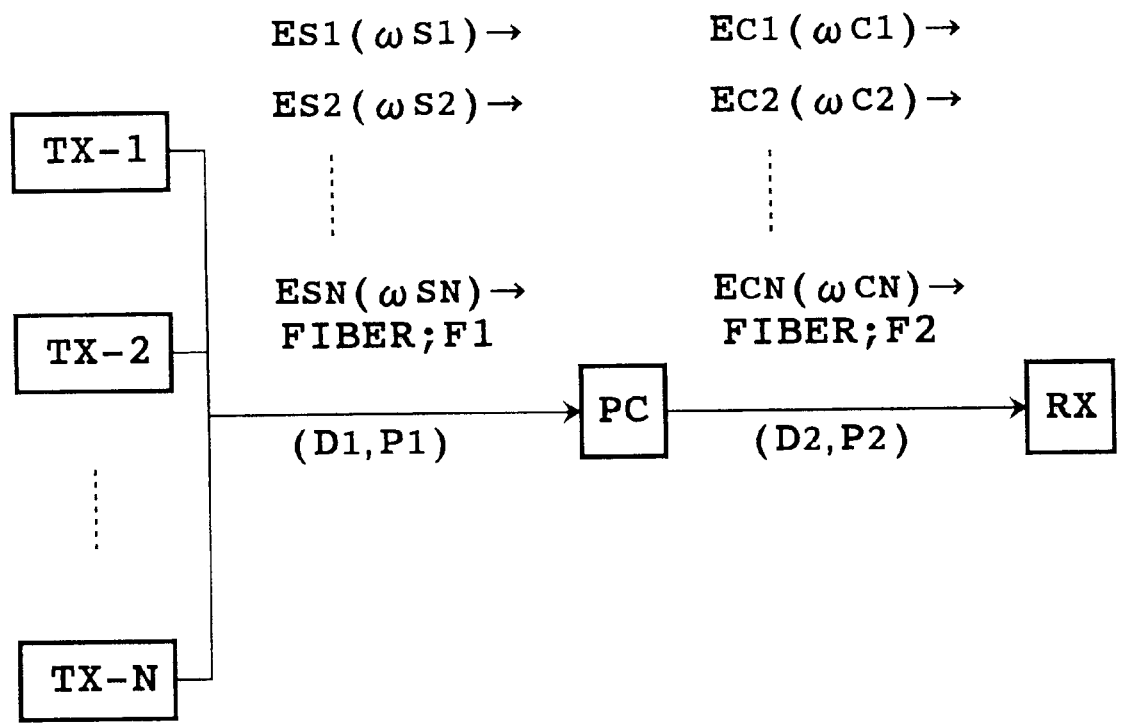
FIG. 18 is a diagram showing a first application of the present invention to a wavelength-division multiplexing transmission system.

FIG. 18 shows a first application of the present invention to a wavelength-division multiplexing (WDM) transmission system. N channels of wavelength-division multiplexed signal light beams $E_{s1}$ to $E_{sN}$ (frequencies: $\omega_{s1}$ to $\omega_{sN}$) are transmitted by an optical fiber F1, and then converted into N channels of wavelength-division multiplexed phase conjugate light beams $E_{c1}$ to $E_{cN}$ (frequencies: $\omega_{c1}$ to $\omega_{cN}$) by a PC, which are next transmitted by an optical fiber F2 and next received.

Figure 19:
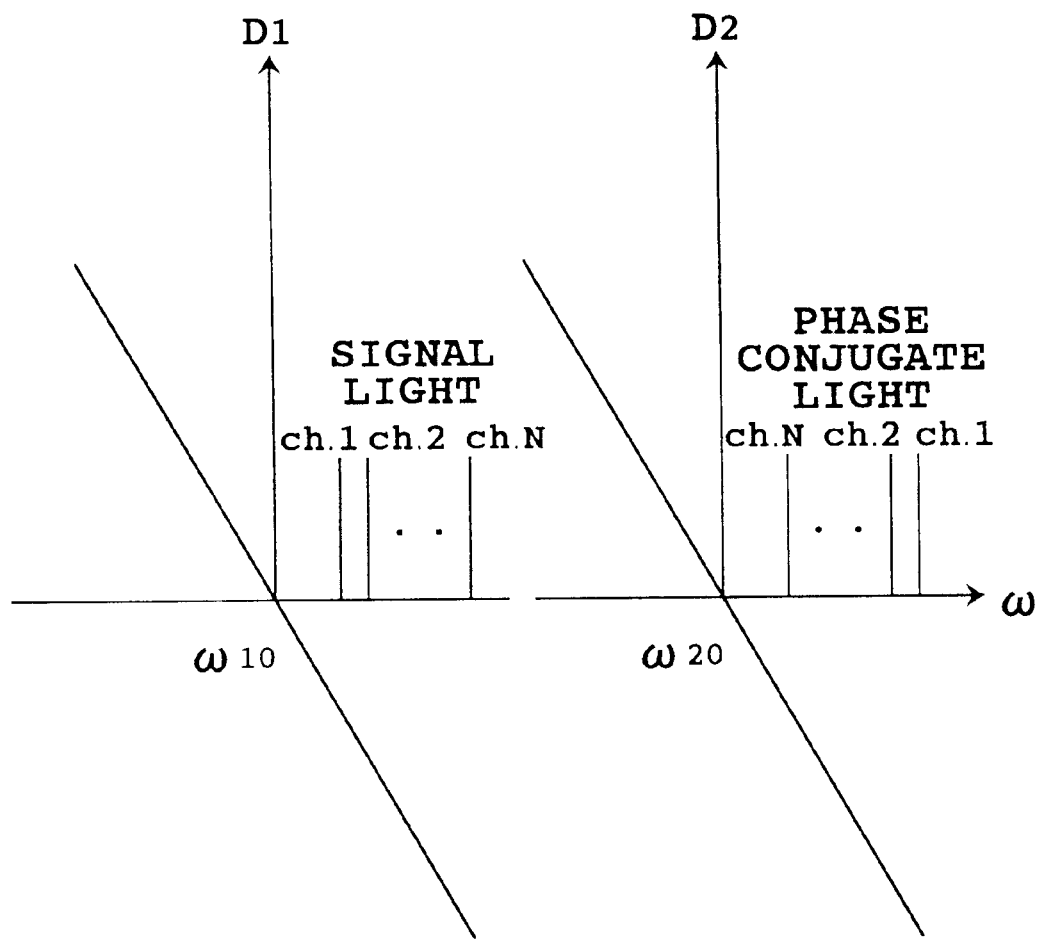
FIG. 19 is a diagram for illustrating frequency location in applying the present invention to the wavelength-division multiplexing transmission system.

In dispersion compensation by the PC, the signs of dispersion on the opposite sides of the PC must be the same. Therefore, the frequency location as shown in FIG. 19 is provided for zero dispersion. The zero-dispersion wavelengths of the optical fibers F1 and F2 are $\omega_{10}$ and $\omega_{20}$, respectively. FIG. 19 shows conversion from normal dispersion to normal dispersion. In this case, second-order dispersion (dispersion slope) is present in a usual transmission line, so that an absolute value of dispersion for the first channel (ch. 1) is minimum in the optical fiber F1, whereas an absolute value of dispersion for the Nth channel (ch. N) is minimum in the optical fiber F2. Accordingly, it is impossible to perform complete dispersion compensation simultaneously for all the channels.

Figure 20:
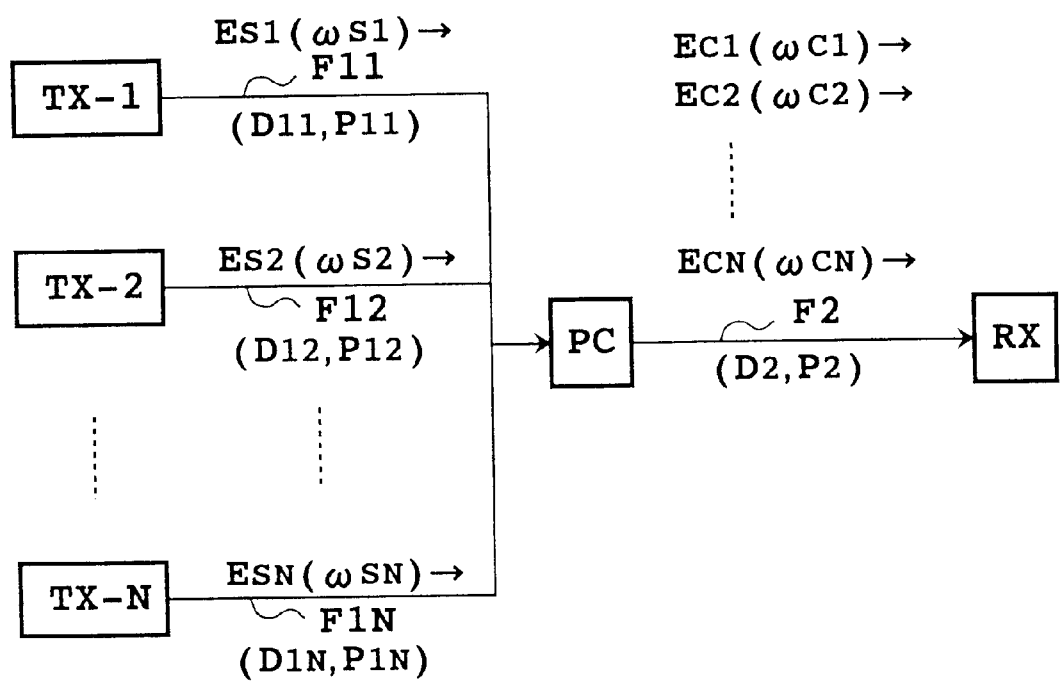
FIG. 20 is a diagram showing a second application of the present invention to the wavelength-division multiplexing transmission system.

To compensate dispersion for all the channels equally and ideally, the configuration is modified as shown in FIG. 20. FIG. 20 shows a second application of the present invention to a WDM system. N channels of signal light beams $E_{s1}$ to $E_{sN}$ are individually transmitted by different optical fibers F11 to F1N with different powers ($P_{11}$ to $P_{1N}$) corresponding to different dispersions. Output light beams from the optical fibers F11 to F1N are collectively converted into phase conjugate light beams $E_{c1}$ to $E_{cN}$ by one PC or separately converted by PC-1 to PC-M (M is integer satisfying 1<M≦N). Then, the phase conjugate light beams $E_{c1}$ to $E_{cN}$ are transmitted by a common optical fiber F2 and next received. In this case, dispersion and nonlinear effect in each channel are compensated by the above-mentioned method.

Figure 21:
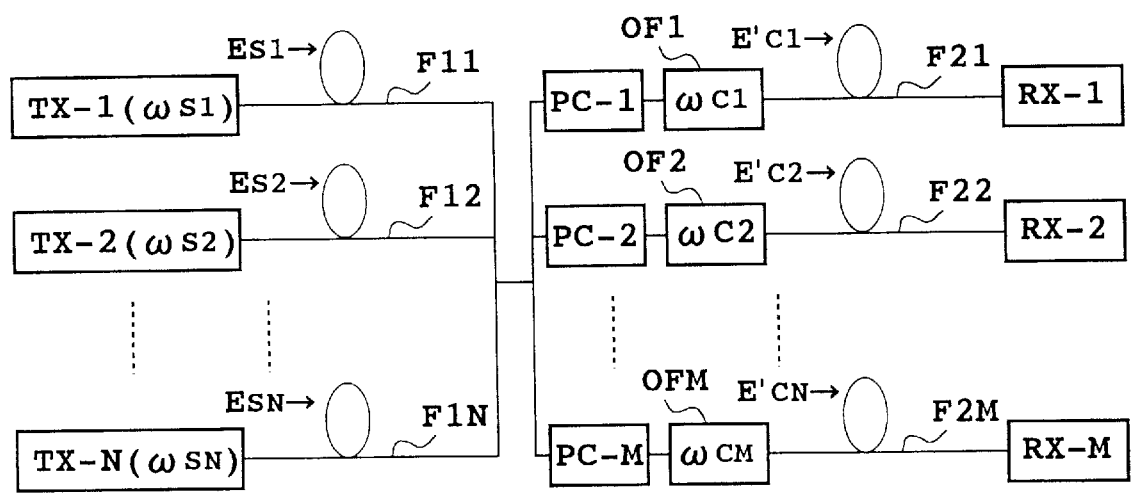
FIG. 21 is a diagram showing a third application of the present invention to the wavelength-division multiplexing transmission system.

FIG. 21 is a view showing a third application of the present invention to a WDM system. Transmitters TX-1 to TX-N output signal light beams $E_{s1}$ to $E_{sN}$ having different wavelengths (optical frequencies $\omega_{s1}$ to $\omega_{sN}$). These signal light beams are individually transmitted by a plurality of first optical fibers F11 to F1N, and next combined and divided by an optical multiplexer/demultiplexer such as a star coupler. The divided signal beams are supplied to phase conjugate light generators PC-1 to PC-M. Each of the phase conjugate light generators PC-1 to PC-M generates a phase conjugate light beam corresponding to at least one of the supplied signal light beams. The phase conjugate light beams generated are passed through optical filters OF1 to OFM, and then transmitted by a plurality of second optical fibers F21 to F2M to optical receivers RX-1 to RX-M, respectively. The phase conjugate light beams transmitted by the second optical fibers are shown by $E'_{c1}$ to $E'_{cN}$.

The first optical fibers F1j (j=1 to N) have lengths $L_{1j}$, dispersions $D_{1j}$, and nonlinear coefficients $\gamma_{1j}$. Further, the signal light beams have powers $P_{1j}$. On the other hand, the second optical fibers F2k (k=1 to M) have lengths $L_{2k}$, dispersions $D_{2k}$, and nonlinear coefficients $\gamma_{2k}$. Further, the phase conjugate light beams have powers $P_{2k}$. Each parameter is set so as to satisfy the following two conditions.

$$D_{1j}L_{1j}=D_{2k}L_{2k}=\text{(Constant)}$$

$$\gamma_{1j}P_{1j}/D_{1j}=\gamma_{2k}P_{2k}/D_{2k}=\text{(Constant)}$$

In the above conditions, the term of "Constant" includes the meaning that an average value in an arbitrary section of each fiber is constant.

The compensation of waveform distortion by each second optical fiber F2k is set so as to be optimized for the phase conjugate light beam passing through the band of the corresponding optical filter OFk. Further, the channel $E'_{ck}$ extracted by the combination of the phase conjugate light generator PC-k and the optical filter OFk corresponds to an arbitrary one channel of the signal light beams or a plurality of channels in the vicinity of this one channel, included in the band of the optical filter. For example, in the case that the transmitters TX-1 to TX-N and the fibers F11 to F1N are provided in a transmitting terminal, the dispersions or nonlinear effects in the fibers F1j are set equal. In this case, the combination of the phase conjugate light generators PC-k and the optical filter OFk for the fiber F2k is controlled so that the receiver RX-k can select a desired channel. Such control may be attained by wavelength control of pump light in each phase conjugate light generator and/or control of a pass center wavelength of each optical filter. To this end, it is preferable to apply a tunable optical filter.

In the case that the second optical fibers are used as a transmission line, this system functions as a distribution system. In the case that the second optical fibers are provided in a receiving terminal or a repeater, this system functions as a channel exchange (cross connect) system.

Figure 22:
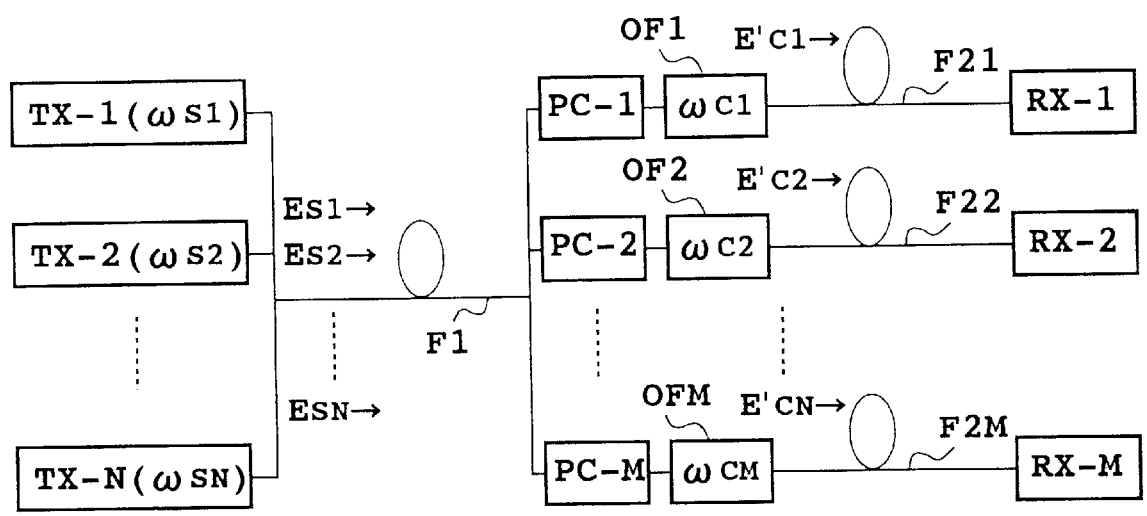
FIG. 22 is a diagram showing a fourth application of the present invention to the wavelength-division multiplexing transmission system.

FIG. 22 is a view showing a fourth application of the present invention to a WDM system. In contrast with FIG. 21, this system is characterized in that a first optical fiber F1 common to the plural optical transmitters TX-1 to TX-N is used. With this modification, an input end of the first optical fiber F1 is connected through an optical multiplexer to each optical transmitter TX-j, and an output end of the first optical fiber F1 is connected through an optical demultiplexer to each phase conjugate light generator. The dispersion in the common first optical fiber F1 is set substantially constant for all the channels. For example, the first optical fiber F1 can satisfy the above conditions by using the above-mentioned DD-DCF, a dispersion shifted fiber having a large dispersion, a 1.3-μm zero-dispersion fiber for signal light having a wavelength band of 1.55 μm, or a 1.55-μm zero-dispersion fiber for signal light having a wavelength band of 1.3 μm. Each second optical fiber F2k satisfies the above conditions in relation to the common first optical fiber F1, thereby obtaining an optimum receiving condition in each channel.

Figure 23:
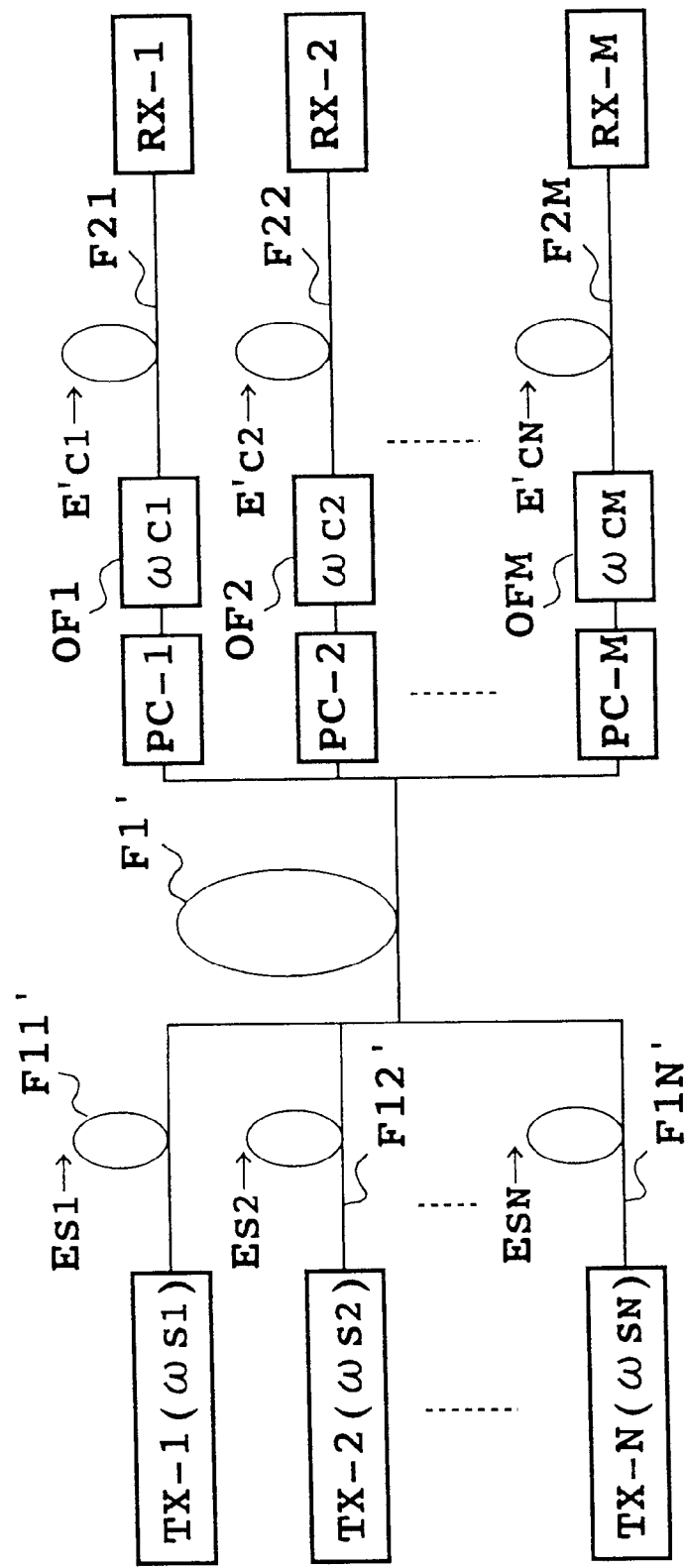
FIG. 23 is a diagram showing a fifth application of the present invention to the wavelength-division multiplexing transmission system.

FIG. 23 is a view showing a fifth application of the present invention to a WDM system. In this system, the first optical fiber is configured by combining N optical fibers F11' to F1N' each having a relatively large dispersion and a common optical fiber F1' having a relatively small dispersion. The optical fibers F11' to F1N' and the optical fiber F1' are connected by an optical multiplexer, and the optical fiber F1' and each phase conjugate light generator PC-k are connected by an optical demultiplexer.

Also in this system, the first optical fiber and the second optical fiber satisfy given conditions to thereby allow good compensation for waveform distortion in each channel, thus obtaining an optimum receiving condition.

Figure 24:
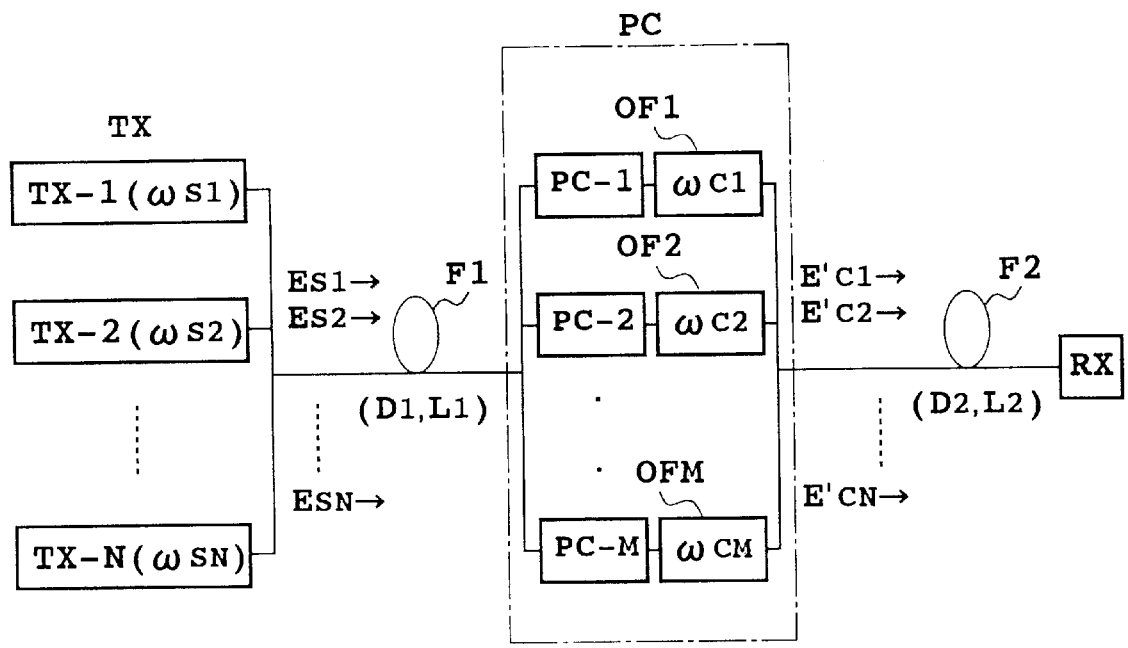
FIG. 24 is a diagram showing a sixth application of the present invention to the wavelength-division multiplexing transmission system.

FIG. 24 shows a configuration of a wavelength-division multiplexing transmission system integrating these functions. A plurality of wavelength-division multiplexed signals are transmitted by a first optical fiber, and next divided. Then, the divided signals are converted into phase conjugate light beams having optimum wavelengths for all the channels, and next extracted. The phase conjugate light beams extracted are next combined and transmitted by a second optical fiber to a receiver. According to this configuration, waveform distortion in all the channels can be completely compensated even when second-order dispersion is present in a transmission line.

Figure 25:
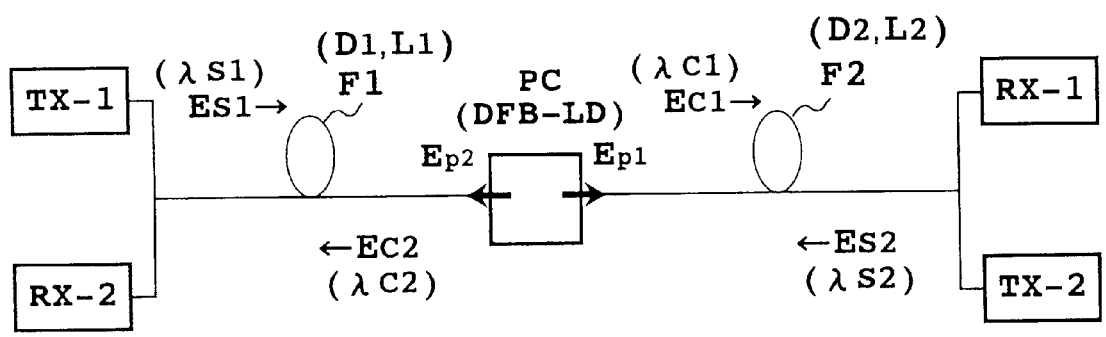
FIG. 25 is a diagram showing an application of the present invention to a bidirectional transmission system.

FIG. 25 shows an application of the present invention to a bidirectional optical transmission system. Signal light $E_{s1}$ having a wavelength $\lambda_{s1}$ from a TX-1 in a first terminal is transmitted by an optical fiber F1, and next converted into phase conjugate light $E_{c1}$ having a wavelength $\lambda_{c1}$ by using pump light $E_{p1}$ having the same direction as that of the signal light $E_{s1}$ in a DFB-LD as a PC. Then, the phase conjugate light $E_{c1}$ is transmitted by an optical fiber F2 and next received by an RX-1 in a second terminal. On the other hand, signal light $E_{s2}$ having a wavelength $\lambda_{s2}$ from a TX-2 in the second terminal is transmitted by the optical fiber F2, and next converted into phase conjugate light $E_{c2}$ having a wavelength $\lambda_{c2}$ by using pump light $E_{p2}$ having the same direction as that of the signal light $E_{s2}$ in the DFB-LD. Then, the phase conjugate light $E_{c2}$ is transmitted by the optical fiber F1 and next received by an RX-2 in the first terminal. The wavelengths of the signals transmitted by the optical fiber F1 and the optical fiber F2 preferably fall in a pass band of a band-pass filter used in each transmission line. That is, $\lambda_{s1}$ and $\lambda_{c2}$ are set to fall in the same pass band, and $\lambda_{c1}$ and $\lambda_{s2}$ are set to fall in the same pass band. In this case, each signal may be wavelength-division multiplexed signal light.

There will now be described an application of the present invention to a lightwave network using a phase conjugate light generator.

Figure 26:
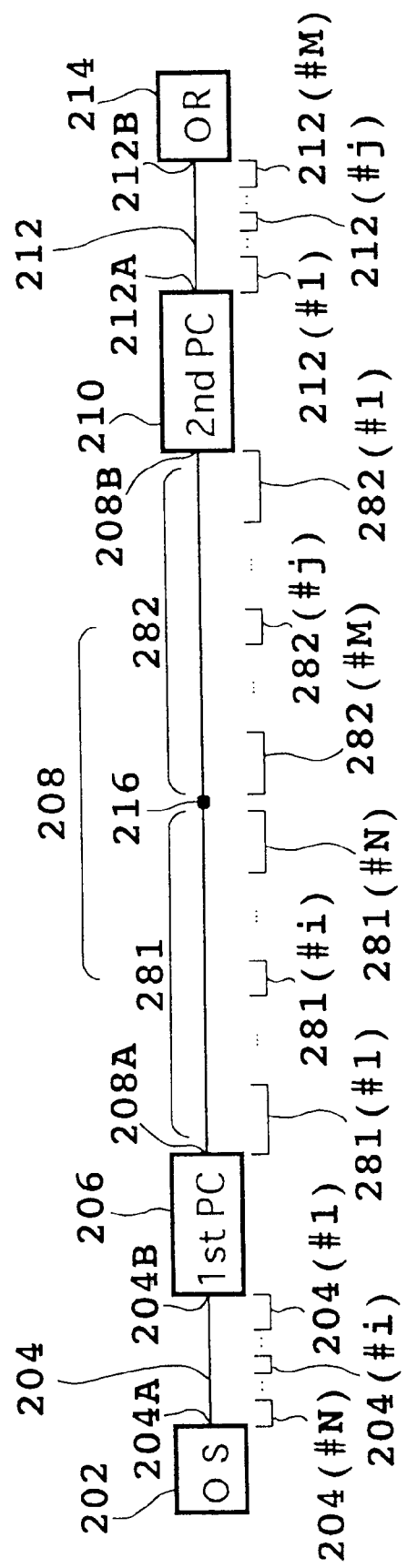
FIG. 26 is a diagram illustrating a basic principle of a lightwave network according to the present invention.

FIG. 26 is a view for illustrating the principle of a lightwave network. An optical sender (OS) 202 outputs a signal beam. A first optical fiber 204 has a first end 204A and a second end 204B respectively corresponding to an input end and an output end of the signal beam. A first phase conjugate light generator (1st PC) 206 is operatively connected to the second end 204B. The first phase conjugate light generator 206 converts the signal beam supplied from the first optical fiber 204 into a first phase conjugate light beam and outputs the first phase conjugate light beam. A second optical fiber 208 has a third end 208A and a fourth end 208B respectively corresponding to an input end and an output end of the first phase conjugate light beam. A second phase conjugate light generator (2nd PC) 210 is operatively connected to the fourth end 208B. The second phase conjugate light generator 210 converts the first phase conjugate light beam supplied from the second optical fiber 208 into a second phase conjugate light beam and outputs the second phase conjugate light beam. A third optical fiber 212 has a fifth end 212A and a sixth end 212B respectively corresponding to an input end and an output end of the second phase conjugate light beam. An optical receiver (OR) 214 is provided to receive the second phase conjugate light beam transmitted by the third optical fiber 212.

A system middle point 216 is set in the second optical fiber 208. The system middle point 216 will be defined later. The second optical fiber 208 is composed of a first part 281 between the third end 208A and the system middle point 216, and a second part 282 between the system middle point 216 and the fourth end 208B.

In the present invention, each parameter in the optical fibers 204, 208, and 212 is set in the following manner.

First, the first optical fiber 204 is virtually divided into N (N is an integer greater than 1) sections 204 (#1 to #N), and the first part 281 of the second optical fiber 208 is also virtually divided into N sections 281 (#1 to #N). In two corresponding numbered sections of the first optical fiber 204 and the first part 281 as counted from the first phase conjugate light generator 206, the product of the average value of chromatic dispersions and the section length in one of the two sections is set substantially equal to the product of the average value of chromatic dispersions and the section length in the other section. That is, letting $D_{1i}$ and $L_{1i}$ denote the average value of chromatic dispersions (or dispersion parameters) and the section length, respectively, in an i-th ($1 \leq i \leq N$) section 204 (#i) of the first optical fiber 204 as counted from the first phase conjugate light generator 206, and letting $D_{2i}$ and $L_{2i}$ denote the average value of chromatic dispersions (or dispersion parameters) and the section length, respectively, in an i-th section 281 (#i) of the first part 281 of the second optical fiber 208 as counted from the first phase conjugate light generator 206, the following relation is satisfied.

$$D_{1i}L_{1i} = D_{2i}L_{2i} \quad (1)$$

Further, letting $P_{1i}$ and $\gamma_{1i}$ denote the average value of optical powers and the average value of nonlinear coefficients in the section 204 (#i), respectively, and letting $P_{2i}$ and $\gamma_{2i}$ denote the average value of optical powers and the average value of nonlinear coefficients in the section 281 (#i), respectively, the following relation is satisfied.

$$P_{1i}\gamma_{1i}L_{1i} = P_{2i}\gamma_{2i}L_{2i} \quad (2)$$

On the other hand, the second part 282 of the second optical fiber 208 is virtually divided into M (M is an integer greater than 1) sections 282 (#1 to #M), and the third optical fiber 212 is also virtually divided into M sections 212 (#1 to #M). Letting $D_{3j}$ and $L_{3j}$ denote the average value of chromatic dispersions and the section length, respectively, in a j-th ($1 \leq j \leq M$) section 282 (#j) of the second part 282 of the second optical fiber 208 as counted from the second phase conjugate light generator 210, and letting $D_{4j}$ and $L_{4j}$ denote the average value of chromatic dispersions and the section length, respectively, in a j-th section 212 (#j) of the third optical fiber 212 as counted from the second phase conjugate light generator 210, the following relation is satisfied.

$$D_{3j}L_{3j} = D_{4j}L_{4j} \quad (3)$$

Further, letting $P_{3j}$ and $\gamma_{3j}$ denote the average value of optical powers and the average value of nonlinear coefficients in the section 282 (#j), respectively, and letting $P_{4j}$ and $\gamma_{4j}$ denote the average value of optical powers and the average value of nonlinear coefficients in the section 212 (#j), respectively, the following relation is satisfied.

$$P_{3j}\gamma_{3j}L_{3j} = P_{4j}\gamma_{4j}L_{4j} \quad (4)$$

In the system shown in FIG. 26, waveform distortion is once increased just before and just after the first phase conjugate light generator 206. However, chromatic dispersion and nonlinearity are compensated at the system middle point 216 by the conditions of Eqs. (1) and (2) to once restore an original waveform. The restored waveform is distorted again just before and just after the second phase conjugate light generator 210. However, chromatic dispersion and nonlinearity are compensated in the optical receiver 214 by the conditions of Eq. (3) and (4) to restore the original waveform.

The configuration shown in FIG. 26 is tolerant to a set error of a parameter such as a length of the second optical fiber 208 which is possibly laid on a sea bed or the like. That is, even if the original waveform is not completely restored at the system middle point 216, this incompleteness can be regenerated in the second part 282, the second phase conjugate light generator 210, and the third optical fiber 212, thereby completely restoring the original waveform in the optical receiver 214.

Figure 27:
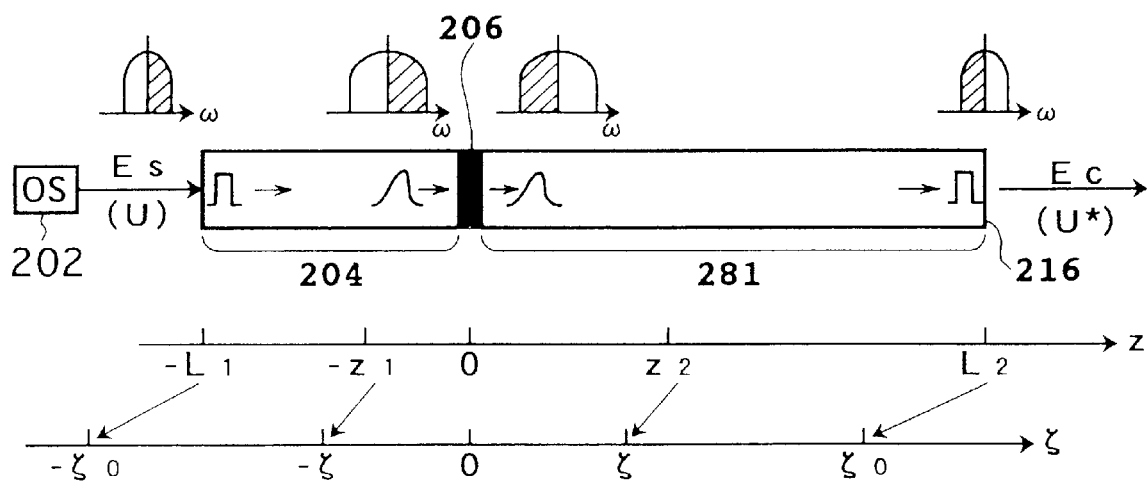
FIG. 27 is a diagram illustrating a principle of compensation in FIG. 26.

Referring to FIG. 27, there is shown the principle of compensation for chromatic dispersion and nonlinearity. This principle of compensation applies also to FIG. 17 and the others. In FIG. 27, the principle of compensation in a path from the optical sender 202 to the system middle point 216 will be described. Prior to description with reference to FIG. 27, a general item on a phase conjugate wave will now be described.

The propagation of an optical signal E (x, y, z, t)=F(x, y) φ (z, t)exp[i(ωt−kz)] in optical fiber transmission can be generally described by the following nonlinear wave equation. In the above expression, F(x, y) represents a transverse mode distribution, and φ (z, t) represents a complex envelope of light. It is assumed that φ (z, t) varies enough slower than a frequency of light.

$$i\frac{\partial \phi}{\partial z} - (1/2)\beta_2 \frac{\partial^2 \phi}{\partial T^2} + \gamma|\phi|^2\phi = -(i/2)\alpha\phi \quad (5)$$

where T=t−$\beta_1$z ($\beta_1$ is the propagation constant), α is the loss in a fiber, and $\beta_2$ is the chromatic dispersion in a fiber.

$$\gamma = \omega n_2 / c A_{eff} \quad (6)$$

represents a third-order nonlinear coefficient (coefficient of optical Kerr effect). In Eq. (6), $n_2$ and $A_{eff}$ represent the nonlinear refractive index and the effective core sectional area of a fiber, respectively, and c is the velocity of light in the vacuum. In this discussion, dispersion of a first order or less is considered, and dispersion of higher orders is omitted. Further, it is assumed that α, β and γ are functions of z, that is, expressed as α(z), β(z), and γ(z), respectively. Further, it is assumed that the position of a phase conjugate light generator is defined as an origin (z=0).

The following normalized function is now introduced.

$$\phi(z, T) = A(z)u(z, T) \tag{7}$$

where, $$A(z) \equiv A(0)\exp[-(\frac{1}{2}) \int_0^z \alpha(z)dz] \tag{8}$$

represents an amplitude, which indicates that the transmission line has loss in the case of $\alpha(z) > 0$, whereas the transmission line has gain in the case of $\alpha(z) < 0$. $A(z) \equiv A(0)$ indicates that no loss is present. Further, $A(z)^2 = P(z)$ corresponds to optical power. By inserting Eqs. (7) and (8) into Eq. (5), the following evolution equation is given.

$$i\frac{\partial u}{\partial z} = (1/2)\beta_2(z)\frac{\partial^2 \phi}{\partial T^2} - \gamma(z)A(z)^2|u|^2 u \tag{9}$$

The following transformation is now made.

$$\zeta = \int_0^z |\beta_2(z)|dz \tag{10}$$

As a result, Eq. (9) can be transformed as follows:

$$i\frac{\partial u}{\partial \zeta} = \frac{\text{sgn}[\beta_2]}{2}\frac{\partial^2 u}{\partial T^2} - \frac{\gamma(\zeta)A(\zeta)^2}{|\beta_2(\zeta)|}|u|^2 u \tag{11}$$

where $\text{sgn}[\beta_2] \equiv \pm 1$ takes +1 in the case of $\beta_2 > 0$, i.e., normal dispersion, whereas it takes −1 in the case of $\beta_2 < 0$, i.e., anomalous dispersion. If Eq. (11) holds, a complex conjugation thereof also holds to given the following equation.

$$-i\frac{\partial u^*}{\partial \zeta} = \frac{\text{sgn}[\beta_2]}{2}\frac{\partial^2 u^*}{\partial T^2} - \frac{\gamma(\zeta)A(\zeta)^2}{|\beta_2(\zeta)|}|u^*|^2 u^* \tag{12}$$

Complex phase conjugate light $u^*$ follows the same evolution equation as that for u. However, a propagation direction is reversed. This operation is correctly the operation of a phase conjugator. Particularly in a transmission type phase conjugator, the above description is equivalent to reversing the phase shift by chromatic dispersion and SPM.

In FIG. 27, the length of the first optical fiber 204 is denoted by $L_1$, and the length of the first part 281 of the second optical fiber 208 is denoted by $L_2$. The phase conjugate light generator 206 is located at the origin $z=0$ ($\zeta=0$) of z coordinates and $\zeta$ coordinates. The z coordinate and the $\zeta$ coordinate of the system middle point 216 are shown by $L_2$ and $\zeta_0$, respectively. In the first optical fiber 204, a signal beam u (Es) propagates in accordance with the evolution equation (11). The signal beam u is converted into a phase conjugate beam $u^*$ (Ec) by the phase conjugate light generator 206. The phase conjugate beam u propagates in accordance with the evolution equation (12) in the first part 281 of the second optical fiber 208.

In a normalized distance $d\zeta$ at two arbitrary points $-\zeta$ and $\zeta$ symmetrical with respect to the position ($\zeta=0$) of the phase conjugate light generator 206 on the $\zeta$ axis, the value of each parameter is set so that the coefficients of the first and second terms on the right side of Eq. (11) are equal to each other, thereby obtaining the result that $u^*$ at $\zeta$ becomes a phase conjugate wave of u at $-\zeta$. That is, the following two equations are the conditions.

$$\text{sgn}[\beta_2(-\zeta)] = \text{sgn}[\beta_2(\zeta)] \tag{13}$$

$$\frac{\gamma(-\zeta)A(-\zeta)^2}{|\beta_2(-\zeta)|} = \frac{\gamma(\zeta)A(\zeta)^2}{|\beta_2(\zeta)|} \tag{14}$$

Eq. (13) shows that the signs of dispersions in the first optical fiber 204 and the first part 281 must be equal to each other. In considering $\gamma > 0$ and $A(z)^2 > 0$ in the fiber, the above conditions can be summarized as follows:

$$\frac{\gamma(-\zeta)A(-\zeta)^2}{\beta_2(-\zeta)} = \frac{\gamma(\zeta)A(\zeta)^2}{\beta_2(\zeta)} \tag{15}$$

The phase shift due to chromatic dispersion and SPM at ($-\zeta$) in the first optical fiber 204 is reversed in sign by the phase conjugate light generator 206. Accordingly, waveform distortion due to this phase shift is compensated for by distortion due to the phase shift at ($\zeta$) in the first part 281. By repeating the compensation by the above setting in every section, it is possible to perform the compensation over the entire length.

The above compensation condition will now be described by z coordinates. From Eq. (15), the following equation is given.

$$\frac{\gamma(-z_1)A(-z_1)^2}{\beta_2(-z_1)} = \frac{\gamma(z_2)A(z_2)^2}{\beta_2(z_2)} \tag{16}$$

That is, the condition is to equalize the ratio of chromatic dispersion to the product of nonlinear coefficient and optical power in each section. In Eq. (16), $-z_1$ and $z_2$ are two points satisfying the following equation.

$$\int_0^{-z_1} |\beta_2(z)|dz = -\int_0^{z_2} |\beta_2(z)|dz \tag{17}$$

From Eqs. (16) and (17), Eqs. (18) and (19) shown below are given.

$$\beta_2(-z_1) \, dz_1 = \beta_2(z_2) \, dz_2 \tag{18}$$

$$\gamma(-z_1)A(-z_1)^2 dz_1 = \gamma(z_2)A(z_2)^2 dz_2 \tag{19}$$

where $dz_1$ and $dz_2$ are the lengths of small sections at $-z_1$ and $z_2$, respectively. Each section length is in inverse proportion to a dispersion or the product of nonlinear coefficient and optical power in the section. In considering the relation of a dispersion $\beta_2$ and a dispersion parameter D, i.e., $D = -(2\pi c/\lambda^2)\beta_2$, the following relations are obtained from Eqs. (18) and (19). D is a function of z, and it is also shown by D(z).

$$D(-z_1)dz_1 = D(z_2)dz_2 \tag{20}$$

$$\gamma(-z_1)P(-z_1)dz_1 = \gamma(z_2)P(z_2)dz_2 \tag{21}$$

It is understood that the compensation condition is to equalize an increment of each of the dispersion and the nonlinearity at one of two positions symmetrical with respect to the phase conjugate light generator 206 and a decrement at the other position. Eqs. (20) and (21) are necessary conditions for compensation, and show that the total amounts of dispersion in two corresponding sections are equal and that the total amounts of optical Kerr effect in two corresponding sections are equal. That is, the effectiveness of the conditions of Eqs. (1) to (4) has been confirmed.

Particularly in the case that α, D, and γ are constant and variations in power are small, the following equations are given by integrating Eqs. (20) and (21).

$$D_1 L_1 = D_2 L_2 \quad (22)$$

$$\gamma_1 P_1 L_1 = \gamma_2 P_2 L_2 \quad (23)$$

where $P_1$ and $P_2$ are the average powers in the first optical fiber 204 and the first part 281, respectively; $D_1$ and $\gamma_1$ are the average value of dispersion parameters and the average value of nonlinear coefficients in the first optical fiber 204, respectively; and $D_2$ and $\gamma_2$ are the average value of dispersion parameters and the average value of nonlinear coefficients in the first part 281, respectively. Eqs. (22) and (23) accord with the conditions in dispersion compensation and SPM compensation by average approximation.

Practically, the present invention may be embodied by satisfying only the condition of Eq. (22). That is, according to the present invention, there is provided an optical fiber communication system comprising a first optical fiber having a first end and a second end respectively corresponding to an input end and an output end of a signal beam, a phase conjugate light generator operatively connected to the second end for converting the signal beam into a phase conjugate beam and outputting the phase conjugate beam, and a second optical fiber having a third end and a fourth end respectively corresponding to an input end and an output end of the phase conjugate beam, wherein the product of an average chromatic dispersion and a length of the first optical fiber is substantially equal to the product of an average chromatic dispersion and a length of the second optical fiber.

Preferably, to satisfy the condition of Eq. (23), the product of an average optical power, an average nonlinear coefficient in the first optical fiber, and a length of the first optical fiber is substantially equal to the product of an average optical power, an average nonlinear coefficient in the second optical fiber, and a length of the second optical fiber.

In the case that a plurality of optical amplifiers are provided on an optical path including the first and second optical fibers, it is preferable to set a spacing between two adjacent ones of the plural amplifiers shorter than a nonlinear length of the optical path (optical fiber).

In FIG. 27, there is shown the principle of compensation on the upstream side of the system middle point 216. The principle of compensation on the downstream side of the system middle point 216 can be similarly understood, so the description thereof will be omitted herein.

In the description with reference to FIG. 27, the normalized coordinates are defined by cumulative values of chromatic dispersions from the phase conjugate light generator 206 as shown by Eq. (10). As a result, the required condition is that the ratio between a chromatic dispersion and the product of an optical power and a nonlinear coefficient at one of two points on the first optical fiber 204 and the first part 281 giving equal cumulative values of chromatic dispersions from the phase conjugate light generator 206 is substantially equal to the ratio between a chromatic dispersion and the product of an optical power and a nonlinear coefficient at the other point.

In FIG. 27, the normalized coordinates may be defined by cumulative values of nonlinear effects (i.e., cumulative values of the products of optical powers and nonlinear coefficients) from the phase conjugate light generator 206. In this case, the required condition is that the ratio between a chromatic dispersion and the product of an optical power and a nonlinear coefficient at one of two points on the first optical fiber 204 and the first part 281 giving equal cumulative values of nonlinear effects from the phase conjugate light generator 206 is substantially equal to the ratio of a chromatic dispersion and the product of an optical power and a nonlinear coefficient at the other point.

As described above, by setting the total amounts of dispersion in the first and second optical fibers equal to each other and setting the total amounts of optical Kerr effect in the first and second optical fibers equal to each other, compensation is made by the phase conjugate light generator so that the waveform of an optical pulse input into the first optical fiber and the waveform of an optical pulse output from the second optical fiber have substantially the same shape. That is, the waveforms of optical pulses having substantially the same shape can be obtained on the optical pulse sending side (the input end of the first optical fiber) and the optical pulse receiving side (the output end of the second optical fiber). Accordingly, by providing an optical ADM (Add Drop Multiplexer) at each of the input end and the output end, an optical pulse can be received in substantially the same state as that of a sent optical pulse in each optical ADM. Accordingly, in each ADM, it is possible to eliminate the need for regeneration (waveform shaping and timing regeneration) of the received optical pulse. There will now be described a so-called lightwave network applying this principle.

Figure 28:
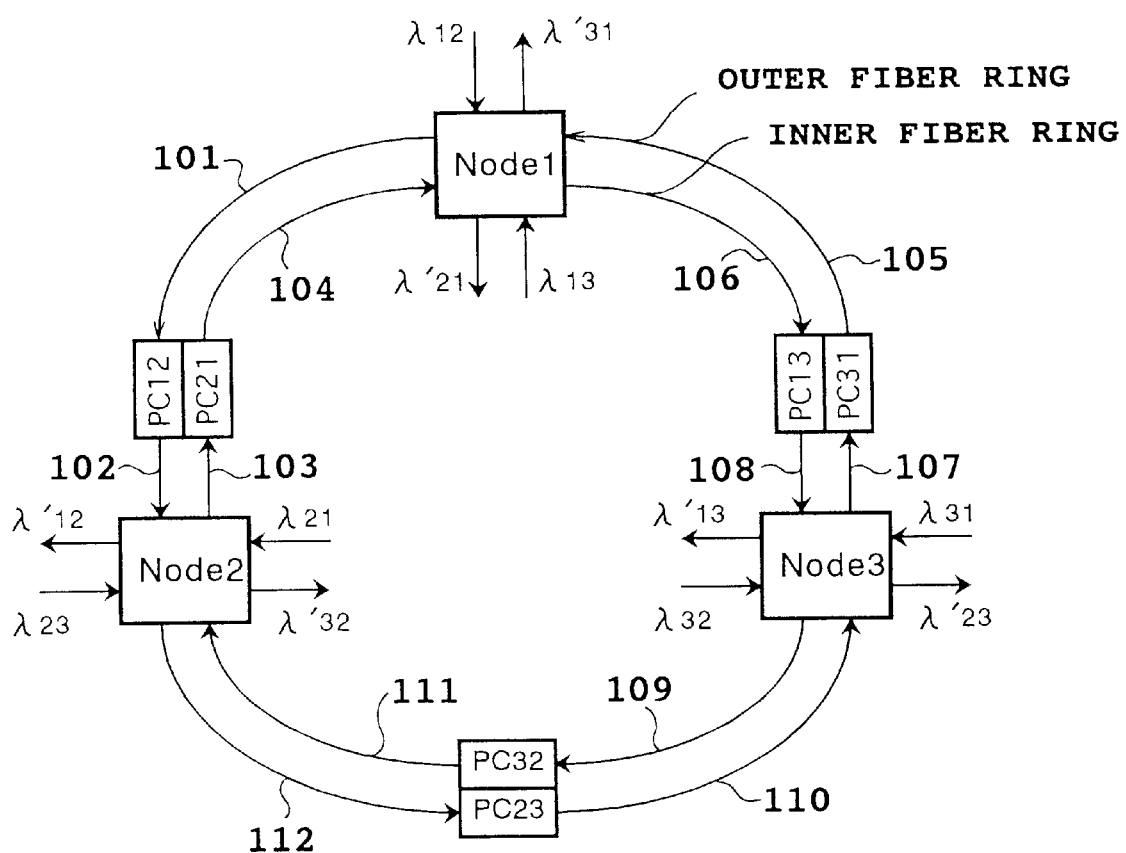
FIG. 28 is a diagram showing a system configuration of a ring network using phase conjugate light generators (PCs)

FIG. 28 is a view showing a ring lightwave network using phase conjugate light generators. In FIG. 28, Nodes 1, 2, and 3 are optical ADMs, and they are connected to an outer fiber ring (single-mode optical fiber transmission line) and an inner fiber ring (single-mode optical fiber transmission line). A plurality of phase conjugate light generators (PC12, PC21, PC23, PC32, PC13, and PC31) are provided on the outer fiber ring and the inner fiber ring between the nodes 1, 2, and 3. Each PC or each node is located at such a position that the total amounts of dispersion in the input optical fiber ring and the output optical fiber ring are substantially equal to each other, and the total amounts of optical Kerr effect in the input and output optical fiber rings are equal to each other.

The node 1 sends a signal to the node 2 by using a lightwave having a wavelength 12, and the node 2 sends a signal to the node 1 by using a lightwave having a wavelength A21. The node 1 sends the lightwave having the wavelength A12 to an outer optical fiber ring 101. The PC12 generates phase conjugate light having a wavelength λ'12 corresponding to the lightwave having the wavelength λ12 received from the optical fiber ring 101. As the PC12, the above-mentioned DFB-LD is preferably used. The PC12 inputs the phase conjugate light having the wavelength λ'12 into an optical fiber ring 102, and sends it to the node 2. The node 2 receives the phase conjugate light having the wavelength λ'12 from the optical fiber ring 102, and handles it as an optical signal from the node 1. The PC12 is located at such a position that the total amount of dispersion in the optical fiber ring 101 is substantially equal to that in the optical fiber ring 102, and that the total amount of optical Kerr effect in the optical fiber ring 101 is substantially equal to that in the optical fiber ring 102. Accordingly, the phase conjugate light of the wavelength λ'12 having substantially the same waveform as that of the optical signal of the wavelength λ12 added to the outer optical fiber ring in the node 1 can be dropped from the outer optical fiber ring in the node 2. As a result, it is unnecessary to perform complicated waveform shaping and timing regeneration of the received optical signal in the node 2.

In the case of sending a signal from the node 2 to the node 1, the inner optical fiber ring is used. That is, in the case of sending a signal from the node 2 to the node 1 by using a lightwave having a wavelength $\lambda 21$, the lightwave of the wavelength $\lambda 21$ is sent to an optical fiber ring 103. The PC21 generates phase conjugate light having a wavelength $\lambda'21$ corresponding to the lightwave of the wavelength $\lambda 21$ received from the optical fiber ring 103, and sends the phase conjugate light of the wavelength $\lambda'21$ to an optical fiber ring 104.

The node 1 receives the phase conjugate light of the wavelength $\lambda'21$ from the optical fiber ring 104 as a transmitted signal from the node 2. The PC21 is located at such a position that the total amount of dispersion in the optical fiber ring 103 is substantially equal to that in the optical fiber ring 104, and that the total amount of optical Kerr effect in the optical fiber ring 103 is substantially equal to that in the optical fiber ring 104. Accordingly, the phase conjugate light of the wavelength $\lambda'21$ having substantially the same waveform as that of the optical signal of the wavelength $\lambda 21$ added to the inner optical fiber ring in the node 2 can be dropped from the inner optical fiber ring in the node 1. As a result, it is unnecessary to perform complicated waveform shaping and timing regeneration of the received optical signal also in the node 1.

The communication from the node 1 to the node 3 is performed through an inner optical fiber ring 106 by using a lightwave having a wavelength $\lambda 13$, and the communication from the node 3 to the node 1 is performed through an outer optical fiber ring 105 by using a lightwave having a wavelength $\lambda 31$. The PC13 generates phase conjugate light having a wavelength $\lambda'13$ corresponding to the lightwave of the wavelength $\lambda 13$, and inputs the phase conjugate light of the wavelength $\lambda'13$ into an optical fiber ring 108. The node 3 receives the phase conjugate light of the wavelength $\lambda'13$ as an optical signal from the node 1. The communication from the node 3 to the node 1 is performed through an outer optical ring 107. The PC 31 generates phase conjugate light having a wavelength $\lambda'31$ corresponding to the lightwave of the wavelength $\lambda 31$, and inputs the phase conjugate light of the wavelength $\lambda'31$ into the optical fiber ring 105. The node 1 receives the phase conjugate light of the wavelength $\lambda'31$ as an optical signal from the node 3.

Similarly, the communication from the node 2 to the node 3 is performed through an outer optical fiber ring 112 by using a lightwave having a wavelength $\lambda 23$, and the communication from the node 3 to the node 2 is performed through an inner optical fiber ring 109 by using a lightwave having a wavelength $\lambda 32$. The PC23 generates phase conjugate light having a wavelength $\lambda'23$ corresponding to the lightwave of the wavelength $\lambda 23$, and inputs the phase conjugate light of the wavelength $\lambda'23$ into an optical fiber ring 110. The node 3 receives the phase conjugate light of the wavelength $\lambda'23$ as an optical signal from the node 2. Further, the PC32 generates phase conjugate light having a wavelength $\lambda'32$ corresponding to the lightwave of the wavelength $\lambda 32$, and inputs the phase conjugate light of the wavelength $\lambda'32$ into an optical fiber ring 111. The node 2 receives the phase conjugate light of the wavelength $\lambda'32$ as an optical signal from the node 3.

In the ring lightwave network shown in FIG. 28, the communication can be continued even if the optical fiber ring is broken. That is, in the case that the optical fiber ring 101 is broken, the communication from the node 1 to the node 2 can be continued by using a bypass circuit consisting of the inner optical fiber rings 106, 108, 109, and 111.

The wording of "the optical fiber ring is broken" used herein includes the case that the optical fiber ring is physically damaged to become untransmittable, and also includes the case that the optical fiber ring undergoes overflow of its transmission capacity to cause difficulty of transmission.

In the case that the optical fiber ring 101 is broken, the node 1 sends the lightwave of the wavelength $\lambda 12$ to the optical fiber ring 106. A PC12' is provided at the position of the PC13 so that the PC12' generates phase conjugate light having a wavelength $\lambda''12$ corresponding to the lightwave of the wavelength $\lambda 12$ and sends the phase conjugate light of the wavelength $\lambda''12$ to the optical fiber ring 108. The node 3 passes the phase conjugate light of the wavelength $\lambda''12$ to send it to the optical fiber ring 109. A PC12" is provided at the position of the PC32 so that the PC12" generates phase conjugate light having a wavelength $\lambda'12$ corresponding to the lightwave of the wavelength $\lambda''12$ received from the optical fiber ring 109 and sends the phase conjugate light of the wavelength $\lambda'12$ to the optical fiber ring 111. The node 2 receives the phase conjugate light of the wavelength $\lambda'12$ from the optical fiber ring 111 as an optical signal from the node 1.

In this case, two steps of generation of phase conjugate light are carried out by the PC12' provided at the position of the PC13 and the PC12" provided at the position of the PC32, so that two steps of wavelength conversion are carried out. Accordingly, it is preferable to suitably select the wavelengths of pump light to be used in the PC12' and the PC12", so as to make the wavelength $\lambda 12$ of the lightwave to be received from the node 1 and the wavelength $\lambda'12$ of the lightwave to be sent to the node 2 respectively equal to the wavelength $\lambda 12$ of the lightwave input into the PC12 and the wavelength $\lambda'12$ of the phase conjugate light from the PC12. By such setting, the same light source can be used in the node 1, and the same receiving system can be used in the node 2 in case of a trouble.

Accordingly, it is only necessary to prepare a single light source for the node 1 and select whether the light source is connected to the optical fiber ring 101 or to the optical fiber ring 106 by means of an optical switch according to trouble conditions. In this case, the lightwave of the wavelength $\lambda'12$ from the node 1 can be received in the node 2 only by connecting the optical fiber ring 102 and the optical fiber ring 111 to the same receiving system. Conversely, the lightwave of the wavelength $\lambda 12$ is always sent from the node 1 to the optical fiber ring 101 and the optical fiber ring 106, and it is selected whether the lightwave of the wavelength $\lambda'12$ is received by the node 2 from the optical fiber ring 102 or from the optical fiber ring 111.

The reason why the PC12' and the PC12" can be provided at the same positions as those of the PC13 and the PC32, respectively, is that the PC13 is provided at such a position that the total amount of dispersion in the optical fiber ring 106 is substantially equal to that in the optical fiber ring 108 and that the total amount of optical Kerr effect in the optical fiber ring 106 is substantially equal to that in the optical fiber ring 108, and similarly the PC32 is provided at such a position that the total amount of dispersion in the optical fiber ring 109 is substantially equal to that in the optical fiber ring 111 and that the total amount of optical Kerr effect in the optical fiber ring 109 is substantially equal to that in the optical fiber ring 111.

As a bypass circuit from the node 2 to the node 1, the path consisting of the optical fiber rings 112, 110, 107, and 105 may be used. As a bypass circuit from the node 2 to the node 3, the path consisting of the optical fiber rings 103, 104, 106, and 108 may be used. As a bypass circuit from the node 3 to the node 2, the path consisting of the optical fiber rings 107, 105, 101, and 102 may be used. The operation of each bypass circuit is similar to that of the bypass circuit from the node 1 to the node 2.

While different optical paths are used as the inner fiber ring and the outer fiber ring in the above network, bidirectional optical communication may be carried out by using a common optical path and different wavelengths as the wavelength λ12 and the wavelength λ21 of the lightwave. In this case, the PC12 and the PC21 can be provided at the same position because the outer fiber ring and the inner fiber ring are physically identical with each other and naturally the total amount of dispersion and the total amount of optical Kerr effect in the outer fiber ring are substantially equal to those in the inner fiber ring, respectively.

Figure 29:
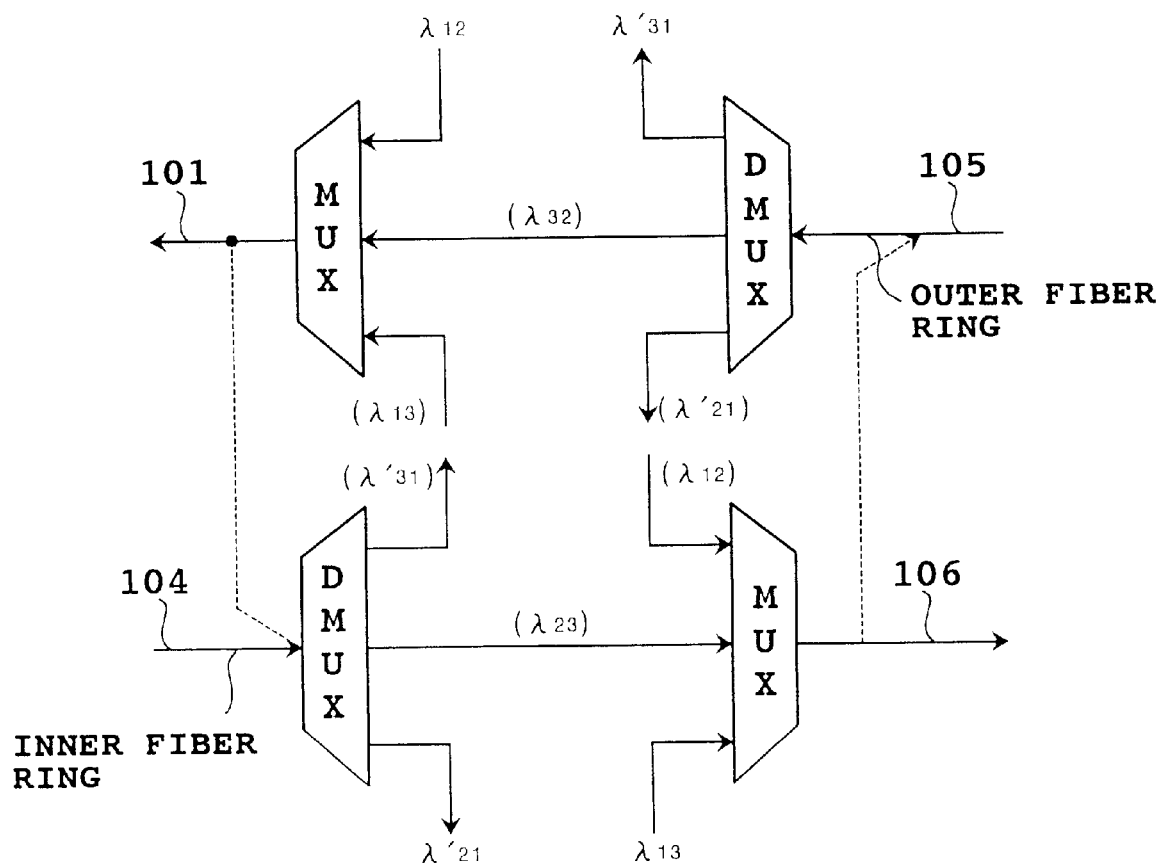
FIG. 29 is a diagram showing a configuration of a node 1 in FIG. 28.

FIG. 29 shows a specific configuration of the node 1. In FIG. 29, DMUX is an optical wavelength separating device for separating an input light into lightwaves having optically different wavelengths. Further, MUX is an optical wavelength division multiplexing device for multiplexing lightwaves having optically different wavelengths and coupling a resultant multiplexed lightwave to one optical fiber. The nodes 2 and 3 may be similarly configured. In the case of carrying out bidirectional optical transmission by using a single optical fiber ring, the optical fiber ring 101 may be connected to the DMUX and the optical fiber ring 105 may be connected to the MUX.

Figure 30:
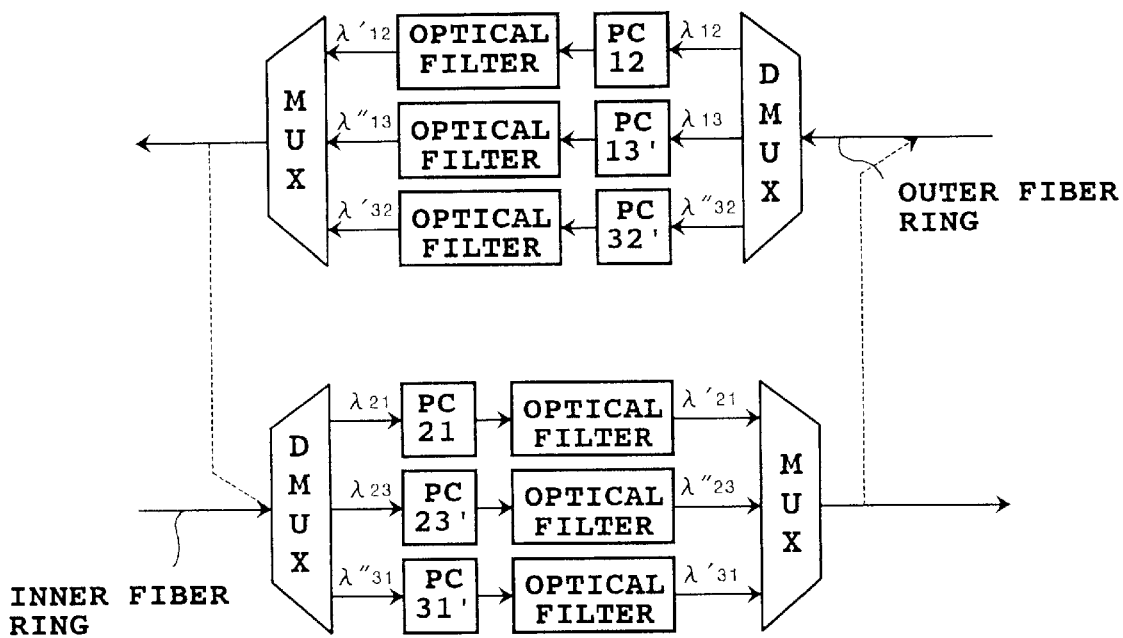
FIG. 30 is a diagram showing a configuration of the PCs (phase conjugate light generators) in FIG. 28.

FIG. 30 shows a specific configuration of a phase conjugator including the phase conjugate generators PC12 and PC21. As the PC12, PC13', and PC32', a DFB-LD is preferably used for each as mentioned above. The use of the DFB-LD allows a great size reduction and simplification of each of the phase conjugate light generators. Accordingly, in optical wavelength-division multiplexing communication, the phase conjugate light generator can be provided for each wavelength to allow individual wavelength conversion as shown in FIG. 30. Accordingly, it is unnecessary to perform control for expanding a required band of the phase conjugate generator. In FIG. 30, an optical band-pass filter each for passing only the wavelength of phase conjugate light is provided to input only the phase conjugate light into the optical fiber ring (i.e., to remove the probe light and the pump light).

Figure 31:
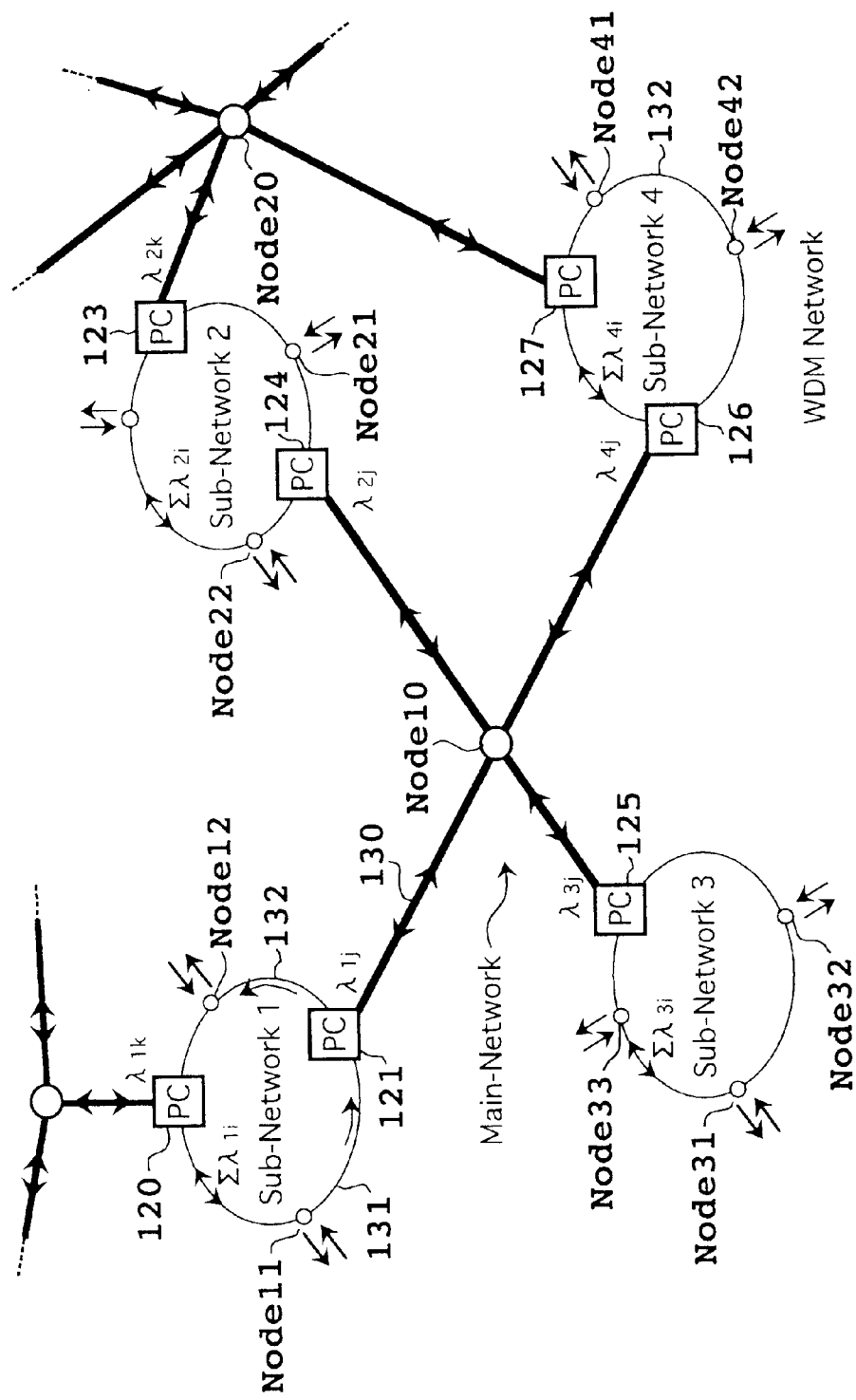
FIG. 31 is a diagram showing a WDM network (optical wavelength-division multiplexing network) expanded from the ring network shown in FIG. 28.

FIG. 31 shows another configuration of the lightwave network shown in FIG. 28. In FIG. 31, symbols ○ denote nodes similar to those shown in FIG. 28, and each node has a function of adding/dropping a lightwave having a specific wavelength. The network shown in FIG. 31 is different from the network shown in FIG. 28 in the point that each phase conjugate light generator PC has an optical branching/switching function.

Figure 32:
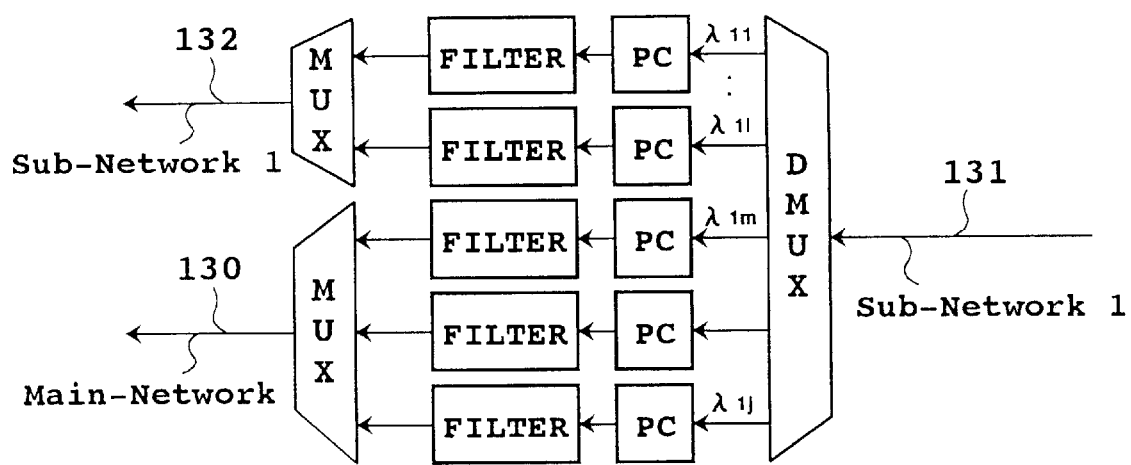
FIG. 32 is a diagram showing a configuration of a phase conjugate light generator (PC) 121 shown in FIG. 31.

A specific configuration of a PC 121 shown in FIG. 31 will now be described with reference to FIG. 32. It is now considered that the PC 121 receives an optical signal from a sub-network 1 on the side of a node 11 and sends an optical signal to a sub-network on the side of a node 12. The sub-network 1 on the node 11 side is connected to an optical wavelength demultiplexer DMUX for separating the wavelength of an input lightwave into wavelengths λ11 to λ1j. In the case of using the lightwaves of the wavelengths λ11 to λ1i as optical communication for the sub-network 1, phase conjugate light beams respectively corresponding to the lightwaves of the wavelengths λ11 to λ1i are generated by PCs, and only the phase conjugate light beams are extracted by optical filters. Thereafter, the phase conjugate light beams extracted are input into an optical wavelength multiplexer MUX for multiplexing the phase conjugate light beams, and the multiplexed phase conjugate light beams are then input into the node 12 of the sub-network 1. In the case of using the lightwaves of the wavelengths λ1m to λ1j as communication to a main-network, phase conjugate light beams respectively corresponding to the lightwaves of the wavelengths λ1m to λ1j are generated by PCs, and only the phase conjugate light beams are extracted by optical filters. Thereafter, the phase conjugate light beams extracted are input into an optical wavelength multiplexer MUX for multiplexing the phase conjugate light beams, and the multiplexed phase conjugate light beams are then input into an optical fiber 130 of the main-network. In this case, the total amount of dispersion and the total amount of optical Kerr effect in an optical fiber 131 between the node 11 and the PC 121 are set substantially equal to these in an optical fiber 132 between the PC 121 and the node 12, and the total amount of dispersion and the total amount of optical Kerr effect in the optical fiber 131 are set substantially equal to these in the optical fiber 130 between the PC 121 and the node 10.

At the node 10, a lightwave path may be switched by using an optical matrix switch described in Japanese Patent Publication No. 6-66982, for example. The use of the optical matrix switch allows a lightwave signal to be sent to each of PC 124, PC 125, and PC 126.

In the preferred embodiments shown in FIGS. 28 to 32, a phase conjugate light generator not using a DFB laser diode may be adopted. This kind of phase conjugate light generator includes a nonlinear optical medium (e.g., optical fiber or semiconductor optical amplifier) supplied with a signal light beam, a pump light source for outputting pump light, and an optical coupler for supplying the pump light to the nonlinear optical medium. In the nonlinear optical medium, a phase conjugate light beam is generated, for example, by four-wave mixing based on the signal light beam and the pump light, and the phase conjugate light beam generated is output from the nonlinear optical medium.

Figure 33A:
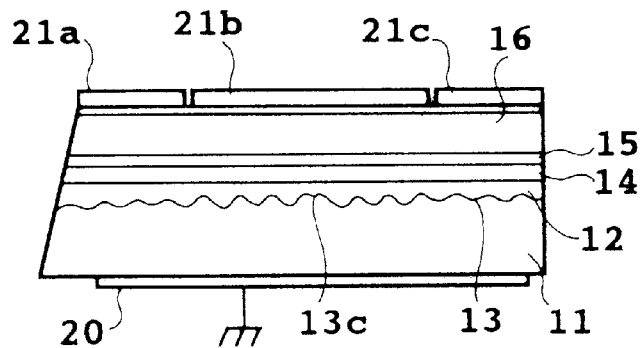
FIGS. 33A, 33B, and 33C are cross sections showing modifications of the DFB laser diode shown in FIG. 4.
Figure 33B:
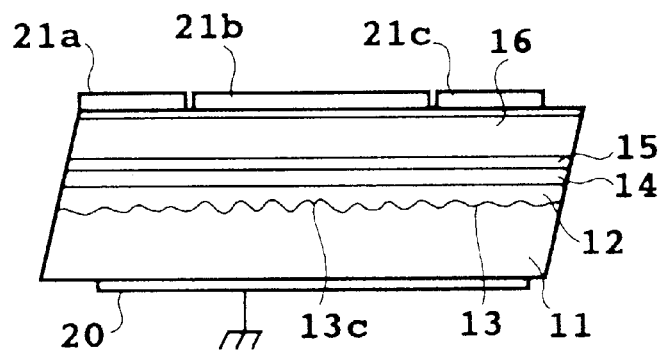
Figure 33C:
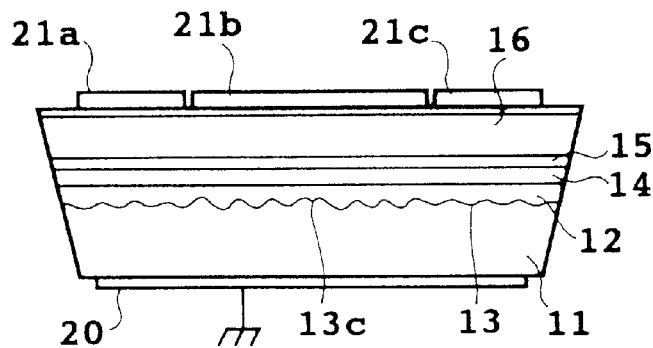

FIGS. 33A, 33B, and 33C are cross sections showing modifications of the DFB laser diode shown in FIG. 4. FIG. 33A shows a DFB laser diode having a first end face (facet) inclined to a plane perpendicular to the junction surfaces between the layers 12, 14, and 15, and a second end face (facet) substantially perpendicular to the junction surfaces. The first end face is supplied with signal light beam, and the second end face outputs signal light beam, pump light, and phase conjugate light beam. According to the structure as shown in FIG. 33A, reflected light from the first end face in the DFB laser diode becomes leaky mode, and thereby prevented to be guided into the guide layer 12. As a result, it can be possible to generate phase conjugate light beam stably. Therefore, the structure as shown in FIG. 33A is suitable for one-directional type phase conjugate light generators such as shown in FIGS. 2, 8, 9, 15, and 16.

FIGS. 33B and 33C respectively show DFB laser diodes suitable for bidirectional type phase conjugate light generators such as shown in FIGS. 10, 11, 13, and 13A. Each of the DFB laser diodes shown in FIGS. 33B and 33C has first and second end faces (facets) both of which are inclined to a plane perpendicular to the junction surfaces. The first and second end faces of FIG. 33B are parallel to each other, whereas the first and second end faces of FIG. 33C are not. According to the structure as shown in FIG. 33B or FIG. 33C, reflected light from each of the first and second end faces becomes leaky mode in the DFB laser diode, and thereby prevented to be guided into the guide layer 12. As a result, it can be possible to stably generate phase conjugate light beams propagating in two directions.

Antireflection films or coats (refer to the reference numeral 22 shown in FIG. 4) may be provided on the first and second end faces of the DFB laser diode shown in FIG.

33A, 33B, or 33C in order to further suppress the reflected light. It can be possible to obtain a reflectivity lower than 0.1% by optimum design of such an antireflection film or coat.

Figure 34:
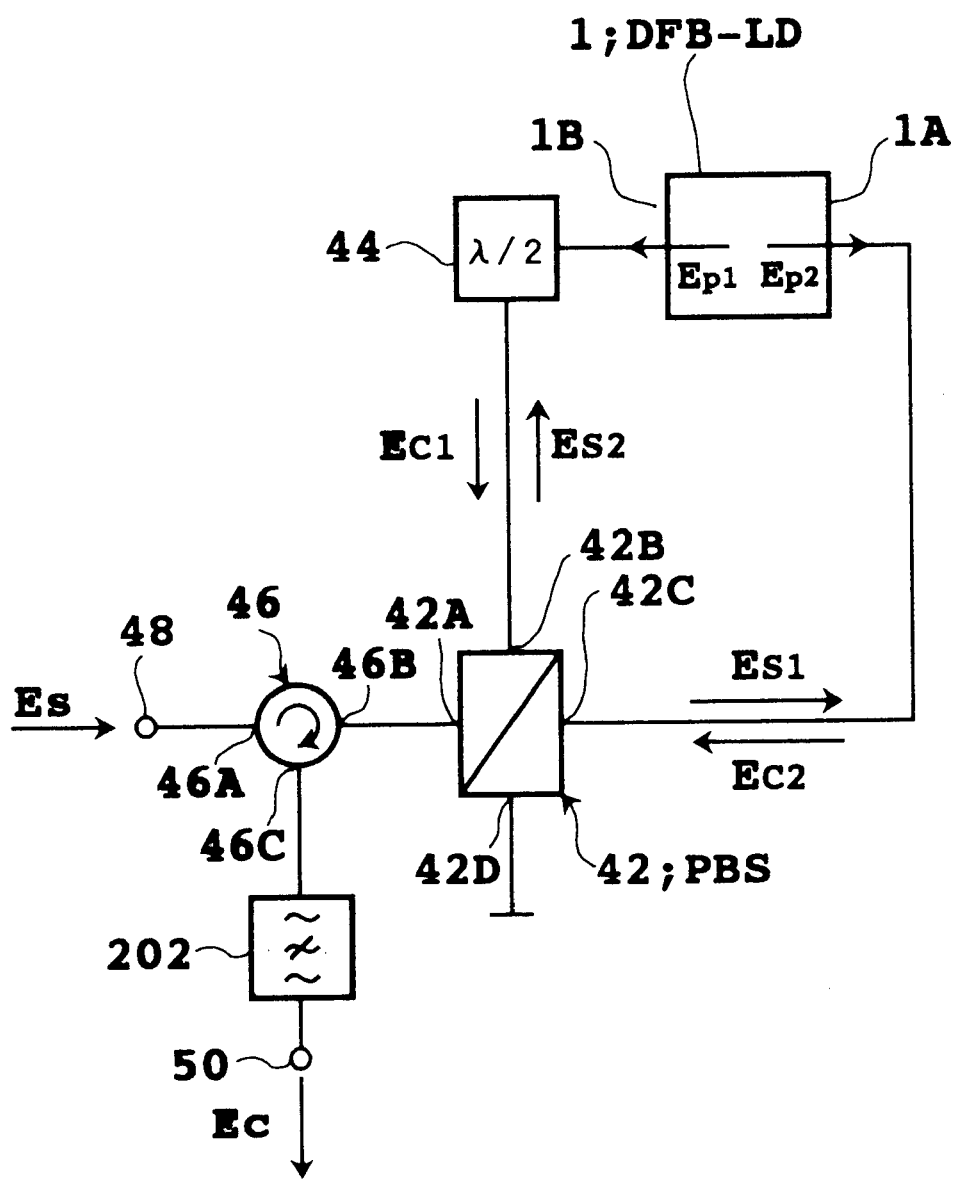
FIG. 34 is a diagram showing a first modification of the phase conjugate light generator shown in FIG. 10.

FIG. 34 is a diagram showing a first modification of the phase conjugate light generator shown in FIG. 10. There is provided additionally an optical band stop filter 202. The filter 202 is optically connected between the port 46C of the optical circulator 46 and the output port 50, and eliminates the pump light components $E_{p1}$ and $E_{p2}$ generated in the DFB laser diode 1.

Figure 35:
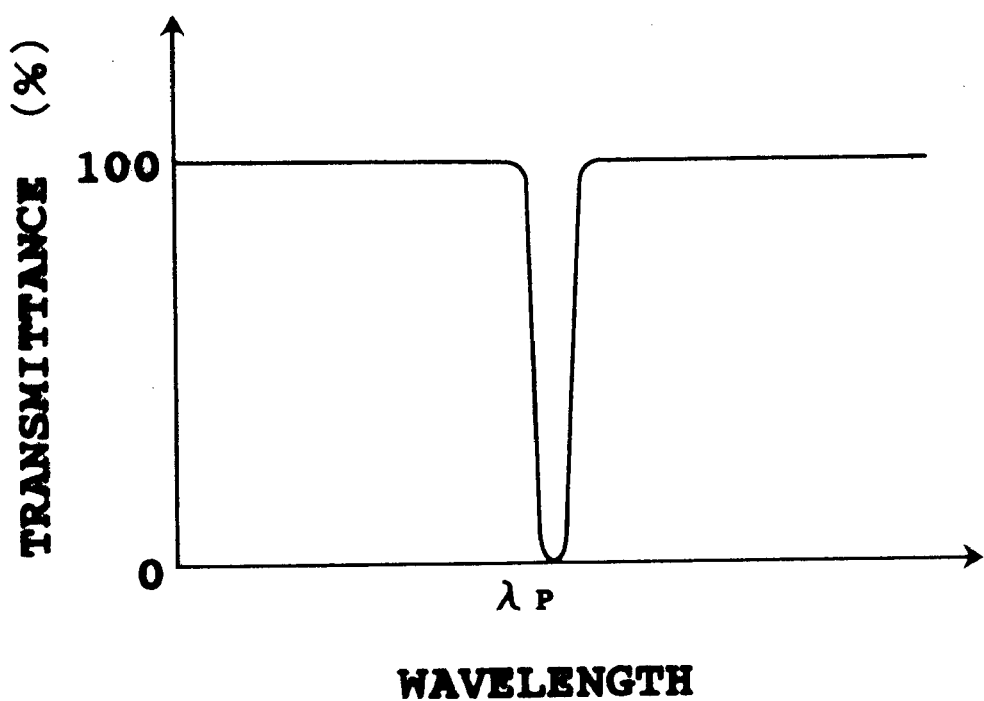
FIG. 35 shows a wavelength characteristic of the transmittance of the optical band stop filter 202 shown in FIG. 34.

FIG. 35 shows a wavelength characteristic of the transmittance of the optical band stop filter 202 shown in FIG. 34. The filter 202 has a narrow stop band including the wavelength $\lambda_p$ of the pump light components $E_{p1}$ and $E_{p2}$. That is, the transmittance in the region near the wavelength $\lambda_p$ is substantially 0(%), while the transmittance in the other region is substantially 100(%). Such a wavelength characteristic as shown in FIG. 35 is obtained by using a fiber grating as the optical band stop filter 202.

In the case that the refractive index of an optical medium (e.g., glass) is permanently changed by exposure to light, it is generally said that the optical medium is photosensitive. By utilizing this property, a fiber grating can be fabricated in the core of an optical fiber. Such a fiber grating has a characteristic that it can Bragg-reflect light in an narrow band near a resonance wavelength determined by the pitch of gratings and the effective refractive index of a fiber mode. The fiber grating can be fabricated, for example, by directing excimer laser having an oscillation wavelength of 248 nm or 193 nm to a fiber by using a phase mask (K. O. Hill, B. Malo, F. Bilodeau, D. C. Johnson, and J. Albert, "Bragg gratings fabricated in monomode photosensitive optical fiber by UV exposure through a phase mask", Applied Physics Letters, Vol. 62, No. 10, pp. 1035–1037, Mar. 8, 1993). Therefore, by optimizing the resonance wavelength of the fiber grating, it can be possible to obtain a narrow stop band of the optical band stop filter including the wavelength $\lambda_p$.

Particularly in the case that the stop band of the optical band stop filter 202 shown in FIG. 34 has a center wavelength substantially equal to the wavelength $\lambda_p$, the pump light components $E_{p1}$ and $E_{p2}$ generated in the DFB laser diode 1 are effectively eliminated by the filter 202. Therefore, the pump light components $E_{p1}$ and $E_{p2}$ are not output from the output port 50. Thus, the influence of the pump light on a receiving station or optical amplifiers provided on the downstream side of an optical transmission line can be reduced.

Figure 36:
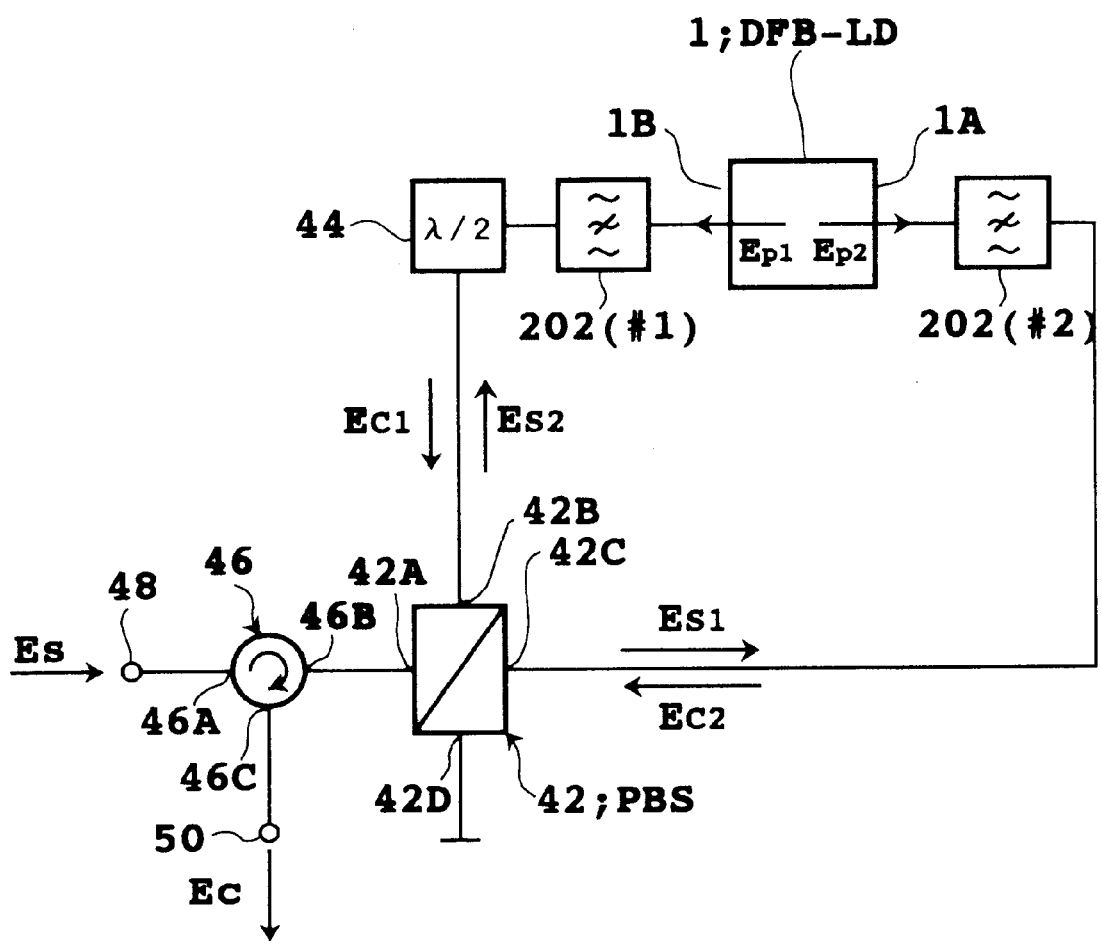
FIG. 36 is a diagram showing a second modification of the phase conjugate light generator shown in FIG. 10.

FIG. 36 is a diagram showing a second modification of the phase conjugate light generator shown in FIG. 10. There are provided optical band stop filters 202 (#1 and #2) in place of the filter 202 shown in FIG. 34. The filter 202 (#1) is optically connected between the half-wave plate 44 and the end 1B of the DFB laser diode 1, while the filter 202 (#2) is optically connected between the end 1A of the DFB laser diode 1 and the port 42C of the polarization beam splitter 42. Each of the filters 202 (#1 and #2) has a wavelength characteristic similar to that of the filter 202 shown in FIG. 34, that is, a wavelength characteristic as shown in FIG. 35. According to the embodiment shown in FIG. 36, the pump light components $E_{p1}$ and $E_{p2}$ generated in the DFB laser diode 1 are elimminated by the filters 202 (#1 and #2), respectively, thereby prevented to output from the output port 50.

Thus, in accordance with an aspect of the present invention, there is provided a method for generation of phase conjugate light, comprising the steps of:

(a) injecting a current into a distributed feedback (DFB) laser diode so that the DFB laser diode generates pump light;

(b) supplying a signal light beam to the DFB laser diode to generate a phase conjugate light beam by four-wave mixing based on the signal light beam and the pump light in the DFB laser diode; and (c) supplying the signal light beam, the phase conjugate light beam, and the pump light output from the DFB laser diode to an optical band stop filter having a stop band including a wavelength of the pump light.

In accordance with an another aspect of the present invention, there is provided a device for generation of phase conjugate light, comprising: a distributed feedback (DFB) laser diode supplied with a signal light beam; means for injecting a current into the DFB laser diode so that the DFB laser diode generates pump light, the DFB laser diode converting the signal light beam into a phase conjugate light beam by four-wave mixing based on the signal light beam and the pump light; and an optical band stop filter supplied with the signal light beam, the phase conjugate light beam, and the pump light output from the DFB laser diode, the optical band stop filter having a stop band including a wavelength of the pump light.

In the case that a phase conjugate light generator includes a DFB laser diode, advantages obtained by using such an optical band stop filter are remarkable because the pump light generated in the DFB laser diode tends to have relatively high power.

Figure 37:
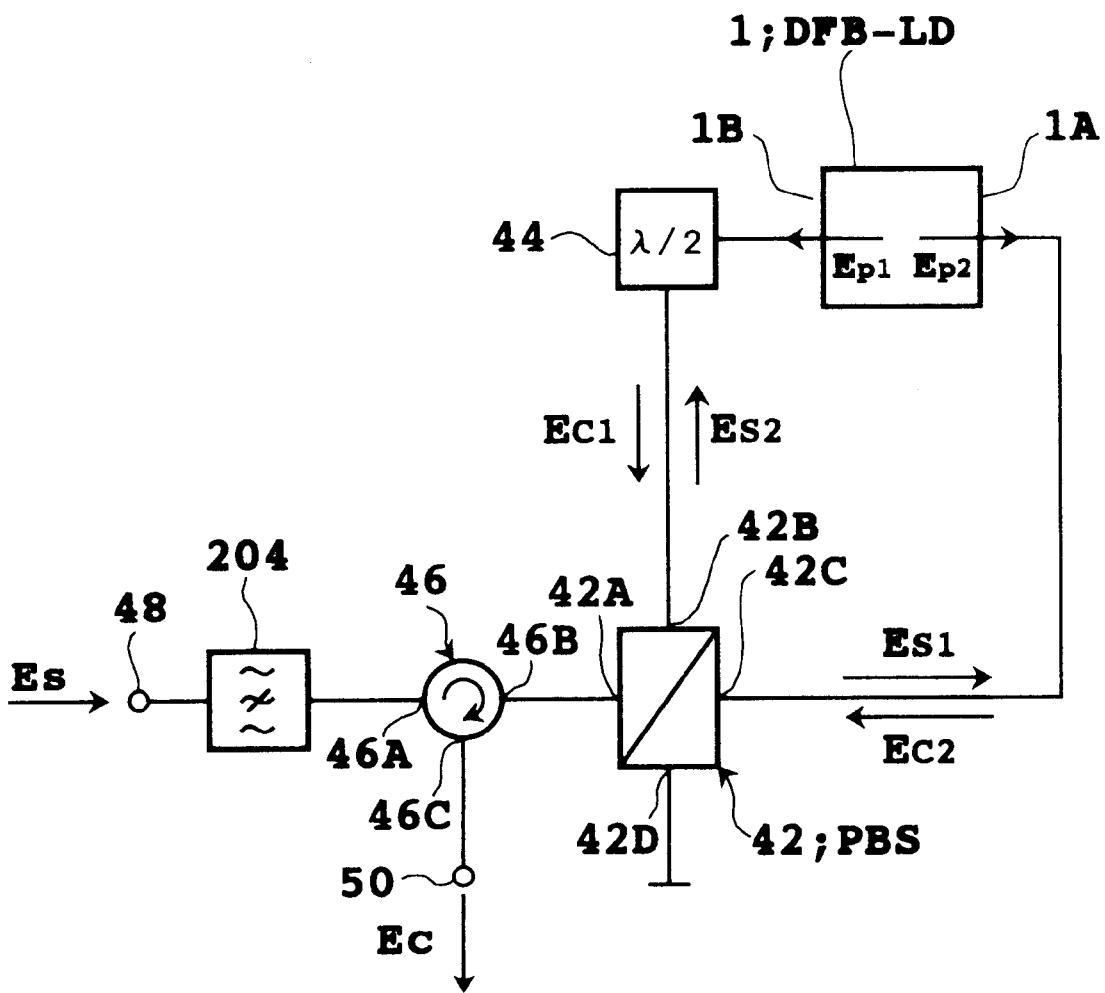
FIG. 37 is a diagram showing a third modification of the phase conjugate light generator shown in FIG. 10.

FIG. 37 is a diagram showing a third modification of the phase conjugate light generator shown in FIG. 10. There is provided additionally an optical band stop filter 204 optically connected between the input port 48 and the port 46A of the optical circulator 46. The filter 204 may be a fiber grating. The filter 204 has a narrow stop band including a predetermined wavelength. The predetermined wavelength is set to be substantially equal to the wavelength $\lambda_c$ of the phase conjugate light beams $E_{c1}$ and $E_{c2}$ to be generated in the DFB laser diode 1 by four-wave mixing.

Figure 38A:
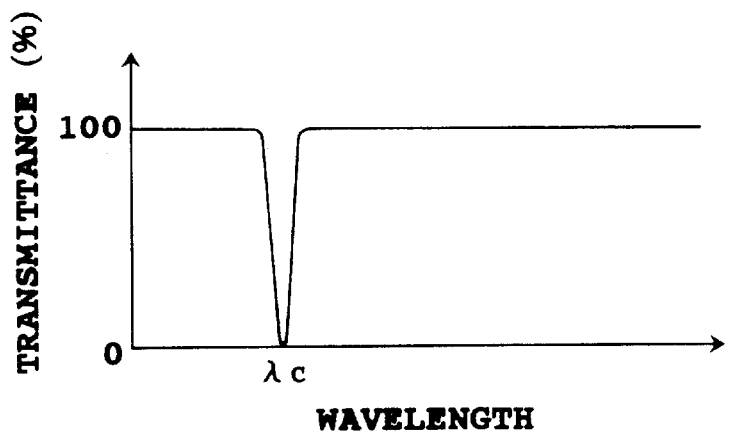
FIG. 38A shows a wavelength characteristic of the transmittance of the optical band stop filter 204 shown in FIG. 37.

FIG. 38A shows a wavelength characteristic of the transmittance of the optical band stop filter 204 shown in FIG. 37. The transmittance in the region near the wavelength $\lambda_c$ is substantially 0(%), while the transmittance in the other region is substantially 100(%).

Figure 38B:
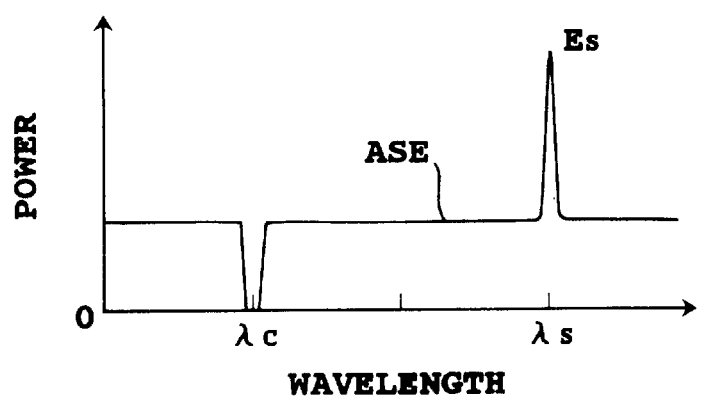
FIG. 38B shows a power (intensity) spectrum of light transmitted through the optical band stop filter 204 shown in FIG. 37.

FIG. 38B shows a power (intensity) spectrum of light transmitted through the optical band stop filter 204 shown in FIG. 37. The input light beam supplied to the input port 48 has an ASE (amplified spontaneous emission) noise and an signal component (Es) superimposed on the ASE noise at the wavelength $\lambda_s$. By passing the input light beam through the optical band stop filter 204, a portion of the ASE noise is eliminated in the vicinity of the wavelength $\lambda_c$.

Figure 38C:
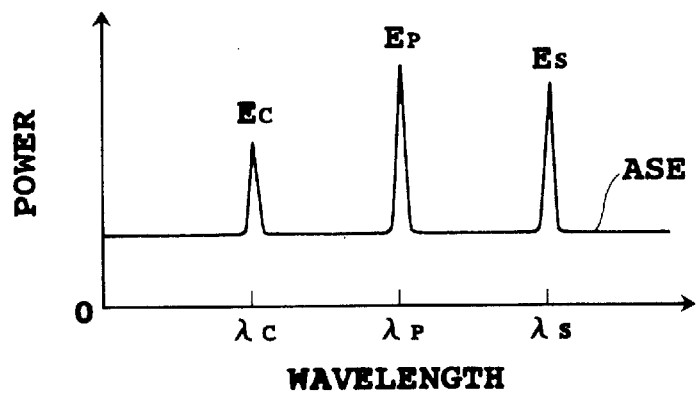
FIG. 38C shows a power (intensity) spectrum of light output from the optical phase conjugator shown in FIG. 37.

FIG. 38C shows a power (intensity) spectrum of light output from the optical phase conjugator shown in FIG. 37. As a result of four-wave mixing based on the signal light beam $E_s$ (polarization components $E_{s1}$ and $E_{s2}$) and the pump light $E_p$ (pump light components $E_{p1}$ and $E_{p2}$) in the DFB laser diode 1, the phase conjugate light beam $E_c$ ($E_{c1}$ and $E_{c2}$) is generated at the wavelength $\lambda_c$. Since the ASE noise is previously eliminated in the vicinity of the wavelength $\lambda_c$, the obtained phase conjugate light beam provides a good signal-to-noise ratio (SNR).

Thus, in accordance with an aspect of the present invention, there is provided a method for generation of phase conjugate light, comprising the steps of:

(a) supplying a signal light beam to an optical band stop filter having a stop band including a predetermined wavelength; and (b) supplying the signal light beam output from the optical band stop filter to a phase conjugator to generate a phase conjugate light beam by four-wave mixing, the phase conjugate light beam having a wavelength being substantially equal to the predetermined wavelength.

In accordance with another aspect of the present invention, there is provided a device for generation of phase conjugate light, comprising: an optical band stop filter being supplied with a signal light beam and having a stop band including a predetermined wavelength; and a phase conjugator supplied with the signal light beam output from the optical band stop filter, for generating a phase conjugate light beam by four-wave mixing, the phase conjugate light beam having a wavelength substantially equal to the predetermined wavelength.

Figure 39:
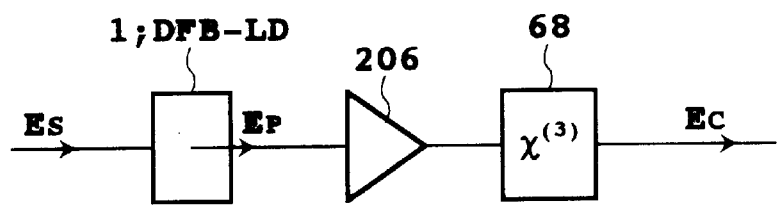
FIG. 39 is a diagram showing a modification of the phase conjugate light generator shown in FIG. 15.

FIG. 39 is a diagram showing a modification of the phase conjugate light generator shown in FIG. 15. There is provided an optical amplifier 206 optically connected between the DFB laser diode 1 and the nonlinear optical medium 68. The DFB laser diode 1 is being driven so as to generate pump light $E_p$, and the signal light beam $E_s$ is supplied to the DFB laser diode 1. By the four-wave mixing based on the signal light beam $E_s$ and the pump light $E_p$ in the DFB laser diode 1, phase conjugate light beam $E_c$ is generated. The signal light beam $E_s$, the pump light $E_p$, and the phase conjugate light beam $E_c$ output from the DFB laser diode 1 are amplified in the optical amplifier 206, and then supplied to the nonlinear optical medium 68. In the medium 68, the power of the phase conjugate light beam $E_c$ is enhanced by four-wave mixing, and the enhanced phase conjugate light beam $E_c$ is then output from the medium 68. Particularly in this embodiment, since the pump light $E_p$ is amplified by the optical amplifier 206 before being supplied to the medium 68, the nonlinear effect in the medium 68 is heightened, and the power of the obtained phase conjugate light beam $E_c$ can be effectively increased.

An erbium doped fiber amplifier (EDFA) is preferable as the optical amplifier 206 in case of amplification in a band of 1.5 μm. The nonlinear optical medium 68 may be a semiconductor optical amplifier (SOA) or an optical fiber such as a dispersion shifted fiber (DSF). In the case that the optical fiber as the medium 68 has a zero-dispersion wavelength substantially equal to the wavelength of the pump light $E_p$, it can be possible to easily obtain a phase matching condition, thereby increasing the power of the obtained phase conjugate light beam $E_c$.

Figure 40:
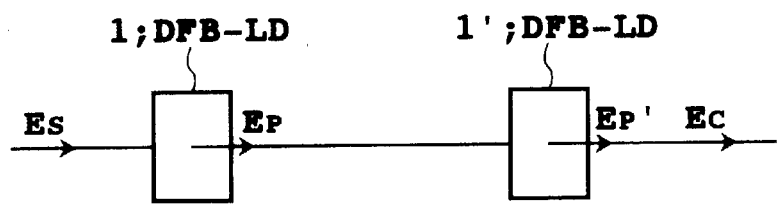
FIG. 40 is a diagram showing a polarization independent phase conjugate light generator according to the present invention.

FIG. 40 is a diagram showing a polarization independent phase conjugate light generator according to the present invention. This phase conjugate light generator has the cascaded DFB laser diodes 1 and 1', which may be extracted from the optical loop shown in FIG. 13A. The DFB laser diode 1 is driven so as to generate pump light $E_p$ having a TE polarization plane, and the DFB laser diode 1' is driven so as to generate pump light $E_p'$ having a TM polarization plane. The signal light beam $E_s$ supplied to the DFB laser diode 1 is composed of first and second signal components having polarization planes which corresponds to the TE and TM polarization planes, respectively. The first signal component is converted to a first phase conjugate light component in the DFB laser diode 1 through the four-wave mixing process based on the first signal component and the pump light $E_p$, while the second signal component passes through the DFB laser diode 1. The second signal component is then converted to a second phase conjugate light component in the DFB laser diode 1' through the four-wave mixing process based on the second signal component and the pump light $E_p'$, while the first phase conjugate light component generated in the DFB laser diode 1 passes through the DFB laser diode 1'. The first and second phase conjugate light components are output from the DFB laser diode 1' as a resultant phase conjugate light beam $E_c$. According to this embodiment, since both of the first and second signal components are converted into the phase conjugate light beam, a polarization dependency of the conversion efficiency is reduced.

Figure 41:
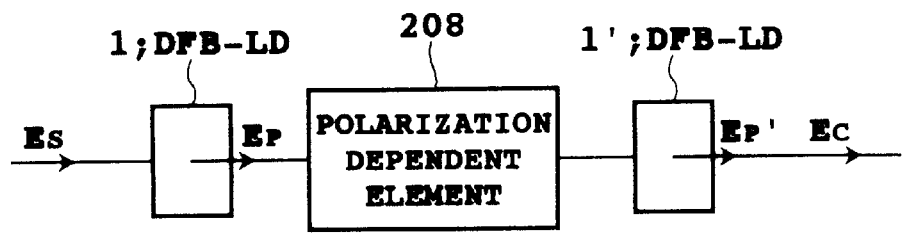
FIG. 41 is a diagram showing a modification of the phase conjugate light generator shown in FIG. 40.

FIG. 41 is a diagram showing a modification of the phase conjugate light generator shown in FIG. 40. In the case that each of the DFB laser diodes 1 and 1' has different transmittances for the TE and TM polarization modes, there is a possibility that the ability of reducing the polarization dependency is deteriorated. In order to cope with this possibility, there is provided a polarization dependent element 208 between the DFB laser diodes 1 and 1'. The element 208 has different losses or gains for the TE and TM polarization modes, and the element 208 is set or adjusted such that the polarization dependency of this phase conjugate light generator becomes minimum. An optical amplifier or a polarizer is applicable to be used as the element 208, for example.

When the phase conjugate conversion is performed in a phase conjugate light generator which includes cascaded first and second nonlinear optical mediums such as the DFB laser diode 1 and the optical fiber 72 as shown in FIG. 16, the conversion efficiency and the conversible band are determined in accordance with the sum of the nonlinear effects in the first and second nonlinear optical mediums. Here, the conversible band is defined as a maximum detuning wavelength or frequency between the pump light and the signal light under the condition where a certain power of the phase conjugate light is obtained. In general, an optical fiber as the second nonlinear optical medium has wider conversible band than DFB laser diode or semiconductor optical amplifier as the first nonlinear optical medium, because the optical path length in the fiber is at least several hundreds meter, whereas that of the DFB laser diode chip or the semiconductor optical amplifier chip is usually less than 1 millimeter. Accordingly, the combination of the DFB laser diode or the semiconductor optical amplifier as the first nonlinear optical medium and the optical fiber as the second nonlinear optical medium provides a phase conjugate light generator which has a high conversion efficiency and a wide conversible band. A dispersion shifted fiber (DSF) utilized in general purpose, however, has its nonlinear coefficiency γ of about $2.6W^{-1}km^{-1}$, which needs the fiber length of 10 km or more so as to obtain a sufficiently large conversion efficiency. Therefore, it is demanded to provide a DSF having relatively large nonlinear cofficiency γ enough to shorten the fiber length. If the length of the DSF utilized as the second nonlinear optical medium would be shortened, then it becomes easy to make the wavelength of the pump light substantially equal to the zero-dispersion wavelength of the DSF, thereby to widen the conversible band.

The nonlinear coefficiency γ is represented as:

$$\gamma = \omega n_2 / c A_{eff}$$

where ω is the optical frequency, $n_2$ and $A_{eff}$ are the nonlinear refractive index and the effective core sectional area of the fiber, respectively, and c is the velocity of light. Therefore, it is effective to increase the nonlinear refractive index $n_2$ or decrease a mode field diameter (MFD) of the DSF, which corresponds to the effective core sectional area $A_{eff}$, in order to obtain large nonlinear coefficiency γ. The increase of the nonlinear refractive index $n_2$ may be attained by doping fluorine or the like in the clad and/or doping a high concentration of $GeO_2$ in the core. In case of doping $GeO_2$ in the core with 25–30 mol %, a large value of $5 \times 10^{-20}$ $m^2/W$ or more is obtained as the nonlinear refractive index $n_2$. The decrease of the MFD may be attained by designing of a refractive index contrast $\Delta$ or the shape of the core. Such a designing of the DSF is like as a DCF (dispersion compensating fiber). For example, in case of doping $GeO_2$ in the core with 25–30 mol % and setting the refractive index contrast $\Delta$ with 2.5–3.0%, a value of about 4 $\mu$m is obtained as the MFD. By these techniques, a large value exceeding $15W^{-1}km^{-1}$ is obtained as the nonlinear coefficient $\gamma$.

Another important point is that the DSF providing such a large value of the nonlinear coefficient $\gamma$ should have a zero-dispersion wavelength included within the pump band. This coincidence of the zero-dispersion wavelength and the pump band can be attained by setting the fiber parameters (e.g. the refractive index contrast $\Delta$ and MFD) as follows. Generally in a usual fiber, the increase of the refractive index contrast $\Delta$ under a constant MFD makes the dispersion value large in normal dispersion region. On the other hand, the dispersion value becomes small by increasing the core diameter, whereas the dispersion value becomes large by decreasing the core diameter. Therefore, after setting the MFD to a certain value applicable to the pump band, the core diameter can be adjusted such that the zero-dispersion wavelength becomes equal to a predetermined wavelength of the pump light.

It is sufficient that the length of the DSF providing such a large value of the nonlinear coefficient $\gamma$ is set to about 2.6/15 (=1/5.7) in comparison with a usual DSF, so as to obtain a conversion efficiency similar to that in the usual fiber, because the conversion efficiency is proportional to $\gamma PL$, where P represents the optical power and L represents the length of the DSF. While the length of the usual DSF is needed to be about 10 km so as to obtain sufficiently large conversion efficiency as mentioned above, a similar conversion efficiency can be obtained by a length of 1–2 km of the DSF providing such a large value of the nonlinear coefficient $\gamma$. Furthermore, the loss is reduced by an amount of decrease in the fiber length, so that the fiber length can be further decreased. Thus, in such a DSF with shortened length, the accuracy in controlling of a zero-dispersion wavelength is improved, (that is, the wavelength of the pump light is easily controlled to be substantially equal to the zero-dispersion wavelength,) thereby providing a wide conversible band. Further, with a fiber length of several km, a polarization maintaining ability is ensured. Accordingly, application of such a DSF to the present invention is useful in obtaining a high conversion efficiency and a wide conversible band.

The conversible band will be widened as follows by using a nonlinear effect. Now assuming an optical fiber which provides a large nonlinear effect (including the case that the power $P_0$ of the pump light is sufficiently large). The phase unmatching amount $\Delta\kappa$ in four-wave mixing is represented as follows:

$$\Delta\kappa = \beta_2 \Omega^2 + 2\gamma P_0$$

where $\beta_2$ is a dispersion value at the wavelength of the pump light, and $\Omega$ is a detuning frequency defined as $\Omega \equiv |\omega_p - \omega_c| = |\omega_s - \omega_p|$. In a usual fiber, the condition of phase matching ($\Delta\kappa = 0$) is that the dispersion value $\beta_2$ becomes zero, because the value of $2\gamma P_0$ is sufficiently small. Contrary, in a fiber which provides large nonlinear effect, the condition of phase matching is altered because the value of $2\gamma P_0$ is not negligible. Since the value $2\gamma P_0$ is always positive, the condition of phase matching is obtained when the dispersion value $\beta_2$ is negative (that is anomalous dispersion). In this case, the detuning frequency $\Omega_1$ which provides optimum condition for phase matching is represented as follow.

$$\Omega_1 = (2\gamma P_0/|\beta_2|)^{1/2}$$

Accordingly, the conversible band can be widened to a value nearly equal to the detuning frequency $\Omega_1$ by adjusting the pump light with respect to the values of $\gamma$ and $P_0$.

Thus, in accordance with an aspect of the present invention, there is provided a method for generation of phase conjugate light, comprising the steps of:

(a) supplying a signal light beam to a first nonlinear optical medium;

(b) generating a phase conjugate light beam in the first nonlinear optical medium based on four-wave mixing using a pump light; and (c) supplying the signal light beam, the phase conjugate light beam, and the pump light output from the first nonlinear optical medium to a second nonlinear optical medium.

In accordance with another aspect of the present invention, there is provided a device for generation of phase conjugate light, comprising: a first nonlinear optical medium for being supplied with a signal light beam and generating a phase conjugate light beam based on four-wave mixing using a pump light; and a second nonlinear optical medium cascaded to the first nonlinear optical medium and supplied with the signal light beam, the phase conjugate light beam, and the pump light output from the first nonlinear optical medium.

Figure 42:
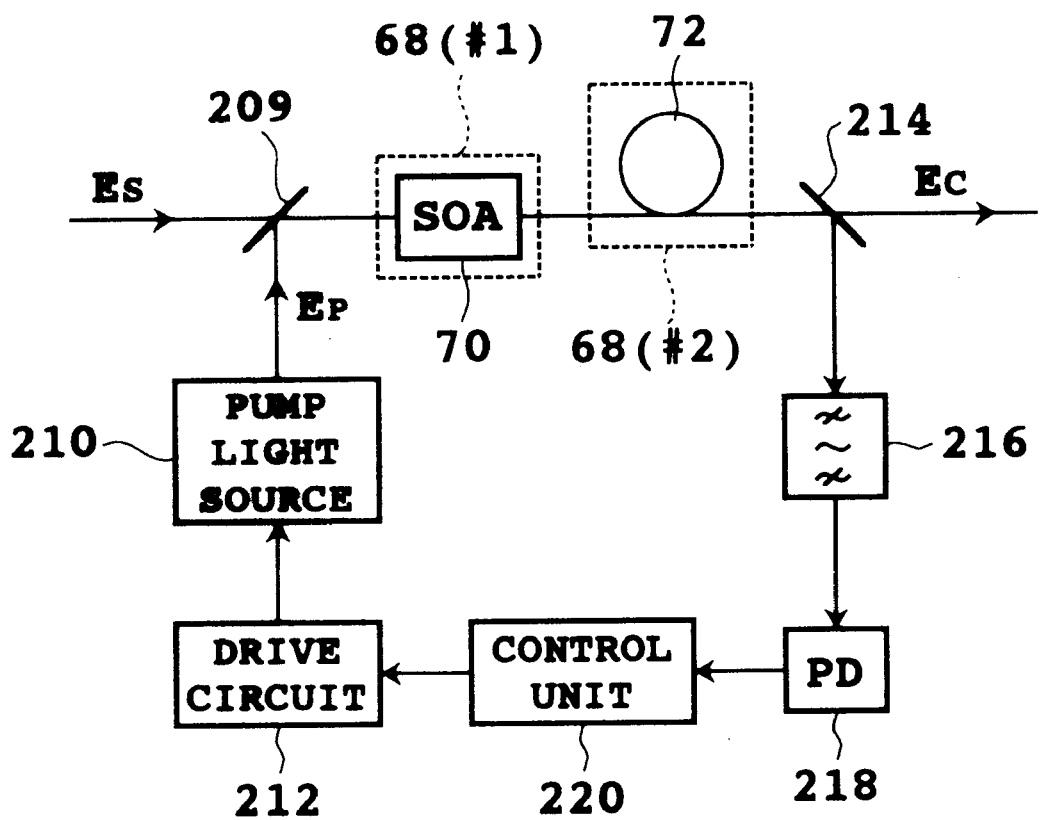
FIGS. 42 and 43 are diagrams showing phase conjugate light generators each having a high conversion efficiency and a wide conversible band.
Figure 43:
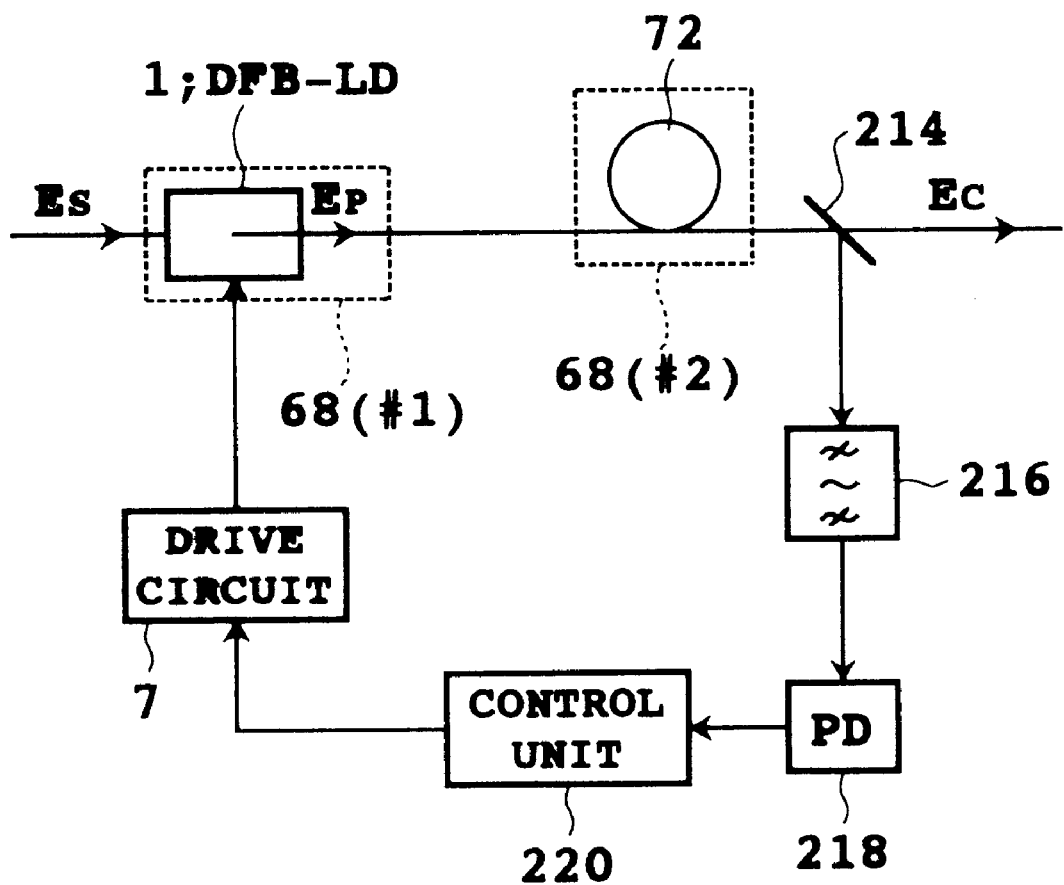

FIGS. 42 and 43 are diagrams showing phase conjugate light generators each having a high conversion efficiency and a wide conversable band. Each of the phase conjugate light generators has the combination of a first nonlinear optical medium 68(#1) and a second nonlinear optical medium 68(#2). FIG. 42 shows the case that the first nonlinear optical medium 68(#1) includes the semiconductor optical amplifier (SOA) 70, whereas FIG. 43 shows the case that the first nonlinear optical medium 68(#1) includes the DFB laser diode 1. Both cases show that the second nonlinear optical medium 68(#2) includes the DSF 72.

In the embodiment shown in FIG. 42, the supplied signal light beam and the pump light output from a pump light source 210 are combined by an optical coupler 209 before being input into the SOA 70. By the four-wave mixing based on the signal light beam and the pump light in the SOA 70, phase conjugate light beam is generated. The signal light beam, the pump light, and the phase conjugate light beam output from the SOA 70 are then supplied to the DSF 72. In the DSF 72, the power of the phase conjugate light beam is enhanced by four-wave mixing, and the enhanced phase conjugate light beam is then output from the DSF 72. In this process using the cascaded SOA 70 and DSF 72, the conversion efficiency is heightened.

In order to widen the conversible band and further heighten the conversion efficiency, there is provided a feedback loop including an optical band pass filter 216, a photodeterctor 218, and a control unit 220. The pump light source 210 is driven by a drive circuit 212 which adjusts the wavelength of the pump light in accordance with a control signal supplied. The light output from the DSF 72 is split into two beams by an optical coupler 214, and one of these beams is then supplied to the optical band pass filter 216.

The filter 216 has a narrow pass band including the wavelength $\lambda_c$ of the phase conjugate light beam. The beam component transmitted through the filter 216 is converted by the photodetector 218 into an electrical signal having a level (e.g. voltage level) corresponding to the optical power detected. The control unit 220 receives the signal output from the photodetector 218, and then generates the above mentioned control signal such that the detected power level of the photodetector 218 becomes higher. As a result of such a feedback control, the wavelength of the pump light supplied to the SOA 70 and the DSF 72 is controlled to be equal to a preferable value (e.g. the zero-dispersion wavelength of the DSF 72) so as to widen the conversible band and heighten the conversion efficiency, because the power of the phase conjugate light beam becomes maximun when the wavelength of the pump light is equal to the predetermined wavelength. In the case that a laser diode is used as the pump light source 210, the wavelength of the pump light may be varied by the change in an injection current and/or a temperature of the laser diode.

In the embodiment shown in FIG. 43, the control signal output from the control unit 220 is supplied to the drive circuit 7 of the DFB laser diode 1. The drive circuit 7 adjusts the wavelength of the pump light generated in the DFB laser diode 1, in accordance with the control signal (refer to FIGS. 2 through 5 and description thereof). As a result, the wavelength of the pump light is controlled to be equal to a preferable value (e.g. the zero-dispersion wavelength of the DSF 72) so as to widen the conversible band and heighten the conversion efficiency. A temperature of the DFB laser diode 1 may be controlled in the feedback control loop.

There may be an optical amplifier (not shown) between the first and second nonlinear optical mediums 68 (#1 and #2) in the enbodiments shown in FIGS. 42 and 43, such that the power of the pump light supplied to the medium 68 (#2) becomes sufficiently large.

Incidentally, in the nondegenerate four-wave mixing process in a semiconductor nonlinear optical medium such as the DFB laser diode and the semiconductor optical amplifier, the conversion efficiency becomes higher in the case where the wavelength of the signal light beam is longer than the wavelength of the pump light ($\Delta_p < \Delta_s$), compared with the case where the wavelength of the signal light beam is shorter than the wavelength of the pump light ($\lambda_s < \lambda_p$). This is considered to be due to the following reason. In the conversion process using such a semiconductor nonlinear optical medium, the four-wave mixing occurs based on the total effect of the third-order nonlinear effects as follows:

(1) modulation effect in carrier density (with a band narrower than 0.1 nm);

(2) carrier heating effect (with a band approximately 10 nm); and (3) spectrum hole burning effect (with a band wider than 50 nm). As a result, phase relationships of the obtained light through the four-wave mixing process involve with each other in the case $\lambda_p < \lambda_s$, whereas the phase relationships are cancelled out in the case $\lambda_s < \lambda_p$. Therefore, by setting the wavelength of the signal light beam longer than the wavelength of the pump light, it becomes possible to heighten the conversion efficiency.

Thus, in accordance with an aspect of the present invention, there is provided a method for generation of phase conjugate light, comprising the steps of:

(a) supplying a signal light beam to a semiconductor nonlinear optical medium;

(b) generating a phase conjugate light beam in the semiconductor nonlinear optical medium based on four-wave mixing using a pump light; and (c) setting a wavelength of the signal light beam longer than a wavelength of the pump light.

In accordance with another aspect of the present invention, there is provided a device for generation of phase conjugate light, comprising a semiconductor nonlinear optical medium supplied with a signal light beam; and means for pumping the semiconductor nonlinear optical medium so that the semiconductor nonlinear optical medium generates a phase conjugate light beam based on four-wave mixing using a pump light, the signal light beam having a wavelength longer than a wavelength of the pump light.

According to the present invention, waveform distortion due to chromatic dispersion and optical Kerr effect in an optical fiber can be ideally compensated to allow high-speed, large-capacity, long-haul optical fiber transmission of an optical signal.

Furthermore, according to the present invention, it is possible to provide a method and device for generating phase conjugate light with conversion efficiency being not dependent upon a polarization state.

Furthermore, according to the present invention, it is possible to provide a method and device for generating phase conjugate light with high conversion efficiency or wide conversible band.

Furthermore, according to the present invention, a phase conjugate light generator can be effectively applied to an optical network.

In this specification, the wording that an element and another element are operatively connected includes the case that these elements are directly connected, and also includes the case that these elements are so provided as to be related with each other to such an extent that an electrical signal or an optical signal can be mutually transferred between these elements.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method for generation of phase conjugate light, comprising the steps of:

(a) separating a signal light beam into a first polarization component having a first polarization plane and a second polarization component having a second polarization plane perpendicular to said first polarization plane;

(b) supplying said first and second polarization components to a distributed feedback (DFB) laser diode to generate first and second phase conjugate light beams respectively corresponding to said first and second polarization components; and (c) combining said first and second phase conjugate light beams.

2. A method according to claim 1, wherein said step (b) includes a step of injecting a current into said DFB laser diode so that said DFB laser diode generates pump light having a wavelength different from a wavelength of said signal light beam, whereby said first and second phase conjugate light beams are generated by four-wave mixing based on said pump light in said DFB laser diode.

3. A method according to claim 1, wherein:

said DFB laser diode comprises first and second DFB laser diodes for receiving said first and second polarization components, respectively; and said steps (a) and (c) are performed by first and second polarization beam splitters, respectively.

4. A method according to claim 1, wherein:

said DFB laser diode has first and second ends for receiving said first and second polarization components, respectively;

said first and second phase conjugate light beams are output from said second and first ends, respectively; and said steps (a) and (c) are performed by a common polarization beam splitter.

5. A device for generation of phase conjugate light, comprising:

means for separating a signal light beam into a first polarization component having a first polarization plane and a second polarization component having a second polarization plane perpendicular to said first polarization plane; and a distributed feedback (DFB) laser diode supplied with said first and second polarization components to generate first and second phase conjugate light beams respectively corresponding to said first and second polarization components.

6. A device according to claim 5, wherein:

said separating means comprises a first polarization beam splitter having a first port for receiving said signal light beam and second and third ports for outputting said first and second polarization components, respectively;

said DFB laser diode comprises first and second DFB laser diodes operatively connected to said second and third ports, respectively;

said first and second phase conjugate light beams are output from said first and second DFB laser diodes, respectively; and said device further comprises a second polarization beam splitter for combining said first and second phase conjugate light beams.

7. A device according to claim 6, wherein:

said first DFB laser diode generates first pump light having a third polarization plane;

said first phase conjugate light beam is generated by four-wave mixing based on said first polarization component and said first pump light in said first DFB laser diode;

said second DFB laser diode generates second pump light having a fourth polarization plane;

said second phase conjugate light beam is generated by four-wave mixing based on said second polarization component and said second pump light in said DFB laser diode; and said device further comprises means for rotating a polarization plane by 90° so that said first polarization plane coincides with said third polarization plane, and said second polarization plane coincides with said fourth polarization plane.

8. A device according to claim 7, wherein said rotating means comprises a first half-wave plate operatively connected between said first polarization beam splitter and said second DFB laser diode, and a second half-wave plate operatively connected between said first DFB laser diode and said second polarization beam splitter.

9. A device according to claim 7, wherein said rotating means comprises a polarization maintaining fiber.

10. A device according to claim 6, wherein said first and second polarization beam splitters are formed on a common waveguide substrate.

11. A device according to claim 5, wherein:

said separating means comprises a polarization beam splitter having first to fourth ports, said first port being supplied with said signal light beam, said first and third ports being coupled by said first polarization plane, said second and fourth ports being coupled by said first polarization plane, said first and second ports being coupled by said second polarization plane, and said third and fourth ports being coupled by said second polarization plane;

said first and second polarization components are output from said third and second ports, respectively;

said DFB laser diode has first and second ends for receiving said first and second polarization components, respectively, and generates pump light having a third polarization plane;

said first and second phase conjugate light beams are output from said second and first ends, respectively, and supplied to said second and third ports, respectively; and said device further comprises means for rotating one of said first and second polarization planes by 90° so that said first and second polarization planes coincide with said third polarization plane.

12. A device according to claim 11, wherein said rotating means comprises a half-wave plate.

13. A device according to claim 11, wherein said rotating means comprises a polarization maintaining fiber.

14. A device according to claim 11, further comprising an optical circulator having fifth to seventh ports;

one of said fifth to seventh ports being connected to said first port of said polarization beam splitter; and said fourth port of said polarization beam splitter being antireflection-terminated.

15. A device according to claim 11, further comprising:

a first optical circulator having fifth to seventh ports; and a second optical circulator having eighth to tenth ports;

one of said fifth to seventh ports being connected to said first port of said polarization beam splitter; and one of said eighth to tenth ports being connected to said fourth port of said polarization beam splitter.

16. A device according to claim 15, further comprising a second DFB laser diode cascaded to said DFB laser diode, said second DFB laser diode generating second pump light having a polarization plane perpendicular to said third polarization plane.

17. A device according to claim 5, further comprising means for injecting a current into said DFB laser diode so that said DFB laser diode generates pump light;

said first and second phase conjugate light beams being generated by four-wave mixing based on said pump light in said DFB laser diode.

18. A device according to claim 17, wherein said DFB laser diode has a diffraction grating having a quarter-wave phase shift structure at its substantially central portion, and an electrode for injecting said current;

said electrode comprising a plurality of parts divided in a direction of said diffraction grating.

19. A device for generation of phase conjugate light, comprising:

a distributed feedback (DFB) laser diode supplied with a signal light beam;

means for injecting a current into said DFB laser diode so that said DFB laser diode generates pump light; and a nonlinear optical medium optically connected to said DFB laser diode;

wherein a phase conjugate light beam is generated by four-wave mixing based on said signal light beam and said pump light in said DFB laser diode, and a power of said phase conjugate light beam is enhanced by four-wave mixing in said nonlinear optical medium.

20. A device according to claim 19, wherein said nonlinear optical medium comprises a semiconductor optical amplifier.

21. A device according to claim 19, wherein said nonlinear optical medium comprises an optical fiber.

22. A device according to claim 20, wherein said optical fiber has a zero-dispersion wavelength substantially equal to a wavelength of said pump light.

23. A device according to claim 21, further comprising means for frequency-modulating or phase-modulating said pump light, whereby stimulated Brillouin scattering in said optical fiber is suppressed.

24. A device according to claim 21, wherein said optical fiber has a nonlinear coefficient large enough to shorten a length of said optical fiber to such a degree that said optical fiber has a polarization maintaining ability.

25. A device according to claim 24, wherein said optical fiber comprises a core doped with $GeO_2$ and a clad doped with fluorine.

26. A device according to claim 24, wherein said optical fiber is a single mode fiber, and said single mode fiber has a mode field diameter smaller than a mode field diameter of a single mode fiber used as a transmission line.

27. A method for generation of phase conjugate light, comprising the steps of:

(a) supplying a signal light beam composed of a first polarization component having a first polarization plane and a second polarization component having a second polarization plane perpendicular to said first polarization plane to a first DFB laser diode for generating pump light having a polarization plane corresponding to said first polarization plane to generate a first phase conjugate light beam having a polarization plane corresponding to said first polarization plane by four-wave mixing based on said first polarization component and said first pump light in said first DFB laser diode; and (b) supplying said first phase conjugate light beam output from said first DFB laser diode and said second polarization component passed through said first DFB laser diode to a second DFB laser diode for generating second pump light having a polarization plane corresponding to said second polarization plane to generate a second phase conjugate light beam having a polarization plane corresponding to said second polarization plane by four-wave mixing based on said second polarization component and said second pump light in said second DFB laser diode.

28. A device for generation of phase conjugate light, comprising:

a first DFB laser diode for generating first pump light having a first polarization plane; and a second DFB laser diode cascaded to said first DFB laser diode, for generating second pump light having a second polarization plane perpendicular to said first polarization plane;

wherein when a signal light beam composed of first and second polarization components having polarization planes respectively corresponding to said first and second polarization planes is supplied to said first DFB laser diode, a first phase conjugate light beam having a polarization plane corresponding to said first polarization plane is generated in said first DFB laser diode by four-wave mixing based on said first polarization component and said first pump light, and said second polarization component is passed through said first DFB laser diode, whereas a second phase conjugate light beam having a polarization plane corresponding to said second polarization plane is generated in said second DFB laser diode by four-wave mixing based on said second polarization component and said second pump light, and said first phase conjugate light beam is passed through said second DFB laser diode.

29. A system comprising:

a first optical fiber for transmitting a signal light beam;

a phase conjugate light generator for converting said signal light beam into a phase conjugate light beam; and a second optical fiber for transmitting said phase conjugate light beam;

said phase conjugate light generator comprising:

means for separating said signal light beam into a first polarization component having a first polarization plane and a second polarization component having a second polarization plane perpendicular to said first polarization plane; and a distributed feedback (DFB) laser diode supplied with said first and second polarization components to generate first and second phase conjugate light beams respectively corresponding to said first and second polarization components.

30. A system according to claim 29, wherein when said first and second optical fibers are virtually divided into equal numbers of sections, the products of average chromatic dispersions and section lengths in two corresponding ones of said sections of said first and second optical fibers as counted from said phase conjugate light generator are substantially equal to each other, and the products of average optical powers, average nonlinear coefficients, and section lengths in said two corresponding sections are substantially equal to each other.

31. A system according to claim 29, wherein the ratios of chromatic dispersions and the products of optical powers and nonlinear coefficients at two points in said first and second optical fibers are substantially equal to each other, said two points giving equal cumulative values of chromatic dispersions from said phase conjugate light generator.

32. A system according to claim 29, wherein the ratios of chromatic dispersions and the products of optical powers and nonlinear coefficients at two points in said first and second optical fibers are substantially equal to each other, said two points giving equal cumulative values of the products of optical powers and nonlinear coefficients from said phase conjugate light generator.

33. A system according to claim 29, wherein the product of an average chromatic dispersion and a length of said first optical fiber is substantially equal to the product of an average chromatic dispersion and a length of said second optical fiber.

34. A system according to claim 33, wherein the product of an average optical power and an average nonlinear coefficient in said first optical fiber and a length of said first optical fiber is substantially equal to the product of an average optical power and an average nonlinear coefficient in said second optical fiber and a length of said second optical fiber.

35. A system comprising:
a first optical fiber for transmitting a signal light beam;
a phase conjugate light generator for converting said signal light beam into a phase conjugate light beam; and
a second optical fiber for transmitting said phase conjugate light beam;
said phase conjugate light generator comprising:
a distributed feedback (DFB) laser diode supplied with said signal light beam;
means for injecting a current into said DFB laser diode so that said DFB laser diode generates pump light; and
a nonlinear optical medium optically connected to said DFB laser diode;
wherein a phase conjugate light beam is generated by four-wave mixing based on said signal light beam and said pump light in said DFB laser diode, and a power of said phase conjugate light beam is enhanced by four-wave mixing in said nonlinear optical medium.

36. A system according to claim 35, wherein when said first and second optical fibers are virtually divided into equal numbers of sections, the products of average chromatic dispersions and section lengths in two corresponding ones of said sections of said first and second optical fibers as counted from said phase conjugate light generator are substantially equal to each other, and the products of average optical powers, average nonlinear coefficients, and section lengths in said two corresponding sections are substantially equal to each other.

37. A system according to claim 35, wherein the ratios of chromatic dispersions and the products of optical powers and nonlinear coefficients at two points in said first and second optical fibers are substantially equal to each other, said two points giving equal cumulative values of chromatic dispersions from said phase conjugate light generator.

38. A system according to claim 35, wherein the ratios of chromatic dispersions and the products of optical powers and nonlinear coefficients at two points in said first and second optical fibers are substantially equal to each other, said two points giving equal cumulative values of the products of optical powers and nonlinear coefficients from said phase conjugate light generator.

39. A system according to claim 35, wherein the product of an average chromatic dispersion and a length of said first optical fiber is substantially equal to the product of an average chromatic dispersion and a length of said second optical fiber.

40. A system according to claim 39, wherein the product of an average optical power and an average nonlinear coefficient in said first optical fiber and a length of said first optical fiber is substantially equal to the product of an average optical power and an average nonlinear coefficient in said second optical fiber and a length of said second optical fiber.

41. A system comprising:
a first optical fiber for transmitting a signal light beam;
a phase conjugate light generator for converting said signal light beam into a phase conjugate light beam; and
a second optical fiber for transmitting said phase conjugate light beam;
said phase conjugate light generator comprising:
a first DFB laser diode for generating first pump light having a first polarization plane; and
a second DFB laser diode cascaded to said first DFB laser diode, for generating second pump light having a second polarization plane perpendicular to said first polarization plane;
wherein said signal light beam is composed of first and second polarization components having polarization planes respectively corresponding to said first and second polarization planes, and when said signal light beam is supplied to said first DFB laser diode, a first phase conjugate light beam having a polarization plane corresponding to said first polarization plane is generated in said first DFB laser diode by four-wave mixing based on said first polarization component and said first pump light, and said second polarization component is passed through said first DFB laser diode, whereas a second phase conjugate light beam having a polarization plane corresponding to said second polarization plane is generated in said second DFB laser diode by four-wave mixing based on said second polarization component and said second pump light, and said first phase conjugate light beam is passed through said second DFB laser diode.

42. A system according to claim 41, wherein when said first and second optical fibers are virtually divided into equal numbers of sections, the products of average chromatic dispersions and section lengths in two corresponding ones of said sections of said first and second optical fibers as counted from said phase conjugate light generator are substantially equal to each other, and the products of average optical powers, average nonlinear coefficients, and section lengths in said two corresponding sections are substantially equal to each other.

43. A system according to claim 41, wherein the ratios of chromatic dispersions and the products of optical powers and nonlinear coefficients at two points in said first and second optical fibers are substantially equal to each other, said two points giving equal cumulative values of chromatic dispersions from said phase conjugate light generator.

44. A system according to claim 41, wherein the ratios of chromatic dispersions and the products of optical powers and nonlinear coefficients at two points in said first and second optical fibers are substantially equal to each other, said two points giving equal cumulative values of the products of optical powers and nonlinear coefficients from said phase conjugate light generator.

45. A system according to claim 41, wherein the product of an average chromatic dispersion and a length of said first optical fiber is substantially equal to the product of an average chromatic dispersion and a length of said second optical fiber.

46. A system according to claim 45, wherein the product of an average optical power and an average nonlinear coefficient in said first optical fiber and a length of said first optical fiber is substantially equal to the product of an average optical power and an average nonlinear coefficient in said second optical fiber and a length of said second optical fiber.

47. A system comprising a plurality of units optically connected together, and at least one optical signal adding/dropping device provided at a connection point between said plurality of units;
each of said plurality of units comprising:
a first optical fiber for transmitting signal light;
means for converting said signal light into phase conjugate light; and
a second optical fiber for transmitting said phase conjugate light;
wherein chromatic dispersion and optical Kerr effect in said first optical fiber are compensated by chromatic dispersion and optical Kerr effect in said second optical fiber.

48. A method for generation of phase conjugate light, comprising the steps of:
(a) injecting a current into a distributed feedback (DFB) laser diode so that said DFB laser diode generates pump light;
(b) supplying a signal light beam to said DFB laser diode to generate a phase conjugate light beam by four-wave mixing based on said signal light beam and said pump light in said DFB laser diode; and
(c) supplying said signal light beam, said phase conjugate light beam, and said pump light output from said DFB laser diode to an optical band stop filter having a stop band including a wavelength of said pump light.

49. A device for generation of phase conjugate light, comprising:
a distributed feedback (DFB) laser diode supplied with a signal light beam;
means for injecting a current into said DFB laser diode so that said DFB laser diode generates pump light, said DFB laser diode converting said signal light beam into a phase conjugate light beam by four-wave mixing based on said signal light beam and said pump light; and
an optical band stop filter supplied with said signal light beam, said phase conjugate light beam, and said pump light output from said DFB laser diode, said optical band stop filter having a stop band including a wavelength of said pump light.

50. A device according to claim 49, wherein said optical band stop filter comprises a fiber grating.

51. A system comprising:
a first optical fiber for transmitting a signal light beam;
a phase conjugate light generator for converting said signal light beam into a phase conjugate light beam; and
a second optical fiber for transmitting said phase conjugate light beam;
said phase conjugate light generator comprising:
a distributed feedback (DFB) laser diode supplied with said signal light beam;
means for injecting a current into said DFB laser diode so that said DFB laser diode generates pump light, said DFB laser diode converting said signal light beam into said phase conjugate light beam by four-wave mixing based on said signal light beam and said pump light; and
an optical band stop filter supplied with said signal light beam, said phase conjugate light beam, and said pump light output from said DFB laser diode, said optical band stop filter having a stop band including a wavelength of said pump light.

52. A method for generation of phase conjugate light, comprising the steps of:
(a) supplying a signal light beam to an optical band stop filter having a stop band including a predetermined wavelength; and
(b) supplying said signal light beam output from said optical band stop filter to a phase conjugator to generate a phase conjugate light beam by four-wave mixing, said phase conjugate light beam having a wavelength being substantially equal to said predetermined wavelength.

53. A device for generation of phase conjugate light, comprising:
an optical band stop filter being supplied with a signal light beam and having a stop band including a predetermined wavelength; and
a phase conjugator supplied with said signal light beam output from said optical band stop filter, for generating a phase conjugate light beam by four-wave mixing, said phase conjugate light beam having a wavelength substantially equal to said predetermined wavelength.

54. A device according to claim 53, wherein said phase conjugator comprises:
a distributed feedback (DFB) laser diode supplied with said signal light beam; and
means for injecting a current into said DFB laser diode so that said DFB laser diode generates pump light.

55. A device according to claim 53, wherein said phase conjugator comprises:
a pump light source outputting pump light;
a nonlinear optical medium supplied with said signal light beam; and
means for optically coupling said pump light source and said nonlinear optical medium so that said pump light is supplied to said nonlinear optical medium.

56. A device according to claim 53, wherein said optical band stop filter comprises a fiber grating.

57. A system comprising:
a first optical fiber for transmitting a signal light beam;
an optical band stop filter being supplied with said signal light supplied with said signal light beam and having a stop band including a predetermined wavelength;
a phase conjugator supplied with said signal light beam output from said optical band stop filter, for generating a phase conjugate light beam by four-wave mixing, said phase conjugate light beam having a wavelength substantially equal to said predetermined wavelength; and
a second optical fiber for transmitting said phase conjugate light beam.

58. A method for generation of phase conjugate light, comprising the steps of:
(a) supplying a signal light beam to a first nonlinear optical medium;
(b) generating a phase conjugate light beam in said first nonlinear optical medium based on four-wave mixing using a pump light; and
(c) supplying said signal light beam, said phase conjugate light beam, and said pump light output from said first nonlinear optical medium to a second nonlinear optical medium.

59. A device for generation of phase conjugate light, comprising:
a first nonlinear optical medium for being supplied with a signal light beam and generating a phase conjugate light beam based on four-wave mixing using a pump light; and
a second nonlinear optical medium cascaded to said first nonlinear optical medium and supplied with said signal light beam, said phase conjugate light beam, and said pump light output from said first nonlinear optical medium.

60. A device according to claim 59, wherein said first nonlinear optical medium comprises a semiconductor chip for providing a first convertible band, and said second nonlinear optical medium comprises an optical fiber for providing a second convertible band wider than said first convertible band.

61. A device according to claim 60, wherein said semiconductor chip is provided by a semiconductor optical amplifier, and said device further comprises a pump light source for supplying said pump light to said semiconductor optical amplifier.

62. A device according to claim 60, wherein said semiconductor chip is provided by a distributed feedback (DFB) laser diode, and said device further comprises means for injecting a current into said DFB laser diode so that said DFB laser diode generates said pump light.

63. A device according to claim 60, wherein said optical fiber has a zero-dispersion wavelength substantially equal to a wavelength of said pump light.

64. A device according to claim 60, further comprising a feedback loop for controlling a wavelength of said pump light so that a power of said conjugate light beam becomes higher.

65. A system comprising:
- a first optical fiber for transmitting a signal light beam;
- a first nonlinear optical medium for being supplied with said signal light beam and generating a phase conjugate light beam based on four-wave mixing using a pump light;
- a second nonlinear optical medium cascaded to said first nonlinear optical medium and supplied with said signal light beam, said phase conjugate light beam, and said pump light output from said first nonlinear optical medium; and
- a second optical fiber for transmitting said phase conjugate light beam output from said second nonlinear optical medium.

66. A system comprising:
- a first optical fiber for transmitting a signal light beam;
- a semiconductor nonlinear optical medium supplied with said signal light beam;
- means for pumping said semiconductor nonlinear optical medium so that said semiconductor nonlinear optical medium generates a phase conjugate light beam based on four-wave mixing using a pump light, said signal light beam having a wavelength longer than a wavelength of said pump light; and
- a second optical fiber for transmitting said phase conjugate light beam.

* * * * *